(12) United States Patent
Kanda et al.

(10) Patent No.: US 7,505,355 B2
(45) Date of Patent: Mar. 17, 2009

(54) SEMICONDUCTOR MEMORY DEVICE WITH MOS TRANSISTORS EACH HAVING FLOATING GATE AND CONTROL GATE

(75) Inventors: Kazushige Kanda, Kawasaki (JP); Akira Umezawa, Tokyo (JP); Kazuhiko Kakizoe, Kitakyushu (JP); Yoshiaki Hashiba, Fujisawa (JP); Yoshiharu Hirata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/733,796

(22) Filed: Apr. 11, 2007

(65) Prior Publication Data
US 2007/0201299 A1    Aug. 30, 2007

Related U.S. Application Data

(63) Continuation of application No. PCT/IB2005/002924, filed on Sep. 30, 2005.

(30) Foreign Application Priority Data
Oct. 14, 2004    (JP) .............................. 2004-300769

(51) Int. Cl.
*G11C 8/00* (2006.01)
(52) U.S. Cl. ............................. 365/230.06; 365/189.09; 365/189.05
(58) Field of Classification Search ............ 365/230.06, 365/189.09, 189.05, 185.18, 185.23, 185.21
See application file for complete search history.

(56) References Cited

U.S. PATENT DOCUMENTS

| | | | |
|---|---|---|---|
| 5,687,121 A | 11/1997 | Lee et al. | |
| 5,852,583 A | 12/1998 | Taito et al. | |
| 6,094,073 A | 7/2000 | Campardo et al. | |
| 6,141,250 A * | 10/2000 | Kashimura | 365/185.11 |

(Continued)

FOREIGN PATENT DOCUMENTS

EP    0 606 650 A    7/1994

(Continued)

OTHER PUBLICATIONS

Liu, et al., "A 2-Transistor Source-select (2TS) Flash EEPROM for 1.8V-Only Applications", Non-Volatile Semiconductor Memory Workshop 4.1, 1997, pp. 1-3.

(Continued)

*Primary Examiner*—David Lam
(74) *Attorney, Agent, or Firm*—Oblon, Spivak, McClelland, Maier & Neustadt, P.C.

(57) ABSTRACT

A semiconductor memory device includes a memory cell array, word lines, and a row decoder. The memory cell array includes memory cells arranged in a matrix. The memory cell includes a first MOS transistor having a charge accumulation layer and a control gate and a second MOS transistor. The word line connects the control gates of the first MOS transistors. The row decoder includes a first address decode circuit, a second address decode circuit, and a transfer gate. The first address decode circuit decodes m bits in a n-bit row address signal (m and n are a natural number satisfying the expression m<n). The second address decode circuit decodes (n−m) bits in the row address signal. The transfer gate supplies the output of the first address decode circuit to the word line according to the output of the second address decoded circuit.

20 Claims, 48 Drawing Sheets

U.S. PATENT DOCUMENTS

| | | |
|---|---|---|
| 6,212,102 B1 | 4/2001 | Georgakos et al. |
| 6,731,537 B2 * | 5/2004 | Kanamori et al. ...... 365/185.08 |
| 6,930,952 B2 * | 8/2005 | Kim ...................... 365/230.06 |
| 6,944,087 B2 * | 9/2005 | Kanapathippillai et al. ..................... 365/230.06 |
| 2003/0048661 A1 | 3/2003 | Sakui et al. |

FOREIGN PATENT DOCUMENTS

JP  2004-326965  11/2004

OTHER PUBLICATIONS

U.S. Appl. No. 10/753,324, filed Jan. 9, 2004, Umezawa, et al.
U.S. Appl. No. 11/733,796, filed Apr. 11, 2007, Kanda, et al.

* cited by examiner

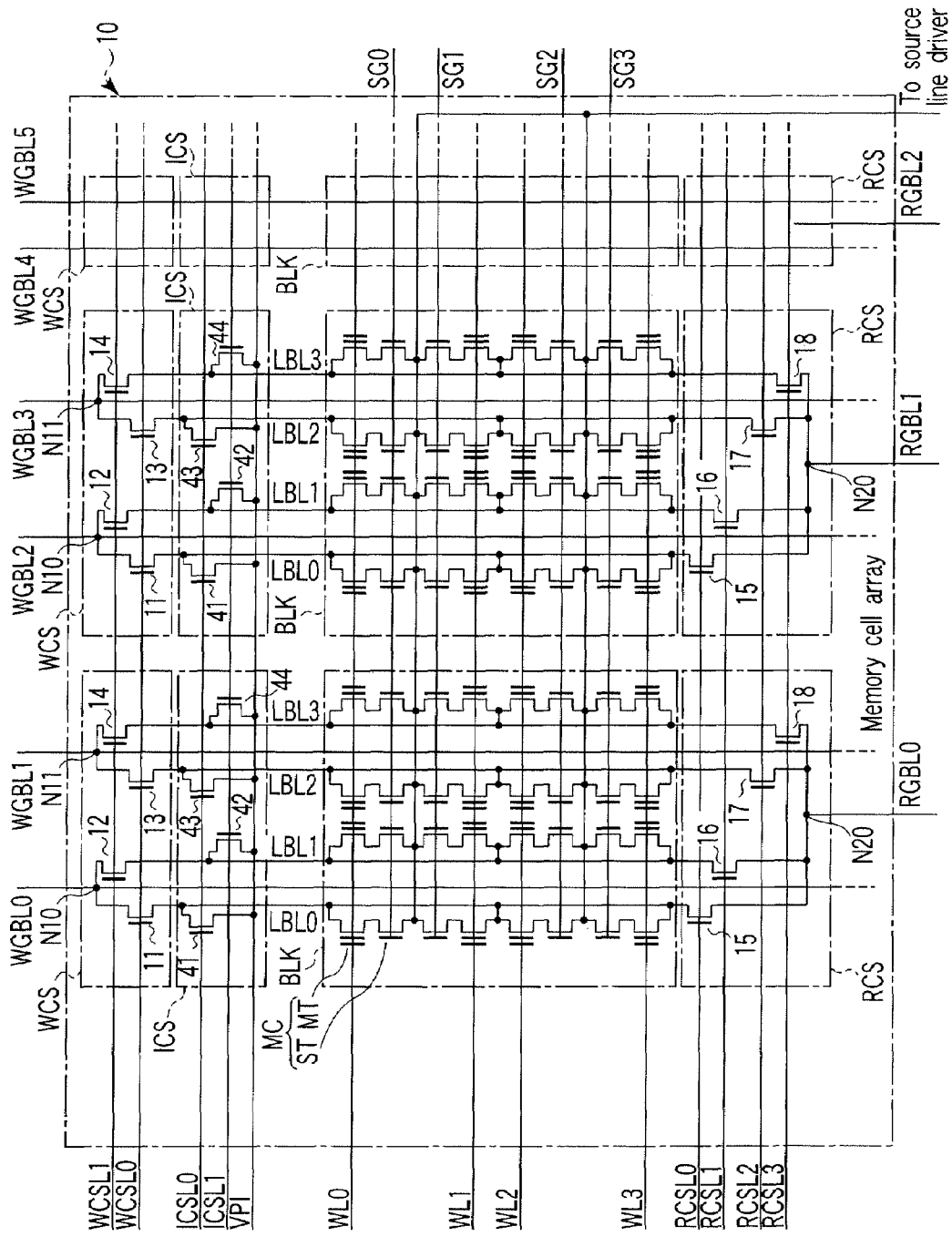
F I G. 2

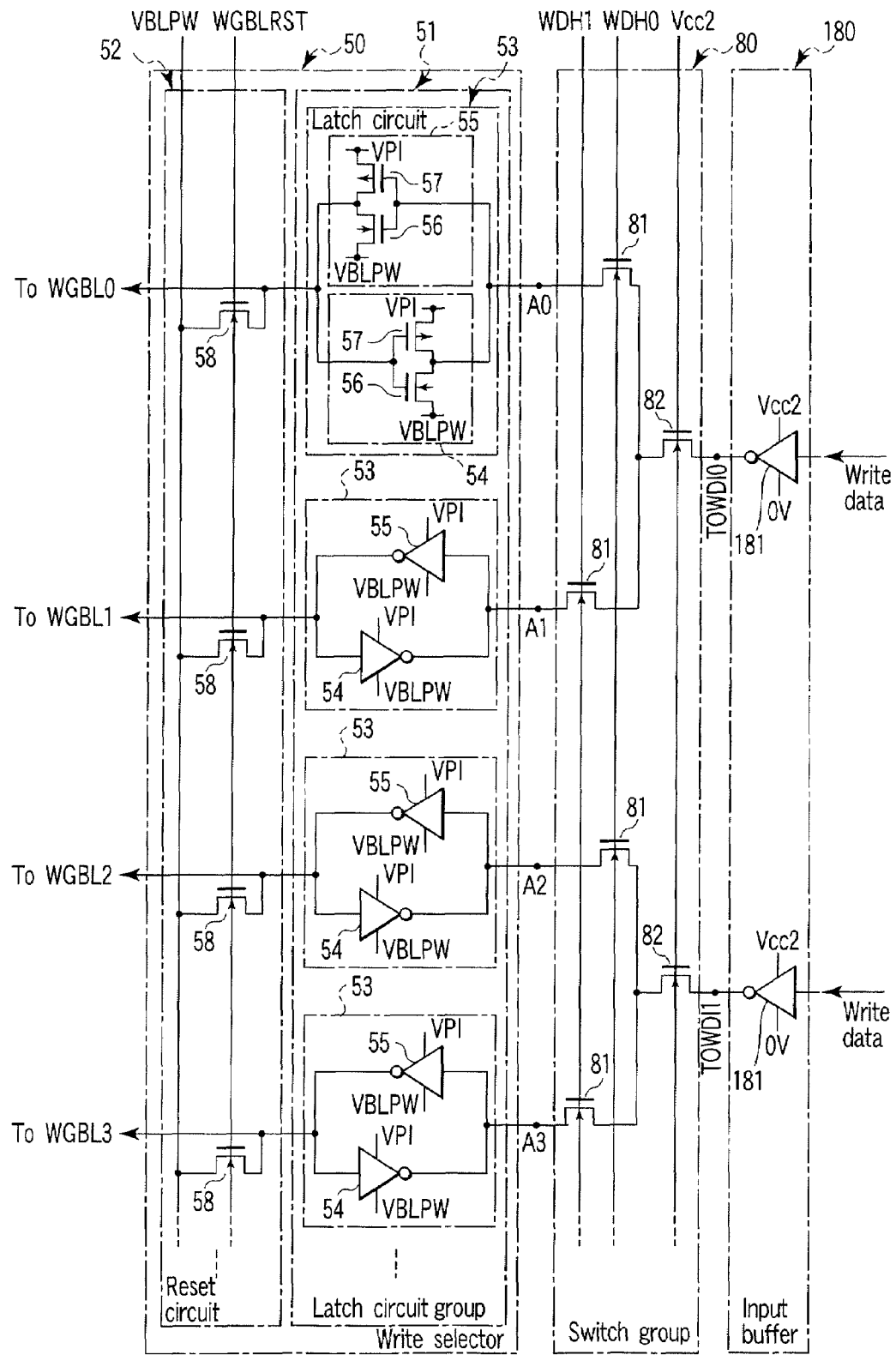
F I G. 3

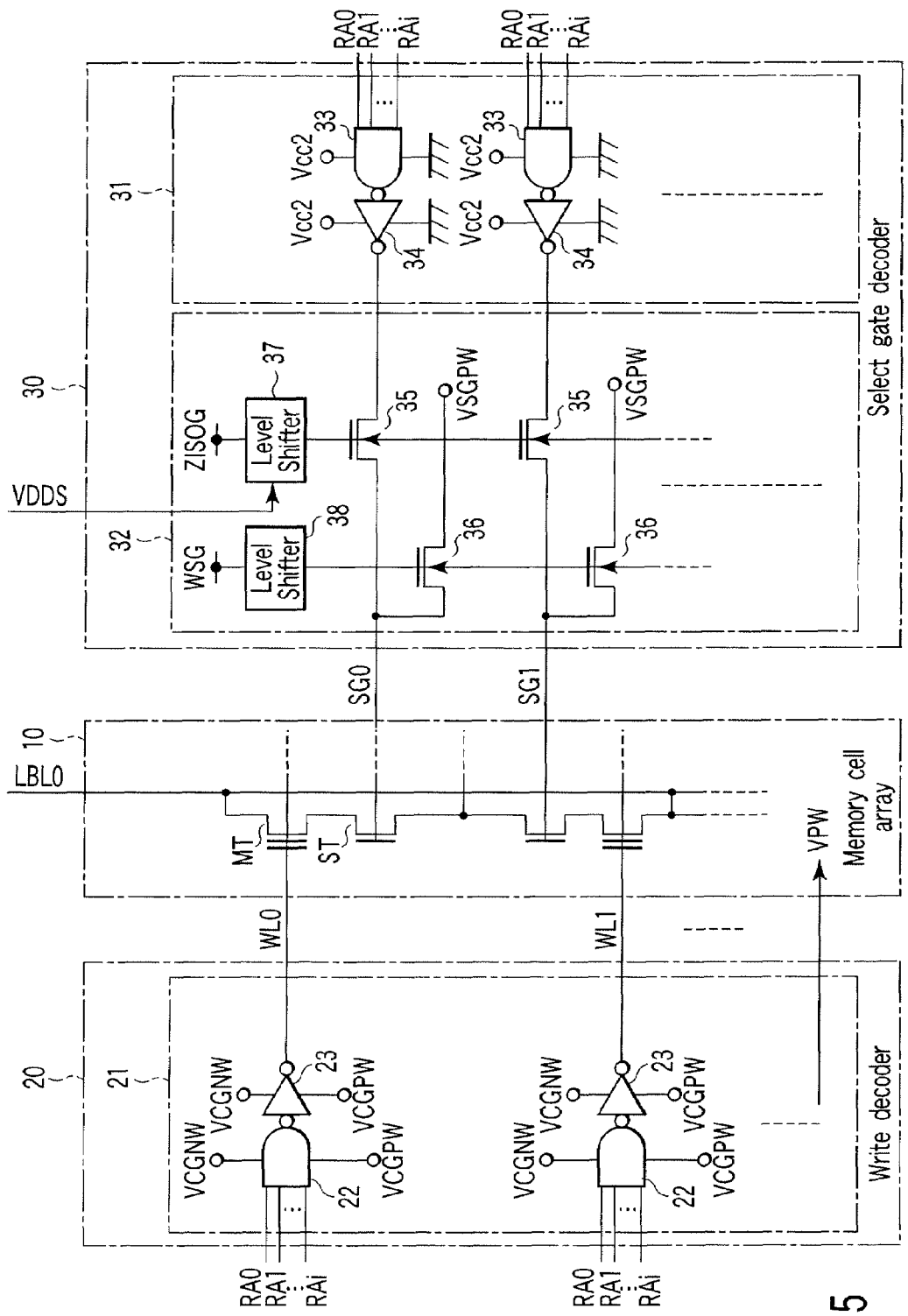
F I G. 5

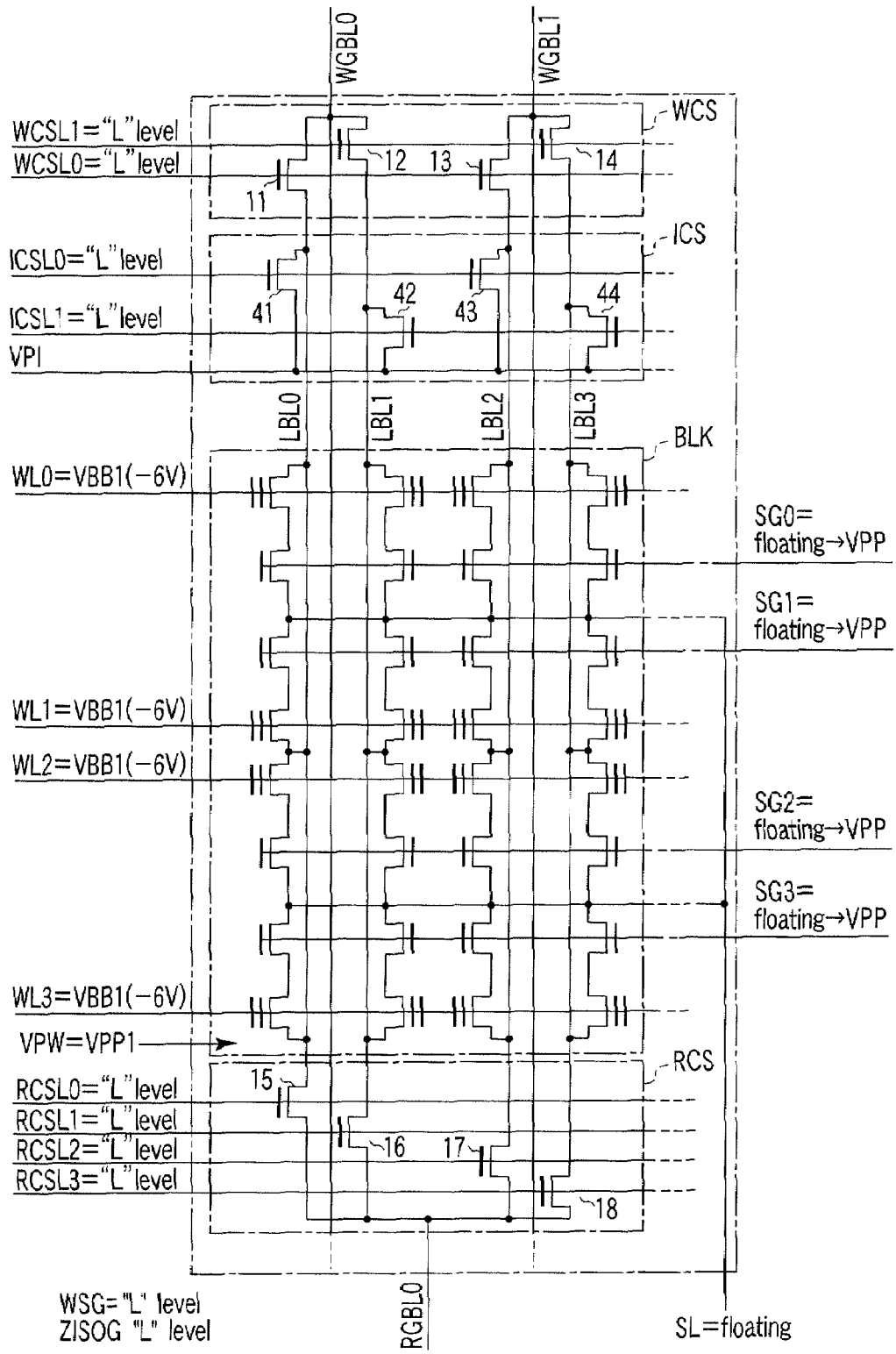
F I G. 14

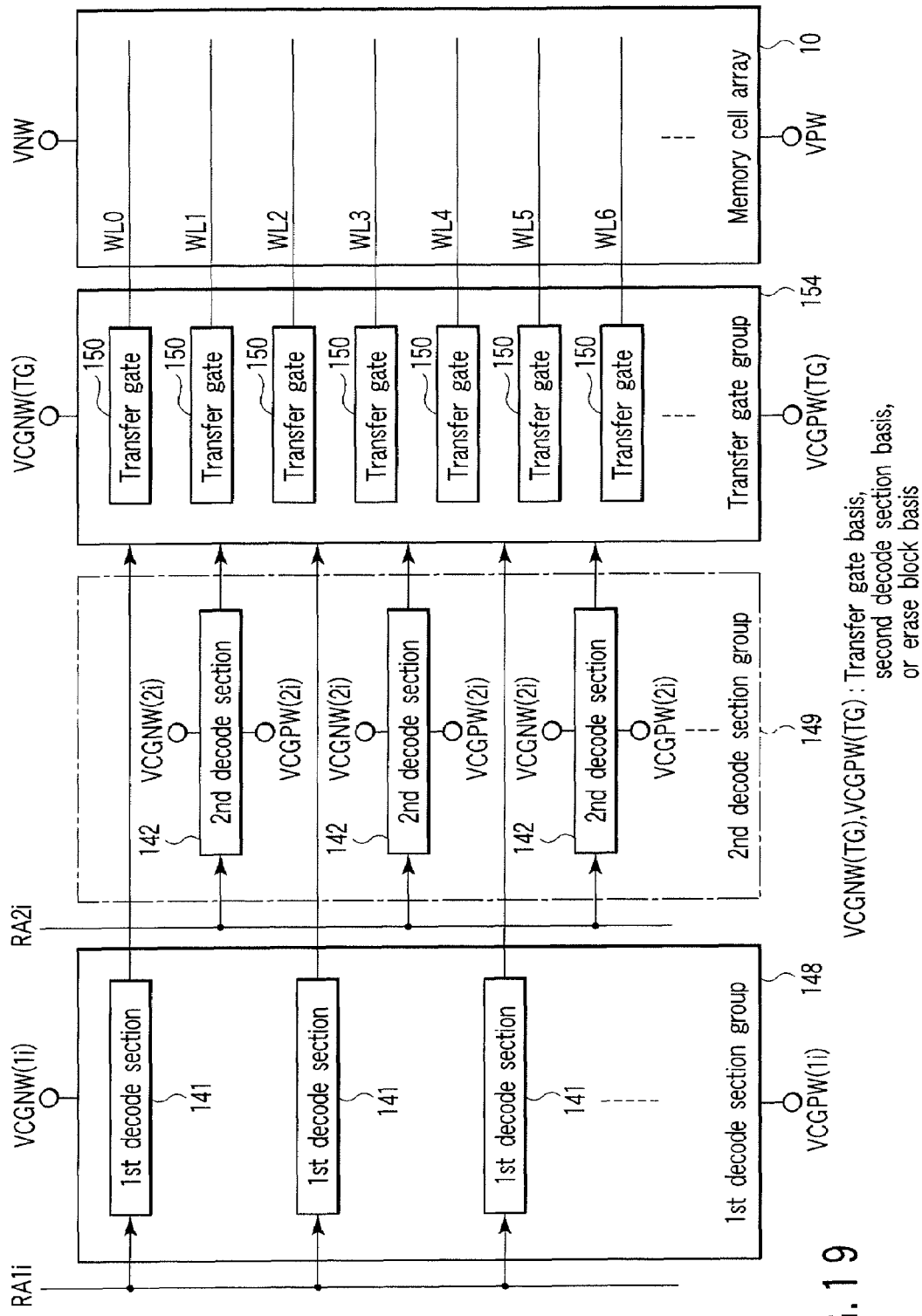
F I G. 19

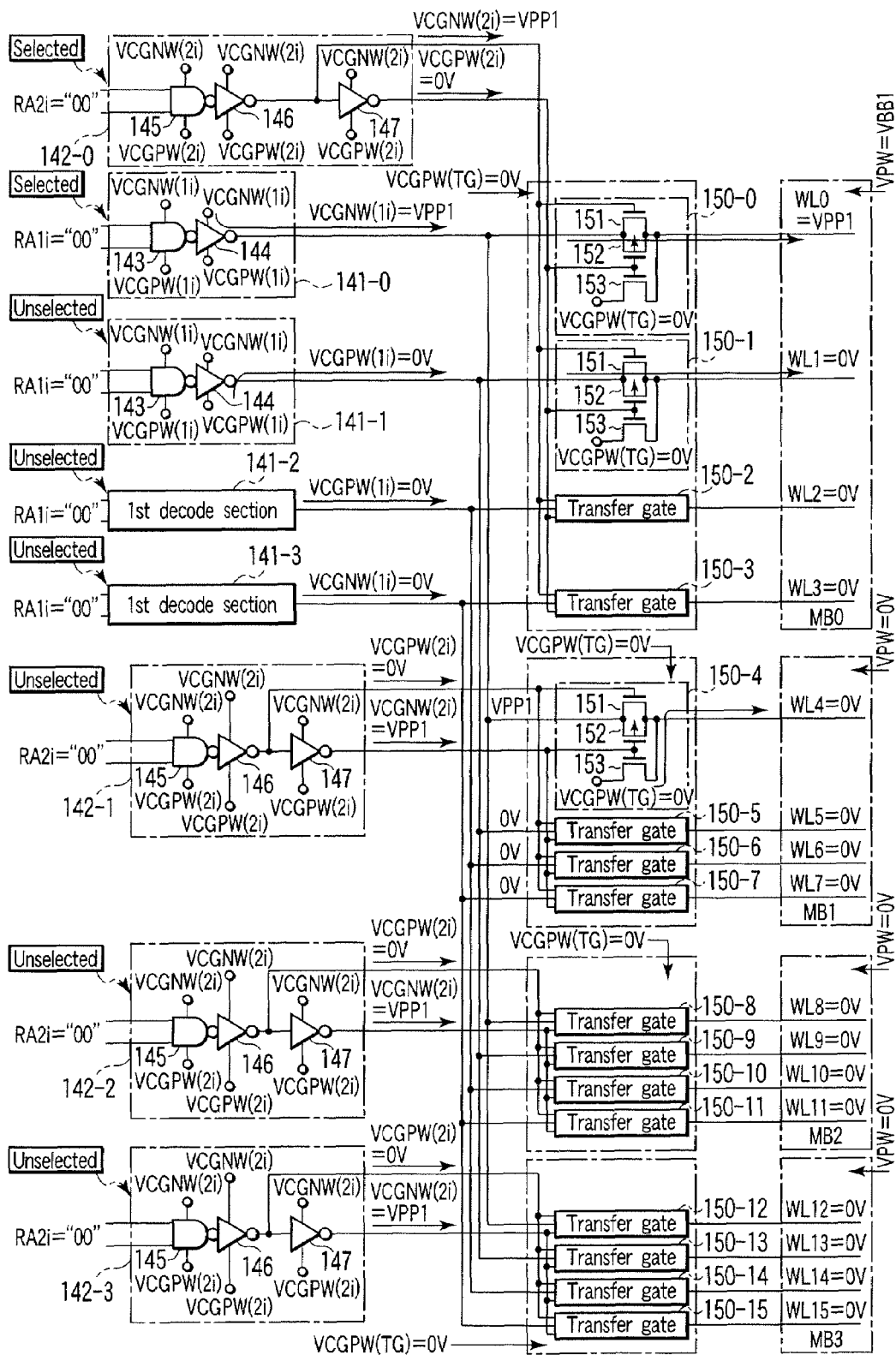
F I G. 22

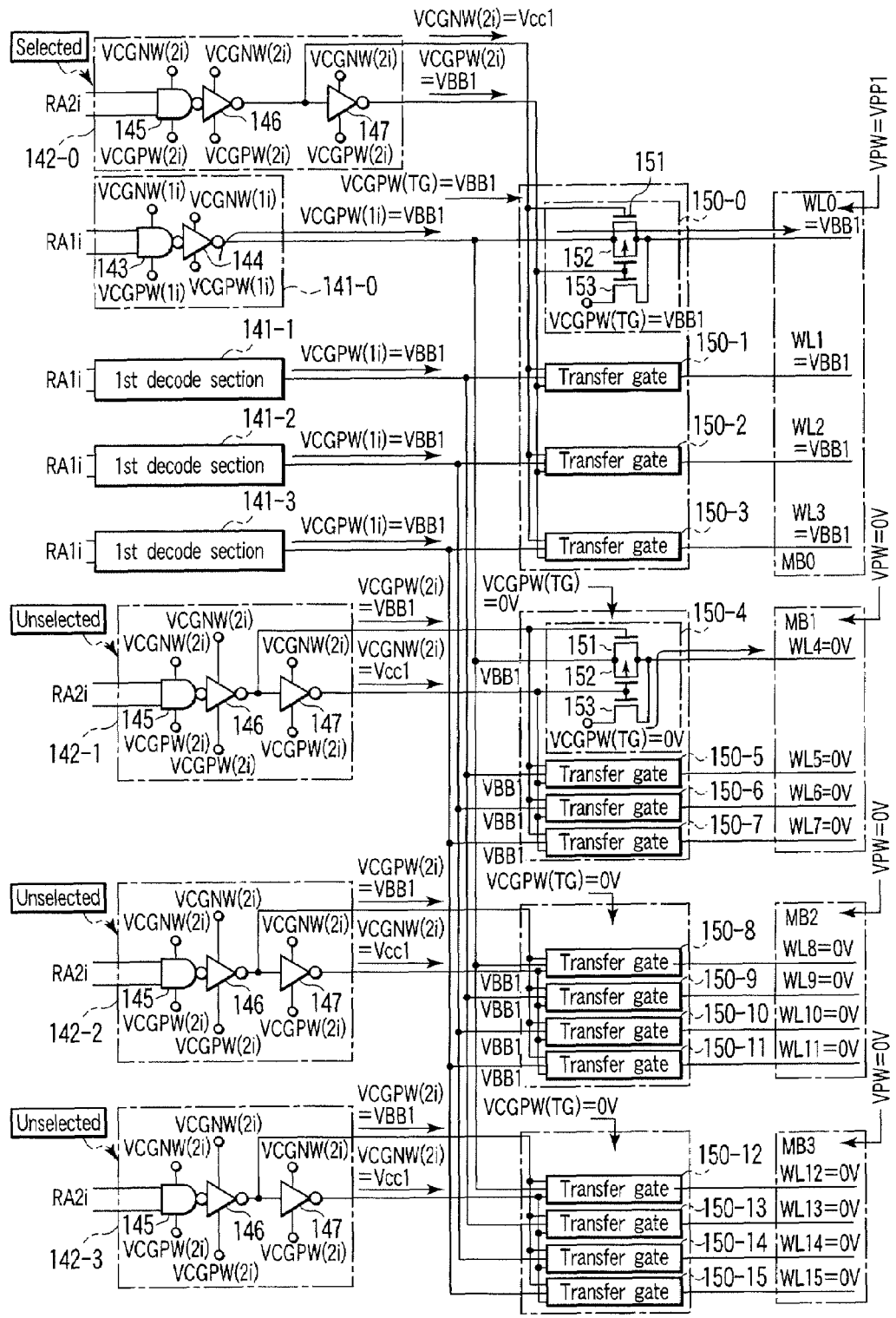
F I G. 23

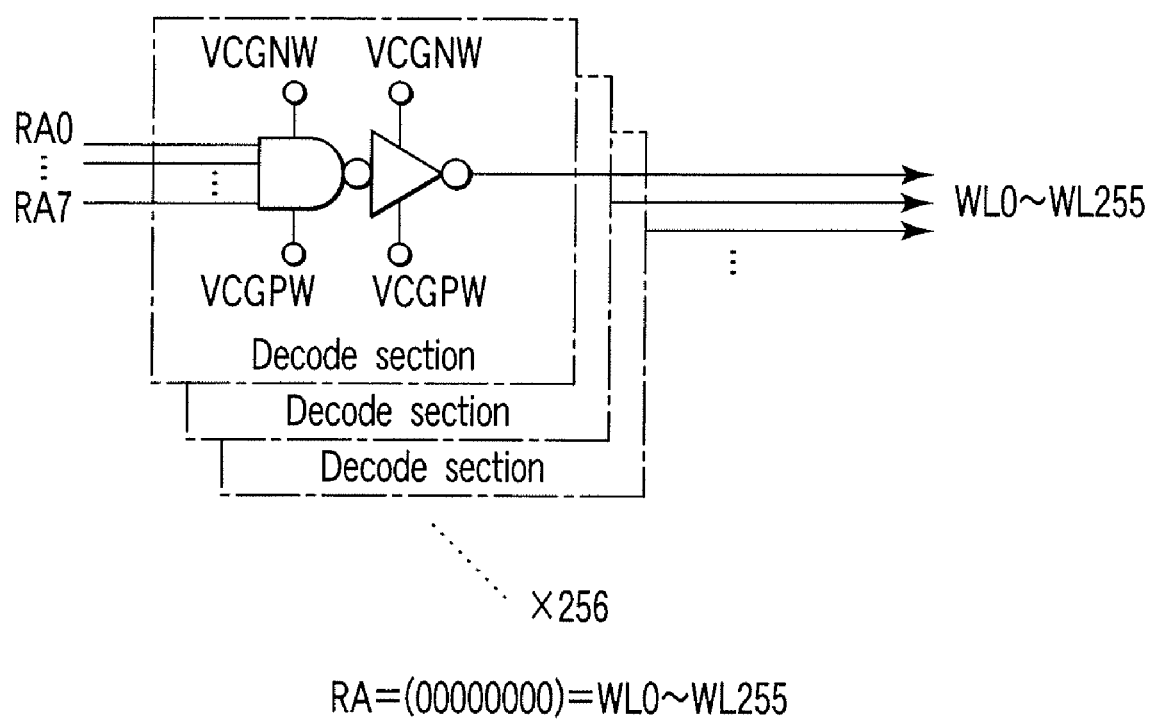
F I G. 24

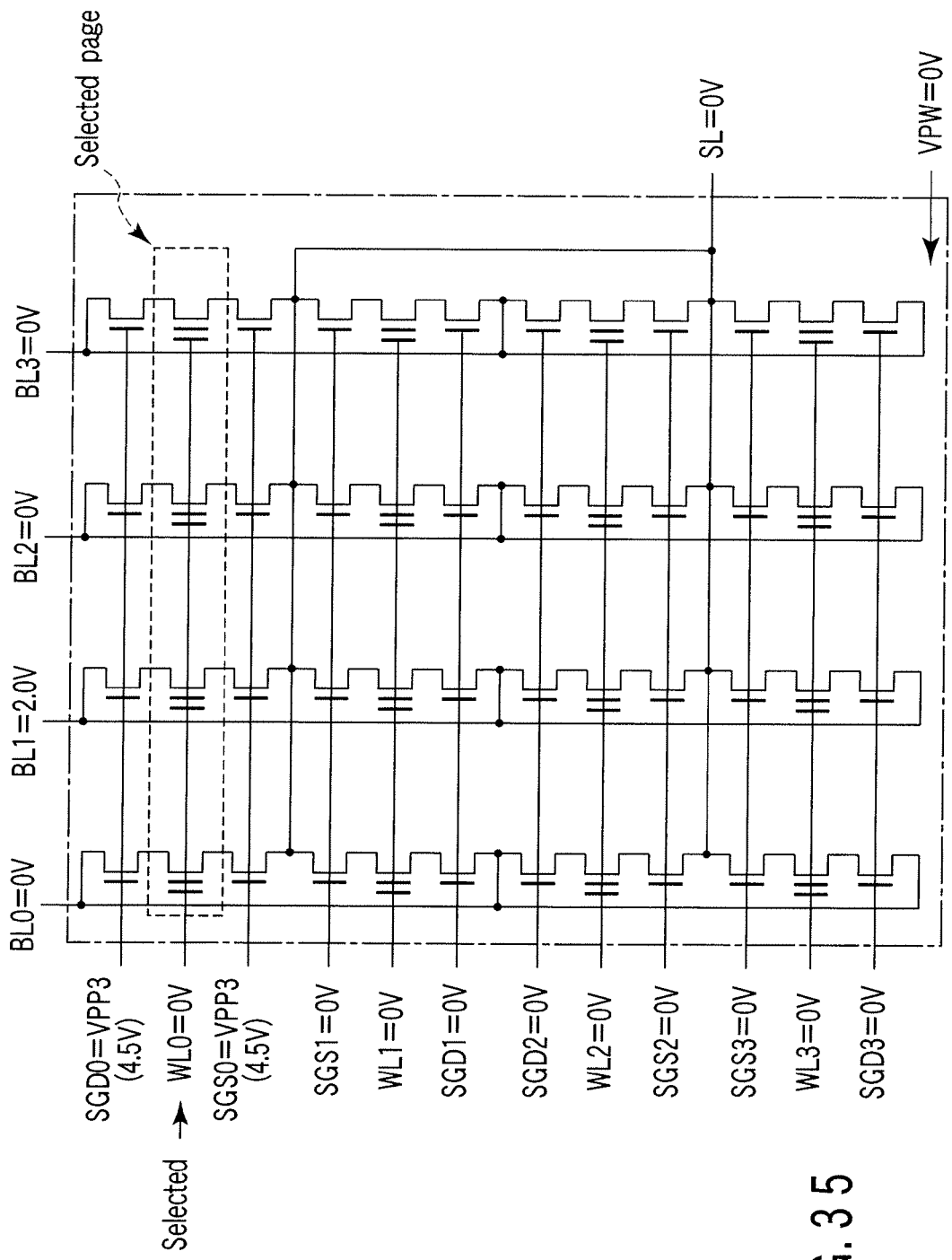
F I G. 35

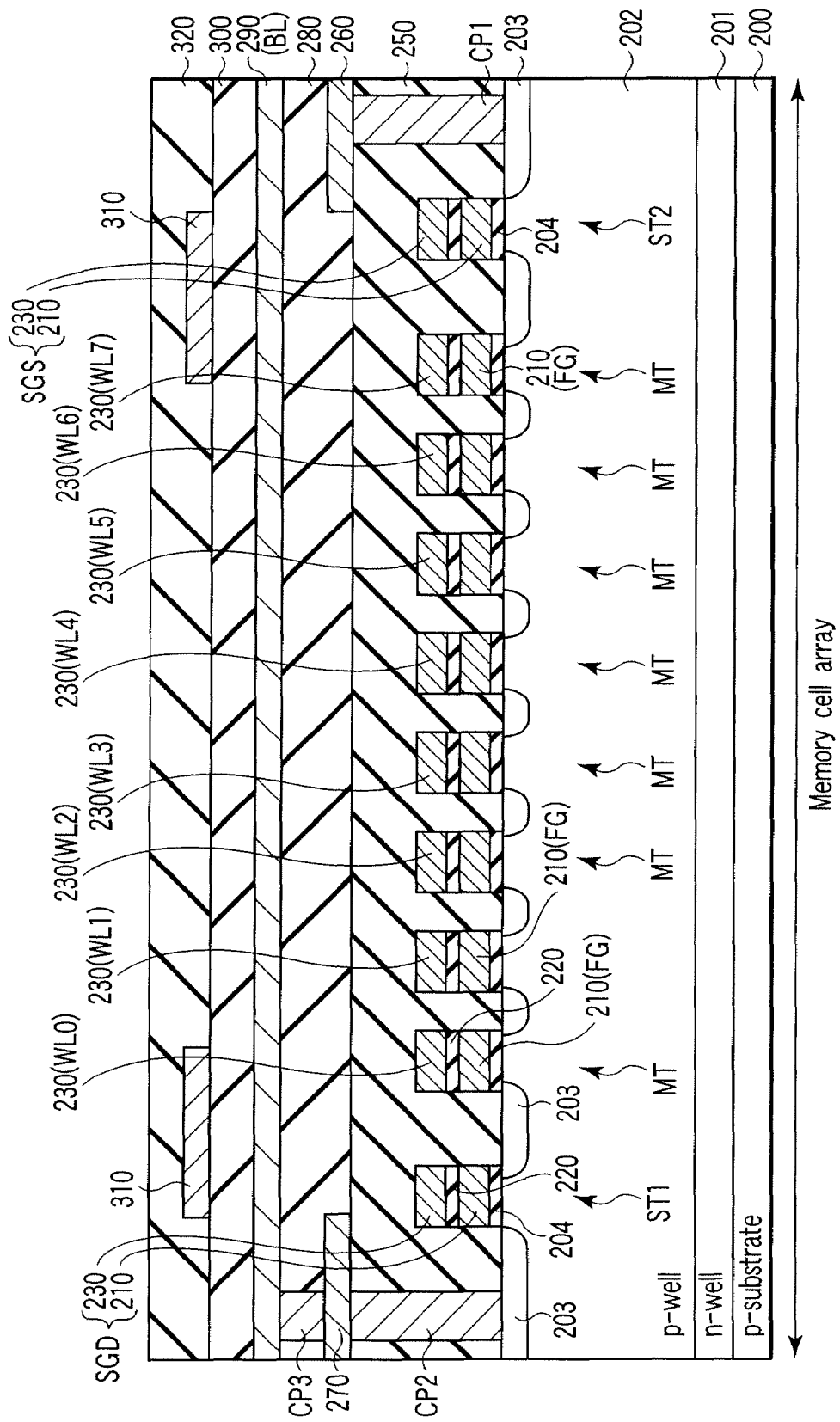
F I G. 37

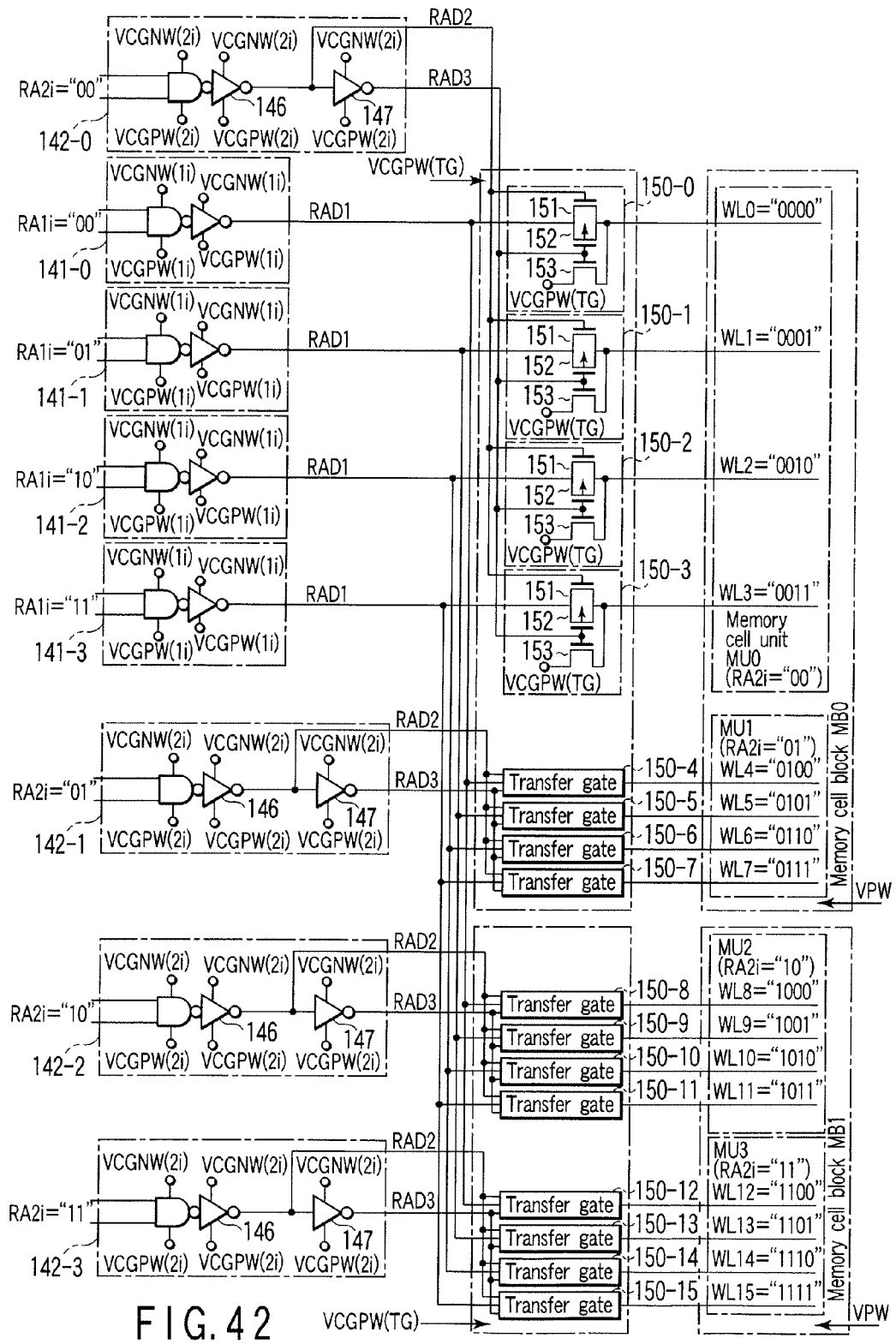
F I G. 42

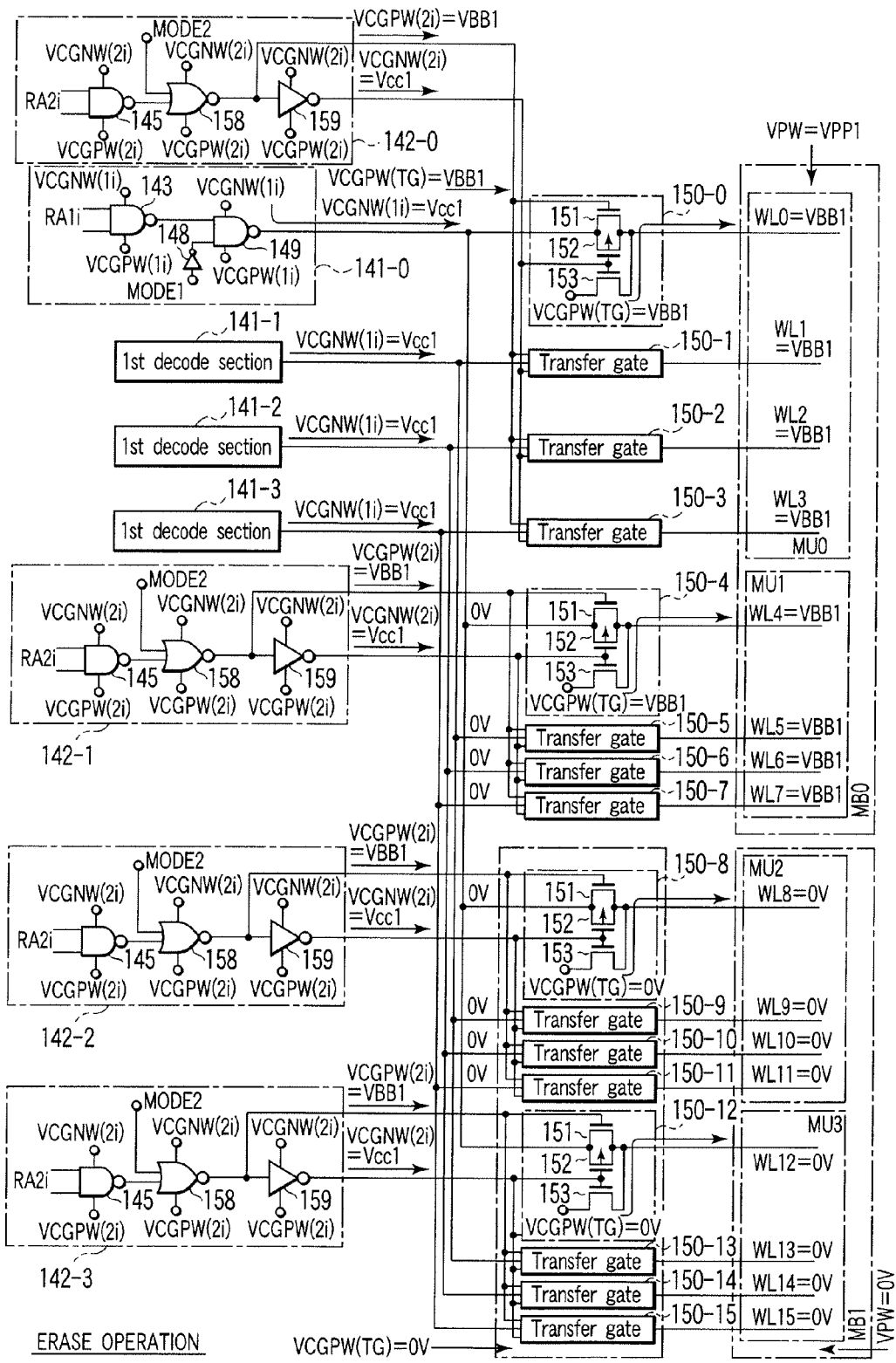
F I G. 44

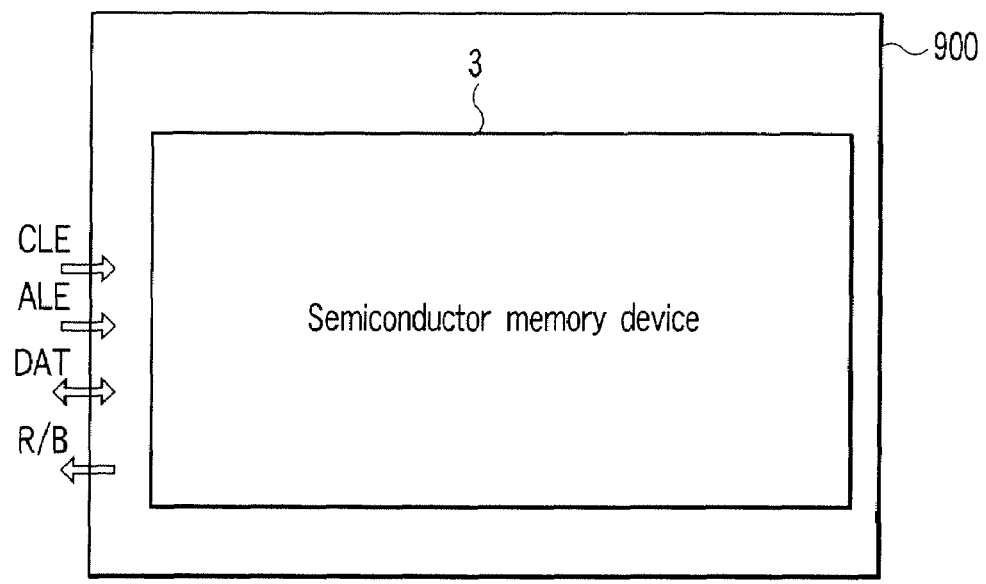
F I G. 46
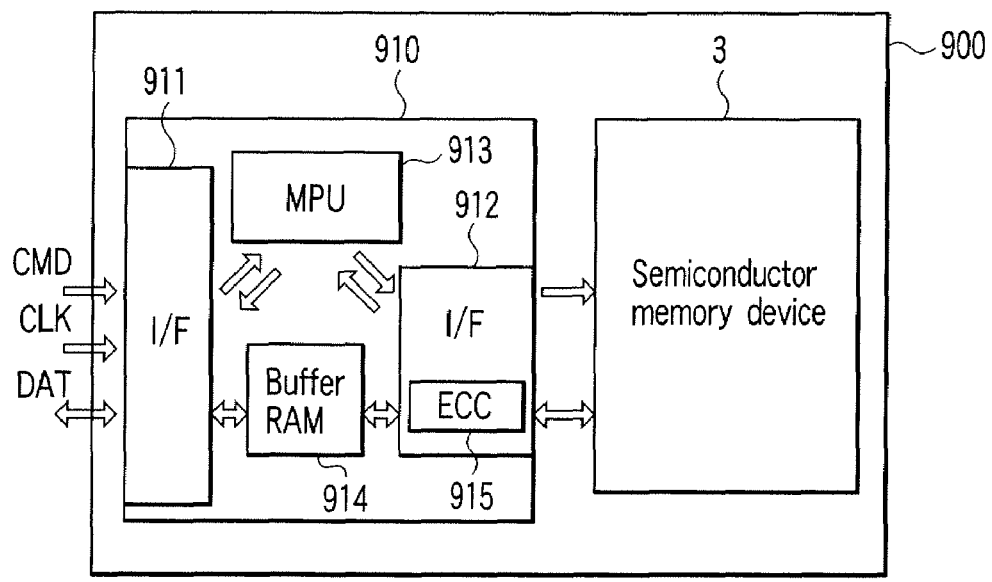
F I G. 47

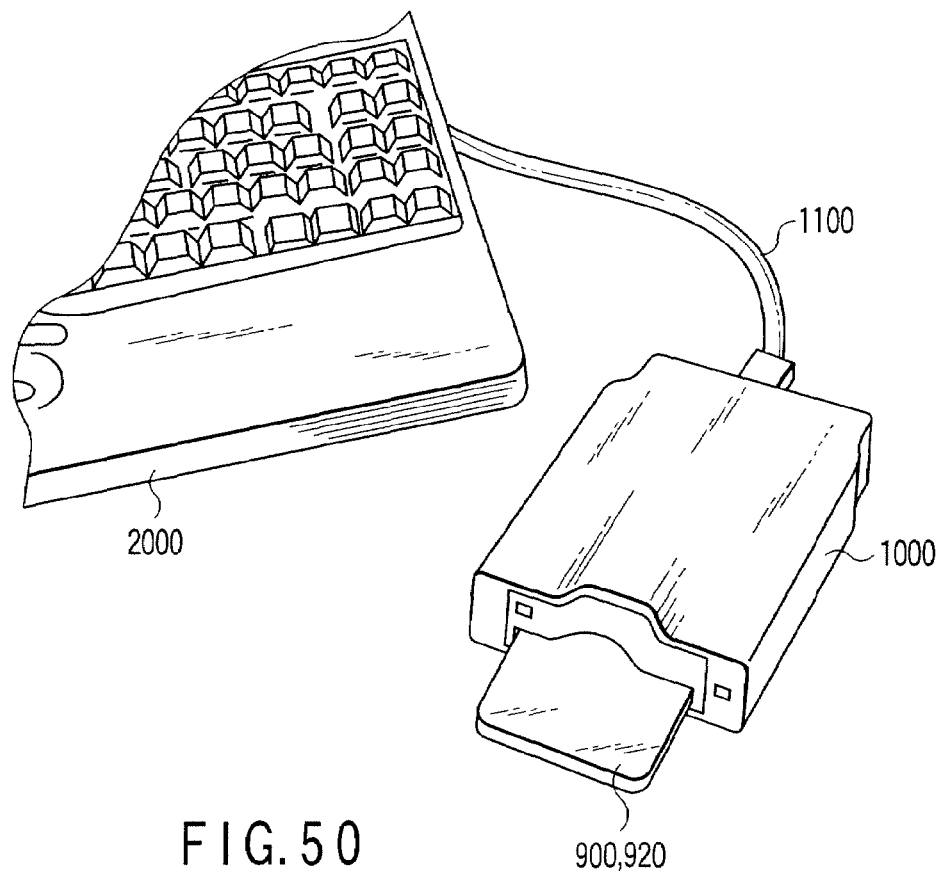
F I G. 5 0
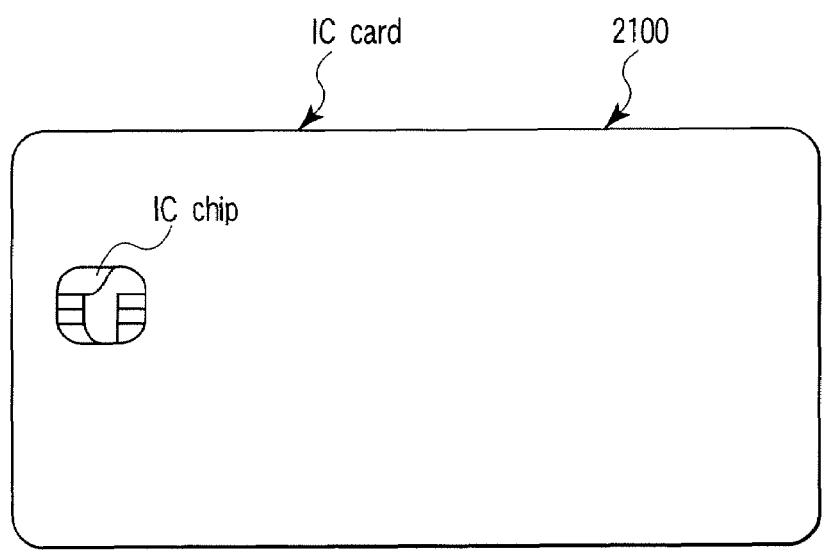
F I G. 5 1

US 7,505,355 B2

SEMICONDUCTOR MEMORY DEVICE WITH MOS TRANSISTORS EACH HAVING FLOATING GATE AND CONTROL GATE

CROSS-REFERENCE TO RELATED APPLICATIONS

This is a Continuation Application of PCT Application No. PCT/IB2005/002924, filed Sep. 30, 2005, which was published under PCT Article 21(2) in English.

This application is based upon and claims the benefit of priority from prior Japanese Patent Application No. 2004-300769, filed Oct. 14, 2004, the entire contents of which are incorporated herein by reference.

BACKGROUND OF THE INVENTION

1. Field of the Invention

This invention relates to a semiconductor memory device. More specifically, this invention relates to a nonvolatile semiconductor memory device with MOS transistors each having a floating gate and a control gate.

2. Description of the Related Art

NOR and NAND flash memories have been widely used as nonvolatile semiconductor memory devices.

In recent years, a flash memory combining the features of the NOR flash memory and the NAND flash memory has been proposed. This type of flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type (hereinafter, referred to as a 2Tr flash memory) has memory cells each of which includes two MOS transistors. In such a memory cell, one MOS transistor, which functions as a nonvolatile memory section, includes a control gate and a floating gate and is connected to a bit line. The other MOS transistor, which is connected to a source line, is used to select a memory cell.

A 2Tr flash memory operates using a positive and a negative voltage, which makes the operating speed of the row decoder slower and tends to make the occupied area of the row decoder for the LSI larger.

BRIEF SUMMARY OF THE INVENTION

A semiconductor memory device according to an aspect of the present invention includes: a memory cell array in which a plurality of memory cells are arranged in a matrix, each including a first MOS transistor having a charge accumulation layer and a control gate and a second MOS transistor having a drain connected to the source of the first MOS transistor;

word lines each of which connects commonly the control gates of the first MOS transistors in a same row; and a row decoder which selects one of the word lines and which includes a first address decode circuit which decodes m bits in an n-bit row address signal (m and n are natural numbers satisfying the relationship m<n), a second address decode circuit which decodes (n–m) bits in the row address signal, and a transfer gate which supplies the output of the first address decode circuit to the word line according to the output of the second address decoded circuit.

A memory card according to an aspect of the present invention includes: a semiconductor memory device which includes: a memory cell array in which a plurality of memory cells are arranged in a matrix, each including a first MOS transistor having a charge accumulation layer and a control gate and a second MOS transistor having a drain connected to the source of the first MOS transistor;

word lines each of which connects commonly the control gates of the first MOS transistors in a same row; and a row decoder which selects one of the word lines and which includes a first address decode circuit which decodes m bits in an n-bit row address signal (m and n are natural numbers satisfying the relationship m<n), a second address decode circuit which decodes (n–m) bits in the row address signal, and a transfer gate which supplies the output of the first address decode circuit to the word line according to the output of the second address decoded circuit.

BRIEF DESCRIPTION OF THE SEVERAL VIEWS OF THE DRAWING

FIG. 2 is a circuit diagram of the memory cell array of a 2Tr flash memory according to the first embodiment;

FIG. 3 is a circuit diagram of the write circuit, switch group, and input buffer of the 2Tr flash memory according to the first embodiment;

FIG. 5 is a circuit diagram of the write decoder and select gate decoder of the 2Tr flash memory according to the first embodiment;

FIG. 14 is a circuit diagram to help explain the state of the memory cell array in an erase operation of the 2Tr flash memory according to the first embodiment;

FIG. 19 is a block diagram of the write decoder and memory cell array of the 2Tr flash memory according to the second embodiment;

FIG. 22 is a circuit diagram of the memory cell array and write decoder in a write operation of the 2Tr flash memory according to the second embodiment;

FIG. 23 is a circuit diagram of the memory cell array and write decoder in an erase operation of the 2Tr flash memory according to the second embodiment;

FIG. 24 is a circuit diagram of a part of the write decoder;

FIG. 35 is a circuit diagram to help explain the state of the memory cell array in a read operation of the 3Tr-NAND flash memory according to the fourth embodiment;

FIG. 37 is a sectional view, taken along a bit line, of the memory cell array of the NAND flash memory according to the fifth embodiment;

FIG. 42 is a circuit diagram of the write decoder and memory cell array of a 2Tr flash memory according to a modification of the second embodiment;

FIG. 44 is a circuit diagram to help explain an erase operation of the write decoder and memory cell array of the 2Tr flash memory according to a modification of the third embodiment;

FIG. 46 is a block diagram of a memory card including a flash memory according to the first to sixth embodiments;

FIG. 47 is a block diagram of a memory card including a flash memory according to the first to sixth embodiments;

FIG. 50 is the outward appearance of a connection unit which enables connection with a memory card including a flash memory according to the first to sixth embodiments;

FIG. 51 is the outward appearance of an IC card including a flash memory according to the first to sixth embodiments.

DETAILED DESCRIPTION OF THE INVENTION

Figure 1:
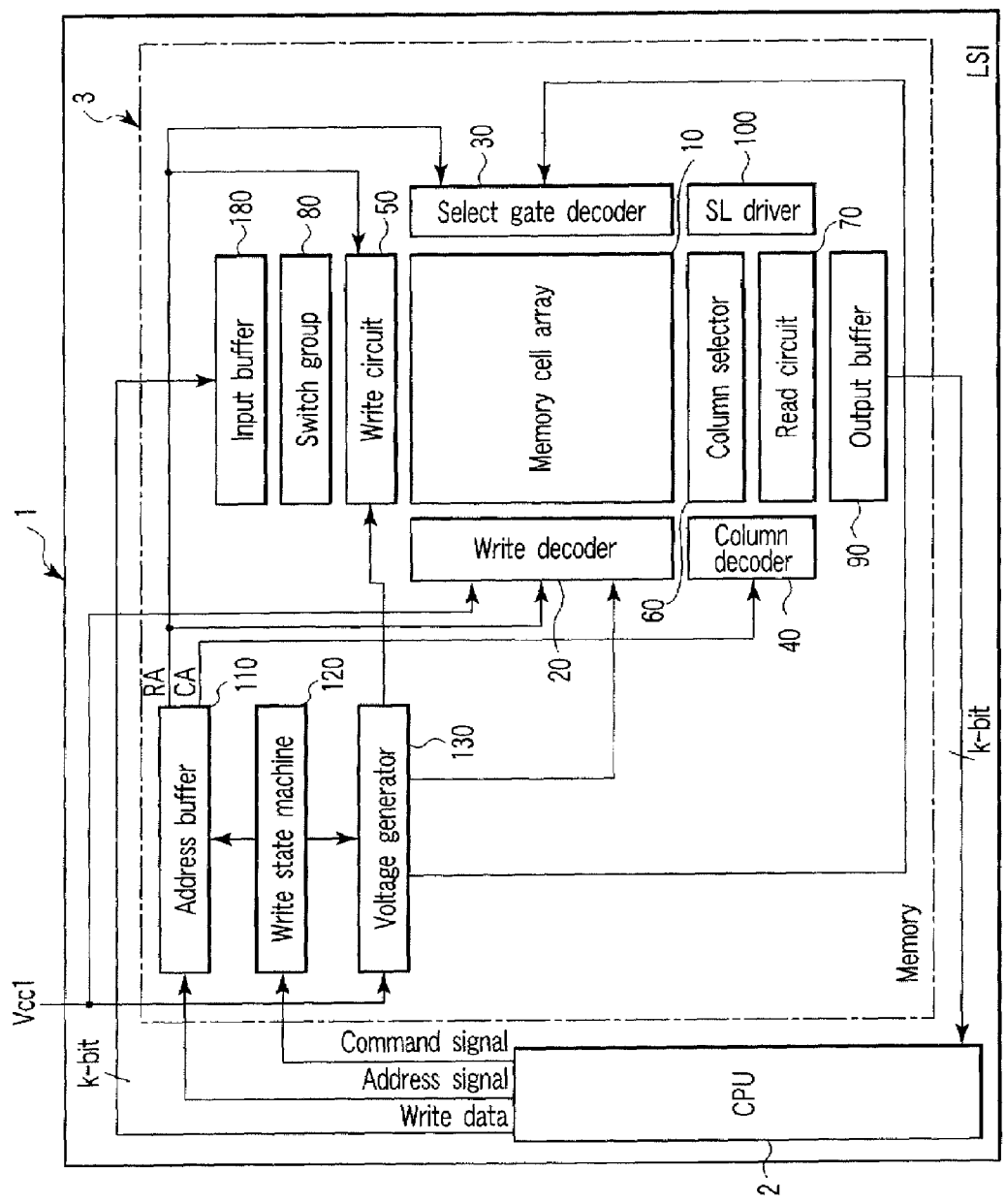
FIG. 1 is a block diagram of a system LSI according to a first embodiment of the present invention.

A semiconductor memory device according to a first embodiment of the present invention will be explained. FIG. 1 is a block diagram of a system LSI according to the first embodiment.

As shown in FIG. 1, the system LSI 1 comprises a CPU 2 and a 2Tr flash memory 3. The CPU 2 exchanges data with the flash memory 3. The flash memory 3 comprises a memory cell array 10, a write decoder 20, a select gate decoder 30, a column decoder 40, a write circuit 50, a column selector 60, a read circuit 70, a switch group 80, an input buffer 180, an output buffer 90, a source line driver 100, an address buffer 110, a write state machine 120, and a voltage generator 130. A voltage of Vcc1 (1.25 to 1.65V) is externally applied to the LSI 1. The voltage Vcc1 is applied to the voltage generator 130.

The memory cell array 10 has a plurality of memory cells arranged in a matrix. The configuration of the memory cell array 10 will be explained with reference to FIG. 2. FIG. 2 is a circuit diagram of a part of the memory cell array 10.

As shown in FIG. 2, the memory cell array 10 has (m+1)× (n+1) memory blocks BLK (m and n are natural numbers). The memory cell array 10 further has write column selectors WCS, read column selectors RCS, and write inhibit column selectors ICS, which are provided for the memory cell blocks BLK in a one-to-one correspondence.

Each of the memory cell blocks BLK includes a plurality of memory cells MC. The memory cells MC constitute the memory cells of a 2Tr flash memory. Specifically, each of the memory cells MC includes a memory cell transistor MT and a select transistor ST. The source of the memory cell transistor MT is connected to the drain of the select transistor ST. The memory cell transistor MT has a stacked gate structure that includes a floating gate on a semiconductor substrate with a gate insulating film interposed therebetween and a control gate on the floating gate with an inter-gate insulating film interposed therebetween. Memory cells MC adjoining each other in the column direction share the drain region of the memory cell transistor MT or the source region of the select transistor ST. Each of the memory cell blocks BLK includes (4×4) memory cells MC. Although the number of memory cells MC arranged in the column direction is 4 in FIG. 2, this is illustrative and not restrictive. For instance, the number of memory cells MC may be 8 or 16. The drain regions of the memory cell transistors MT arranged in four columns are connected to four local bit lines LBL0 to LBL3 in a one-to-one correspondence. One end of each of local bit lines LBL0 to LBL3 is connected to a write column selector WCS and the other end is connected to a read column selector RCS.

In the memory cell array 10, the control gates of the memory cell transistors MT in a same row are connected commonly to any one of word lines WL0 to WL(4m+3). The gates of the select transistors ST in a same row are connected commonly to any one of select gate lines SG0 to SG(4m+3). Local bit lines LBL0 to LBL3 connect the memory cell transistors to one another in each of the memory cell blocks BLK, whereas the word lines WL and select gate lines SG connect the memory cell transistors and select transistors in a same row to one another even across the memory cell blocks. Word lines WL0 to WL(4m+3) are connected to the write decoder 20 and the select gate lines SG0 to SG(4m+3) are connected to the select gate decoder 30. The source regions of the select transistors ST are connected to one another across a plurality of memory cell blocks BLK and then are connected to the source line driver 100.

Next, the configuration of a write column selector WCS will be explained. Each of the write column selectors WCS includes four MOS transistors 11 to 14. One end of the current path of each of the MOS transistors 11 to 14 is connected to one end of the corresponding one of local bit lines LBL0 to LBL3. The other ends of the current paths of the MOS transistors 11 and 12 are connected to each other and the other ends of the current paths of the MOS transistors 13 and 14 are connected to each other. Hereinafter, the common junction node of the MOS transistors 11 and 12 is called node N10 and the common junction node of the MOS transistors 13 and 14 is called node N11. The gates of the MOS transistors 11 to 14 are connected to any one of write column select lines WCSL0 to WCSL(2m+1). The MOS transistors 11, 13 included in the write column selectors WCS in a same row are connected to the same one of the write column select lines WCSL(h−1) (h: 1, 3, 5, . . . ). The MOS transistors 12, 14 included in the write column selectors WCS in the same row are connected to the same one of the write column select lines WCSLh. One of the write column select lines WCSL0 to WCSL(2m+1) is selected by the column decoder 40 in a write operation.

Each of the nodes N10, N11 in the write column selector WCS is connected to any one of write global bit lines WGBL0 to WGBL(2n+1). Each of the write global bit lines WGBL0 to WGBL(2n+1) is connected commonly to the nodes N10 or nodes N11 of the write column selectors WCS in a same column. Write global bit lines WGBL0 to WGBL(2n+1) are connected to the write circuit 50.

Next, the configuration of a read column selector RCS will be explained. Each of the read column selectors RCS includes four MOS transistors 15 to 18. One end of the current path of each of the MOS transistors 15 to 18 is connected to one end of the corresponding one of the local bit lines LBL0 to LBL3. The other ends of the current paths of the MOS transistors 15 and 18 are connected to each other. Hereinafter, the common junction node of the MOS transistors 15 and 18 is called node N20. Each of the gates of the MOS transistors 15 to 18 is connected to a different one of the read column select lines RCSL0 to RCSL(4m+3). Each of the MOS transistors 15 to 18 included in the read column selectors RCS in a same row is connected to the same one of the read column select lines RCSL0 to RCSL(4m+3). One of the read column select lines RCSL0 to RCSL(4m+3) is selected by the column decoder 40 in a read operation.

Node 20 in the read column selector RCS is connected to any one of the read global bit lines RGBL0 to RGBLn. Each of the read global bit lines RGBL0 to RGBLn is connected commonly to the nodes N20 in the read column selectors RCS in a same column. Read global bit lines RGBL0 to RGBLn are connected to the read circuit 70 via the column selector 60.

Next, the configuration of a write inhibit column selector ICS will be explained. Each of the write inhibit column selectors ICS includes four MOS transistors 41 to 44. One end of the current path of each of the MOS transistors 41 to 44 is connected to one end of the corresponding one of the local bit lines LBL0 to LBL3. A write inhibit voltage VPI is applied commonly to the other ends of the current paths of the MOS transistors 41 and 44. The write inhibit voltage VPI is generated by the voltage generator 130. The gates of the MOS transistors 41 to 44 are connected to any one of the write inhibit column select lines ICSL0 to ICSL(2m+1). The MOS transistors 41, 43 included in the write inhibit column selectors ICS in a same row are connected to the same one of the write inhibit column select lines ICSL(h−1) (h: 1, 3, 5, . . . ). The MOS transistors 42, 44 included in the write column selectors ICS in the same row are connected to the same one of the write inhibit column select lines ICSLh. One of the write inhibit column select lines ICSL0 to ICSL(2m+1) are selected by the column decoder 40 in a write operation.

The configuration of the memory cell array 10 can also be explained as follows. In the memory cell array 10, a plurality of memory cells MC are arranged in a matrix. The control gates of the memory cell transistors MC of the memory cell MCs in a same row are connected commonly to a word line. The gates of the select transistors of the memory cells in the same row are connected to a select gate line. The drains of the memory cell transistors MT of four memory cells MC in a same column are connected commonly to any one of the local bit lines LBL0 to LBL3. Specifically, the memory cells MC in the memory cell array 10 are connected to a different one of the different local bit lines LBL0 to LBL3 in units of four memory cells MC arranged in a line. Then, one end of each of the local bit lines LBL0 in a same column and one end of each of the local bit lines LBL1 in a same column are connected commonly to any one of the write global bit lines WGBL0 to WGBL(2n+1) via the MOS transistors 11, 12, respectively. Moreover, one end of each of the local bit lines LBL2 in a same column and one end of each of the local bit lines LBL3 in a same column are connected commonly to any one of the write global bit lines WGBL0 to WGBL(2n+1) via the MOS transistors 13, 14, respectively. The other ends of local bit lines LBL0 to LBL3 in the same column are connected equally to any one of the read global bit lines RGBL0 to RGBLn via the MOS transistors 15 to 18. Furthermore, local bit lines LBL0 to LBL3 are connected via the MOS transistors 41 to 44 to write inhibit voltage nodes, respectively. Then, the sources of the select transistors ST of the memory cells MC are connected to one another and then are connected to the source line driver. In the memory cell array with the above configuration, four columns of four memory cells MC connected to the same local bit line makes a single memory block BLK. The memory cell blocks in a same column are connected to a common write global bit line and a common read global bit line. The memory cell blocks BLK in a different column are connected to a different write global bit line and a different read global bit line. The number of memory cells in a memory cell block, the number of read global bit lines RGBL, and the number of write global bit lines WGBL are not limited to those in the embodiment.

Referring to FIG. 1, the explanation will be continued. The write circuit 50 not only latches write data but also resets the write global bit lines WGBL.

The input buffer 180 holds the write data given by the CPU 2.

The switch group 80 transfers the write data held in the input buffer 180 to the write circuit 50.

The configuration of the write circuit 50, switch group 80, and input buffer 180 will be explained with reference to FIG. 3. FIG. 3 is a circuit diagram of the write circuit 50, switch group 80, and input buffer 180.

First, the write circuit 50 will be explained. The write circuit 50 includes a latch circuit group 51 and a reset circuit 52. The latch circuit group 51 includes latch circuits 53 provided for write global bit lines WGBL0 to WGBL(2n+1) in a one-to-one correspondence. Each of the latch circuits 53 has two inverters 54, 55. The input terminal of the inverter 54 is connected to the output terminal of the inverter 55. The output terminal of the inverter 54 is connected to the input terminal of the inverter 55. The junction node of the input terminal of the inverter 54 and the output terminal of the inverter 55 makes the output node of the latch circuit 53, which is connected to the corresponding write global bit line. Each of the inverters 54, 55 has an n-channel MOS transistor 56 and a p-channel MOS transistor 57 whose current paths are connected in series. The source of the n-channel MOS transistor 56 is connected to VBLPW node and the source of the p-channel MOS transistor is connected to the write inhibit voltage node VPI. The gate of the n-channel MOS transistor 56 and the gate of the p-channel MOS transistor 57 are connected to one another. Then, the junction node of the drain of the p-channel MOS transistor 57 and the drain of the n-channel MOS transistor 56 in the inverter 55 is connected to the junction node of the gate of p-channel MOS transistor 57 and the gate of n-channel MOS transistor 56 in the inverter 54 and is further connected to a write global bit line. In addition, the junction node of the drain of the p-channel MOS transistor 57 and the drain of the n-channel MOS transistor 56 in the inverter 54 is connected to the junction node of the gate of the p-channel MOS transistor 57 and the gate of the n-channel MOS transistor 56 in the inverter 55. This junction node makes the input node of the latch circuit 53.

The reset circuit 52 includes n-channel MOS transistors 58 provided for write global bit lines WGBL0 to WGBL(2n+1) in a one-to-one correspondence. The drains of the n-channel MOS transistors 58 are connected to the corresponding write global bit lines. Their sources are connected commonly to VBLPW node and their gates are connected commonly to WGBLRST node.

The switch group 80 includes n-channel MOS transistors 81 provided for the latch circuits 53 in a one-to-one correspondence and n-channel MOS transistors 82. One end of each of the MOS transistors 81 is connected to the input node of the corresponding latch circuit 53. The other ends of the current paths of the two MOS transistors 81 each connected to adjacent latch circuits are connected to each other. That is, the MOS transistors 81 connected to the latch circuits 53 each corresponding to write global bit lines WGBL0, WGBL1 share the other end of their current path. The same holds true for the MOS transistors 81 connected to the latch circuits 53 each corresponding to write global bit lines WGBL2, WGBL3. The gates of the MOS transistors 81 connected to the latch circuits 53 corresponding to write global bit lines WGBL(h−1) (h=1, 3, 5, . . . ) are connected commonly to WDH0 node. The gates of the MOS transistors 81 connected to the latch circuits 53 corresponding to write global bit lines WGBLh are connected commonly to WDH1 node. The other ends of the current paths of the MOS transistors 81 connected to one another are connected to one end of the current path of a MOS transistor 82. A positive voltage Vcc2 (about 3V) is applied to the gates of the MOS transistors 82 at the same time. The positive voltage Vcc2 is, for example, generated by the voltage generator 120. Hereinafter, the junction nodes of the MOS transistors 81 and the input nodes of the latch circuits 53 are referred to as nodes A0 to A(2n+1).

Next, the input buffer 180 will be explained. The input buffer 180 includes inverters 181 provided for the MOS transistors 82 in the switch group 80 in a one-to-one correspondence. The write data supplied from the CPU2 is input to the input node of the inverter 181. The output node of the inverter 181 is connected to the other end of the current path of the MOS transistor 82. The inverter 181 operates with a high-voltage power supply potential of Vcc2 and a low-voltage power supply potential of 0V. Hereinafter, the junction nodes of the output nodes of the inverters 181 and the MOS transistors 82 are called nodes TOWDI0 to TOWDI((2n+1)/2).

Referring to FIG. 1, the explanation will be continued.

The column decoder 40 decodes a column address signal, thereby producing a column address decode signal. On the basis of the column address decode signal, the column select lines WCSL, RCSL, ICSL are selected.

On the basis of the column address decode signal, the column selector 60 selects any one of the read global bit lines RGBL0 to RGBLn in a read operation.

In a read operation, the read circuit 70 precharges read global bit lines RGBL0 to RGBLn and amplifies the data read onto read global bit lines RGBL0 to RGBLn. The amplified read data is send outside the flash memory 3 via the output buffer 90.

Figure 4:
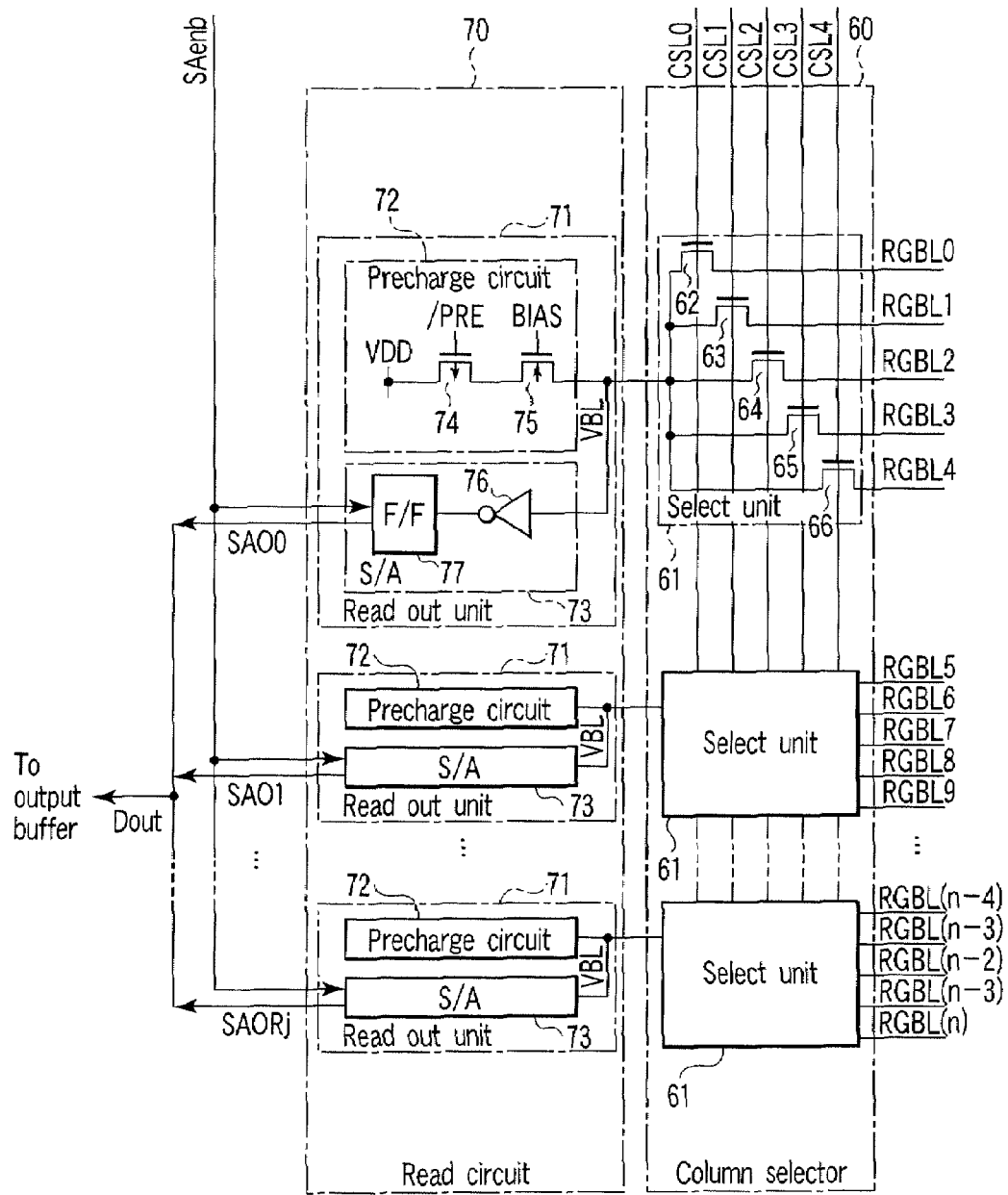
FIG. 4 is a circuit diagram of the column selector and read circuit of the 2Tr flash memory according to the first embodiment.

The configuration of the column selector 60 and read circuit 70 will be explained with reference to FIG. 4. FIG. 4 is a circuit diagram of the column selector 60 and read circuit 70.

The column selector 60 includes select units 61 provided for a plurality of global bit lines in a one-to-one correspondence. In the example of FIG. 4, although one select unit 61 is provided for every five read global bit lines (RGBL0 to RGBL4, RGBL5 to RGBL9, RGBL10 to RGBL4, . . . ), the number of read global bit lines is not limited to five. Hereinafter, explanation will be given using the case of FIG. 4 as an example. Each of the read units 61 includes MOS transistors 62 to 66 provided for five read global bit lines in a one-to-one correspondence. One end of each of the current paths of the MOS transistors 62 to 66 is connected to the corresponding one of the five read global bit lines. The other ends of them are connected to one another. The gates of the MOS transistors 62 to 66 are connected to column select lines CSL0 to CSL4 respectively across a plurality of select units 61. Column select lines CSL0 to CSL4 are connected to the column decoder 40.

Next, the configuration of the read circuit 70 will be explained. The read circuit 70 includes read units 71 provided for the select units 61 in the column selector 60 in a one-to-one correspondence. Each of the read units 71 is connected to the common junction node of the other ends of the current paths of the MOS transistors 62 to 66 in the column selector 60. Each of the read units 71 includes a precharge circuit 72 and a sense amplifier 73.

The precharge circuit 72 precharges the read global bit line selected by the select unit 61 of the column selector 60 in a read operation. The precharge circuit 72 includes a p-channel MOS transistor 74 and an n-channel MOS transistor 75. The source of the p-channel MOS transistor 74 is connected to a power supply voltage VDD (e.g., 1.3V). A precharge signal /PRE is input to its gate. The drain of the n-channel MOS transistor 75 is connected to the drain of the MOS transistor 74. A bias signal BIAS is input to its gate.

The sense amplifier 73 amplifies the data read onto the read global bit line selected by the select unit 61 of the column selector 60 in a read operation. The sense amplifier 73 includes an inverter 76 and a flip-flop 77. The input node of the inverter 76 is connected to the source of the MOS transistor 75. The output node of the inverter 76 is connected to the input node of the flip-flop 77. The amplified read data is output at the output node of the flip-flop 77.

That is, in a read operation, the column selector 60 connects read global bit lines RGBL0 to RGBLn selected by one in five lines to the precharge circuit 72 and sense amplifier 73. Then, the (j+1) sense amplifiers 73 (j is a natural number) send the read-out data SAO0 to SAOj sequentially to the output buffer.

Referring to FIG. 1, the explanation will be continued.

The source line driver 100 supplies a voltage to the source lines SL.

The address buffer 110 holds an address signal supplied from the CPU 2. Then, the address buffer 110 supplies a column address signal CA to the column decoder 40 and a row address signal RA to the write decoder 20, select gate decoder 30, and write circuit 50.

The write state machine 120 controls the operation of each circuit included in the flash memory 3 on the basis of a command signal supplied from the CPU 2, thereby performing timing control in writing, erasing, or reading data, and executing a specific algorithm determined for each operation.

The voltage generator 130 generates a plurality of internal voltages on the basis of the voltage Vcc1 (about 1.25 to 1.65V) externally input. The voltage generator 130 has a negative charge pump circuit and a positive charge pump circuit. Then, the voltage generator 130 generates a negative voltage VBB1 (=−6V) and positive voltages VPP1 (=10V) and Vcc2 (=3V).

The write decoder 20 not only selects any one of the word lines WL0 to WL(4m+3) and applies the positive potential VPP1 (10V) to the selected word line but also applies the negative potential VBB (−6V) to the well region where the memory cell array has been formed. In an erase operation, not only is the negative potential VBB1 applied to all of the word lines, but also the positive potential VPP1 is applied to the well region.

The select gate decoder 30 selects any one of the select gate lines SG0 to SG(4m+3) in a read operation and applies a positive potential Vcc2 to the selected select gate line.

The configuration of the write decoder 20 and select gate decoder 30 will be explained with reference to FIG. 5. First, the configuration of the write decoder 20 will be explained. The write decoder 20 includes a row address decode circuit 21. The row address decode circuit 21 decodes (i+1)-bit row address signals RA0 to RAi, thereby producing a row address decode signal. The row address signal is supplied to word line WL0 to WL(4m+3). The row address decode circuit 21 includes NAND circuits 22 and inverters 23 provided for word lines WL0 to WL(4m+3) in a one-to-one correspondence. The NAND circuit 22 and inverter 23 have their positive power supply voltage nodes connected to a power supply node VCGNW and their negative power supply voltage node connected to a power supply voltage node VCGPW. The NAND circuit 22 performs NAND operation on each bit in the row address signals RA0 to RAi. The positive voltages VPP1, Vcc2 and the negative voltage VBB1 or Vcc1, and 0V generated by the voltage generator 130 are applied to the power supply voltage nodes VCGNW, VCGPW. Then, the inverter 24 inverts the result of the NAND operation and outputs the result as a row address decode signal. In a write operation, the nodes are set as follows: VCGNW=VPP1 and VCGPW=0V. In an erase operation, the nodes are set as follows: VCGNW=Vcc1 and VCGPW=VBB1.

Next, the configuration of the select gate decoder 30 will be explained. The select gate decoder 30 includes a row address decode circuit 31 and a switch element group 32. The row address decode circuit 31, which operates on the power supply voltage Vcc2, decodes (i+1)-bit row address signals RA0 to RAi, thereby producing a row address decode signal. The row address decode circuit 31 has NAND circuits 33 and inverters 34 provided for select gate lines SG0 to SG(4m+3) in a one-to-one correspondence. The NAND circuit 33 performs NAND operation on each bit in row address signals RA0 t RAi. Then, the inverter 34 inverts the result of the NAND operation and outputs the inverted value as a row address decode signal.

The switch element group 32 has n-channel MOS transistors 35 and 36. The n-channel MOS transistors 35, 36 are provided for select gate lines SG0 to SG(4m+3) in a one-to-one correspondence. The outputs of the inverters 34 are supplied to select gate lines SG0 to SG(4m+3) via the current paths of the n-channel MOS transistor 35. A control signal ZISOG is input to the gates of the n-channel MOS transistors 35. The control signal ZISOG turns off the MOS transistors 35 in a write and an erase operation and turns on the MOS transistors 35 in a read operation. The control signal ZISOG is shifted in level by the level shift circuit 37, with the result that ZISOG=VDDS is satisfied in a read operation. The positive voltage VDDS is a voltage given by the voltage generator 130. If the high (H) level output of the row address decode circuit 31 is Vcc and the threshold voltage of the MOS transistor 35 is Vth, the expression VDDS>(Vcc2+Vth) is satisfied.

One end of the current path of each of the n-channel MOS transistor 36 is connected to the corresponding one of the select gate lines SG0 to SG(4m+3) and the other ends of them are connected to VSGPW node. A control signal WSG is input to the gates of the n-channel MOS transistors 36. The control signal WSG turns on the n-channel MOS transistors 36 in a write operation and turns them off in a read and an erase operation. In a write operation, VSGPW node is set as follows: VSGPW=VBB1. In an erase and a read operation, VSGPW is set as follows: VSGPW=0V.

Figure 6:
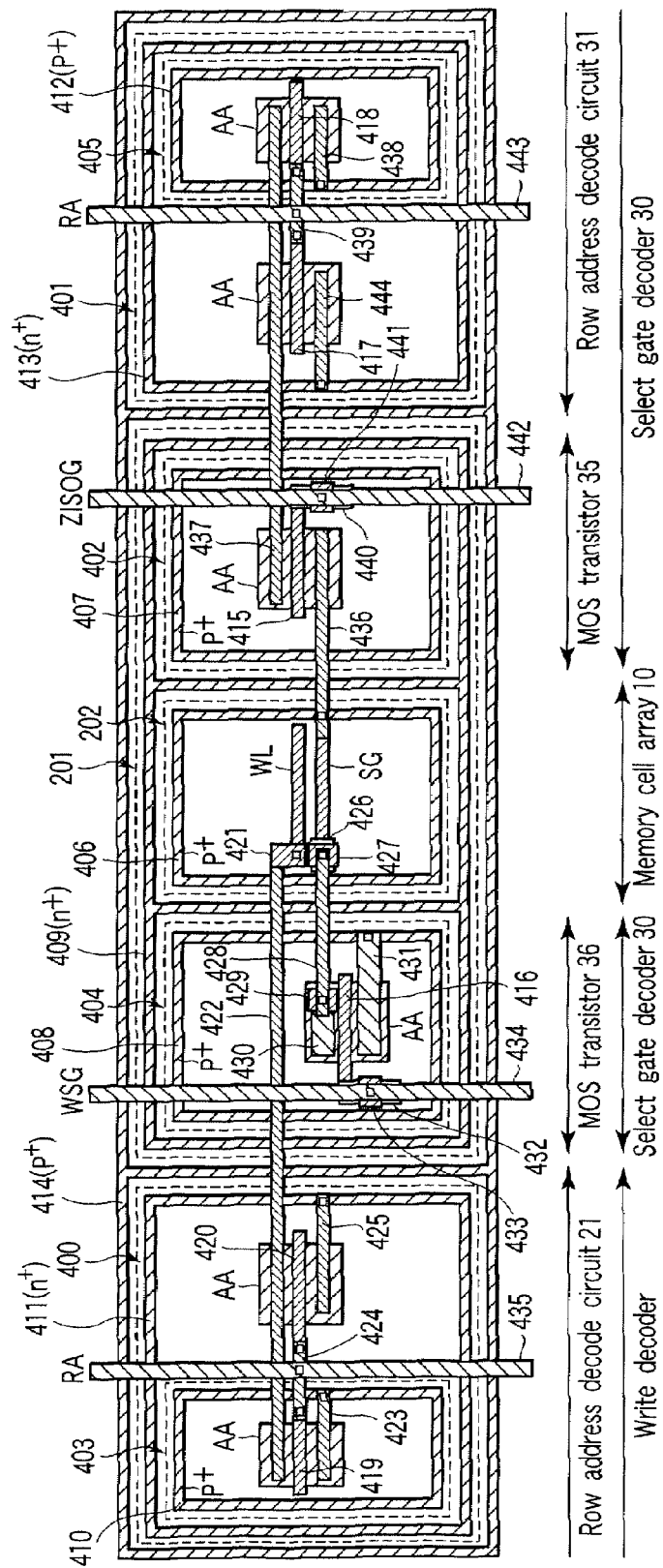
FIG. 6 is a plan view of the 2Tr flash memory according to the first embodiment.

Next, in the 2Tr flash memory with the above configuration, the way for the write decoder, select gate decoder, and memory cell array to electrically isolate each other will be explained by reference to FIG. 6. FIG. 6 is a plan view of the 2Tr flash memory.

As shown in FIG. 6, at the surface of a p-type semiconductor substrate 200, n-well regions 201, 400, 401 isolated from one another are formed. A p⁺-type diffused layer 414 is formed around the periphery of the n-well regions 201, 400, 401. The p⁺-type diffused layer 414 is a contact layer for applying a voltage VSS (e.g., 0V) to the p-type semiconductor substrate 200. At the surface of the n-well region 201, p-well regions 202, 402, 404 isolated from one another are formed. The p-well regions 202, 402, 404 are for forming a memory cell MC and MOS transistors 35, 36, respectively. An n+-type diffused layer 409 is formed around the periphery of the p-well regions 202, 402, 404. The n+-type diffused layer 409 is a contact layer for applying a voltage VNW to the n-type well region 201. Along the internal circumference of the p-well region 202, a p+-type diffused layer 406 is formed which makes a contact layer for applying a voltage VPW to the p-well region 202. Along the internal circumference of the p-well region 402, a p+-type diffused layer 407 is formed which makes a contact layer for applying a voltage VSGPW to the p-well region 402. Along the internal circumference of the p-well region 404, a p+-type diffused layer 408 is formed which makes a contact layer for applying a voltage VSGPW to the p-well region 404.

The n-type well region 401 is for forming the row address decode circuit 31. Along the internal circumference of the n-well region 401, an n+-type diffused layer 413 is formed which functions as a contact layer for applying a voltage VCC2 to the n-well region 401. At the surface of the n-well region 401, a p-well region 405 is formed. Along the internal circumference of the p-well region 405, a p+-type diffused layer 412 is formed which function as a contact layer for applying a voltage VSS to the p-well region 405.

An n-well region 400 is for forming the row address decode circuit 21. Along the internal circumference of the n-well region 400, a n+-type diffused layer 411 is formed which function as a contact layer for applying a voltage VCGNW to the n-well region 400. At the surface of the n-well region 400, a p-well region 403 is formed. Along the internal circumference of the p-well region 403, a p+-type diffused layer 410 is formed which function as a contact layer for applying a voltage VCGPW to the p-well region 403.

In the p-well region 404, an element region AA is formed. In the element region AA, an isolating MOS transistor 36 is formed. In the p-well region 402, an element region AA is formed. In the element region AA, an isolating MOS transistor 35 is formed. In addition, in element regions AA formed in the n-well region 400 and p-well region 403, the MOS transistors for forming the row address decode circuit 21 are formed. Furthermore, in element regions AA formed in the n-well region 401 and p-well region 405, the MOS transistors for forming the row address decode circuit 31 are formed. In the p-well region 202, a memory cell is formed.

A word line WL formed on the p-well region 202 is connected to one end of the current path of a MOS transistor in the row address decode circuit 21 by metal wiring layers 421, 422 of a first layer. The other end of the MOS transistor in the row address decode circuit 21 is connected to diffused layers 410, 411 by metal wiring layers 423, 425 of the first layer. Gates 419, 420 are connected to a metal wiring layer 435 of a second layer transmitting a row address signal RA by a metal wiring layer 424 of the first layer.

One end of a select gate line SG formed on the p-well region 202 is connected to a metal wiring layer 428 of a third layer via a metal wiring layer 426 of the first layer and a metal wiring layer 427 of the second layer. The metal wiring layer 428 is connected to one end of the current path of the isolating MOS transistor 36 via a metal wiring layer 429 of the second layer and a metal wiring layer 430 of the first layer. The other end of the current path of the isolating MOS transistor 36 is connected to a diffused layer 408 by a metal wiring layer 431 of the first layer. The gate 416 of the isolating MOS transistor 36 is connected to a metal wiring layer 434 of the second layer transmitting a signal WSG via a wiring layer 432 at the same level as the gate 416 and a metal wiring layer 433 of the first layer.

The other end of the select gate SG is connected to one end of the current path of the isolating MOS transistor 35 by a metal wiring layer 436 of the first layer. The gate 415 of the isolating MOS transistor 35 is connected to a metal wiring layer 442 of the second layer transmitting a signal ZISOG via a wiring layer 440 at the same level as the gate 415 and a metal wiring layer 441 of the first layer.

The other end of the current path of the isolating MOS transistor 35 is connected to one end of the current path of a MOS transistor in the row address decode circuit 31 by a metal wiring layer 437 of the first layer. The other end of the current path of the MOS transistor is connected to the diffused layers 413, 412 via metal wiring layers 444, 438 of the first layer. The gates 417, 418 of the MOS transistors are connected to a metal wiring layer 443 of the second layer transmitting a row address signal RA via a metal wiring layer 439 of the first layer.

With the above configuration, the MOS transistors in the row address decode circuit 31 are low-voltage MOS transistors using Vcc2 as a power supply voltage; whereas the MOS transistors 35, 36 and the MOS transistors in the row address decode circuit 21 are high-voltage MOS transistors using VBB1 and VPP1 as power supply voltages. The low-voltage MOS transistors are isolated from the high-voltage MOS transistors by wells. That is, the isolating transistors 35, 36, high-voltage MOS transistors, are isolated from the n-well region 401 and are formed in the same n-well region 201 as the memory cell.

The reason why the p-well regions 202 and 404 are isolated from each other is that they are set to different voltages in an erase operation. If they can be set to the same voltage, they may be formed in the same well. Since the isolating transistors 35, 36 are n-channel MOS transistors and the p-well regions 202, 402, 404 share the n-well region 201, the region necessary for well isolation can be reduced and therefore the area of the flash memory can be decreased.

Figure 7:
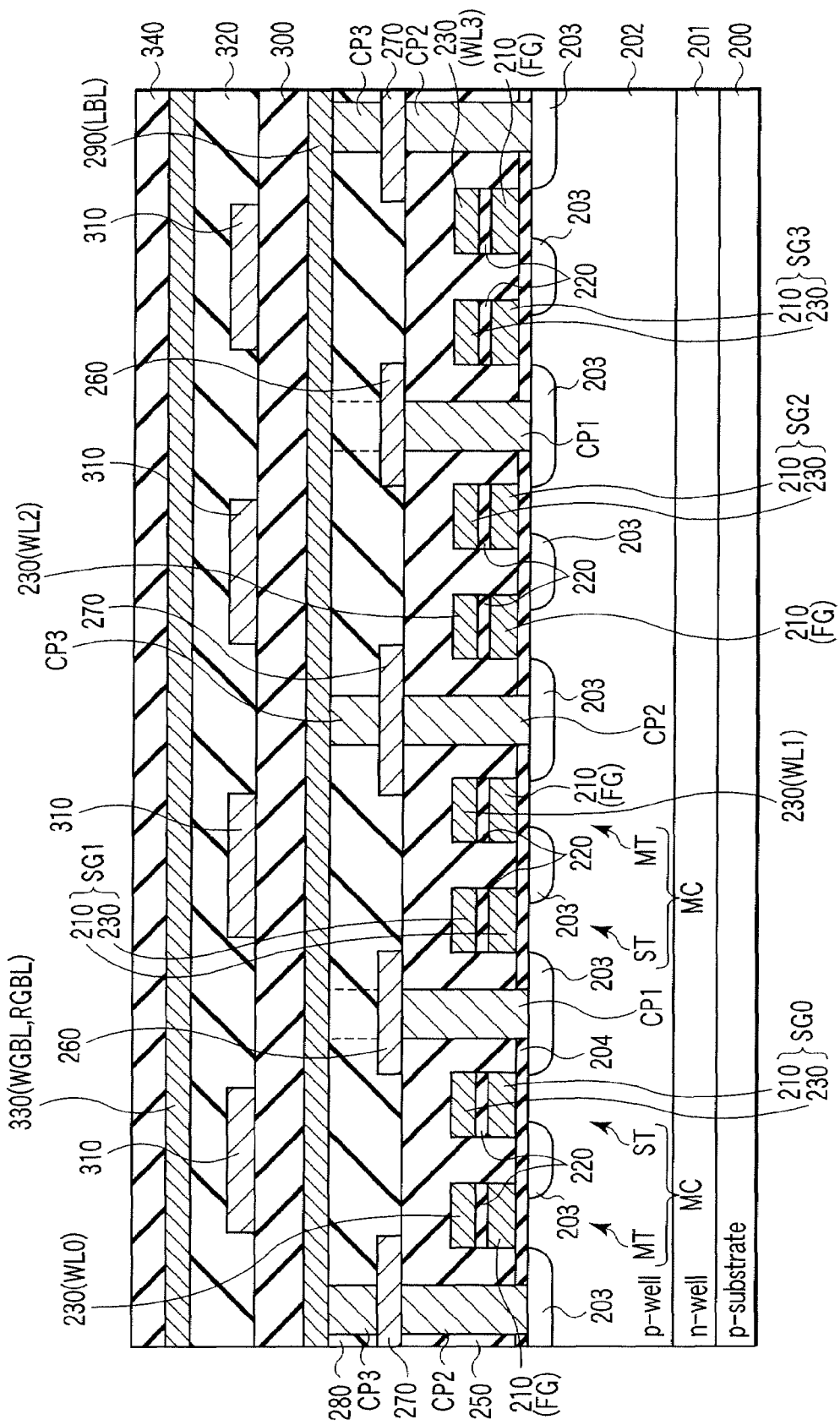
FIG. 7 is a sectional view, taken along a bit line, of the memory cell array of the 2Tr flash memory according to the first embodiment.

Next, the sectional structure of the memory cell array 10 included in a flash memory with the above-described configuration will be explained with reference to FIG. 7. FIG. 7 is a sectional view of the memory cell array 10 taken along a bit line.

As shown in FIG. 7, at the surface of the p-type semiconductor substrate 200, an n-well region 201 is formed. At the surface of the n-well region 201, a p-well region 202 is formed. In the p-well region 202, an element isolating region STI is formed. The region surrounded by the element isolating region STI is an element region AA. On the element region of the p-well region 202, a gate insulating film 204 is formed. On the gate insulating film 204, the gate electrodes of a memory cell transistor MT and a select transistor ST are formed. Each of the gate electrodes of the memory cell transistor MT and the select transistor ST includes a polysilicon layer 210 formed on the gate insulating film 204, an inter-gate insulating film 220 formed on the polysilicon layer 210, and a polysilicon layer 230 formed on the inter-gate insulating film 220. The inter-gate insulating film 220 is made of, for example, a silicon oxide film, or an ON film, NO film, or ONO film having a stacked structure of a silicon oxide film and a silicon nitride film.

In a memory cell transistor MT, the polysilicon layers 210, which are isolated from each other between adjacent element regions AA along the word line, function as floating gates (FG). On the other hand, the polysilicon layers 230, which are shared by adjacent element regions AA, function as control gates (or word line WL).

In a select transistor ST, the polysilicon layers 210 are shared by adjacent element regions AA. The polysilicon layers 230 are also shared by adjacent element regions AA. Then, the polysilicon layers 210, 230 function as select gate lines SG. Of these polysilicon layers, it is only the polysilicon layers 210 that practically function as select gate lines.

At the surface of the p-well region 202 between adjacent gate electrodes, an impurity diffused layer 203 is formed. The impurity diffused layer 203 is shared by adjacent transistors. As described above, a memory cell including a memory cell transistor MT and a select transistor ST is formed so as to have the following relationship. In adjacent memory cells, their select transistors ST or their memory cell transistors MT are adjacent to each other. The adjacent select transistors or memory cell transistors share the impurity diffused layer 203. Therefore, two adjacent memory cells MC, MC, when their select transistors are adjacent to each other, are arranged symmetrically with the impurity diffused layer (or source region) 203 shared by the two select transistors ST, ST. Conversely, when their memory cell transistors MT are adjacent to each other, two adjacent memory cells MC, MC are arranged symmetrically with the impurity diffused layer (or drain region) 203 shared by the two memory cell transistors MT, MT.

Then, on the p-well region 202, an interlayer insulating film 250 is formed so as to cover the memory cell transistor MT and select transistor ST. In the interlayer insulating film 250, a contact plug CP1 reaching the impurity diffused layer (or source region) 203 shared by two select transistors ST, ST is formed. On the interlayer insulating film 250, a metal wiring layer 260 connected to the contact plug CP1 is formed. The metal wiring layer 260 functions as a source line SL. Further in the interlayer film 250, a contact plug CP2 reaching the impurity diffused layer (or drain region) 203 shared by two memory cell transistors MT, MT is formed. On the interlayer insulating film 250, a metal wiring layer 270 connected to the contact plug CP1 is further formed.

On the interlayer insulating film 250, an interlayer insulating film 280 is formed so as to cover the metal wiring layers 260, 270. In the interlayer insulating film 280, a contact plug CP3 reaching the metal wiring layer 270 is formed. On the interlayer insulating film 280, a metal wiring layer 290 connected commonly to a plurality of contact plugs CP3 is formed. The metal wiring layer 290 function as any one of the local bit lines LBL0 to LBL3. In the interlayer insulating film 280, a contact plug reaching the metal wiring layer 260 is formed. The contact plug connects a plurality of source lines 260 to one another in a region (not shown).

On the interlayer insulating film 280, an interlayer insulating film 300 is formed so as to cover the metal wiring layer 290. On the interlayer insulating film 300, a metal wiring layer 310 is formed. The metal wiring layer 310, which is connected to the polysilicon layer 210 of the select transistor ST in a shunt region (not shown), functions as a shunt line for a select gate line. The interconnections of the metal wiring layers 310 are arranged at equal intervals. In the shunt region, at least a part of the polysilicon layer 230 of the select transistor ST is removed. A contact plug (not shown) formed in the region connects the shunt line 310 to the polysilicon layer 210. The shut line 310 is electrically separated from the polysilicon layer 230.

On the interlayer insulating film 300, an interlayer insulating film 320 is formed so as to cover the metal wiring layer 310. On the interlayer insulating film 320, a metal wiring layer 330 functioning as a write global bit line and a read global bit line is formed. In addition, an interlayer insulating film 340 is also formed.

Figure 8:
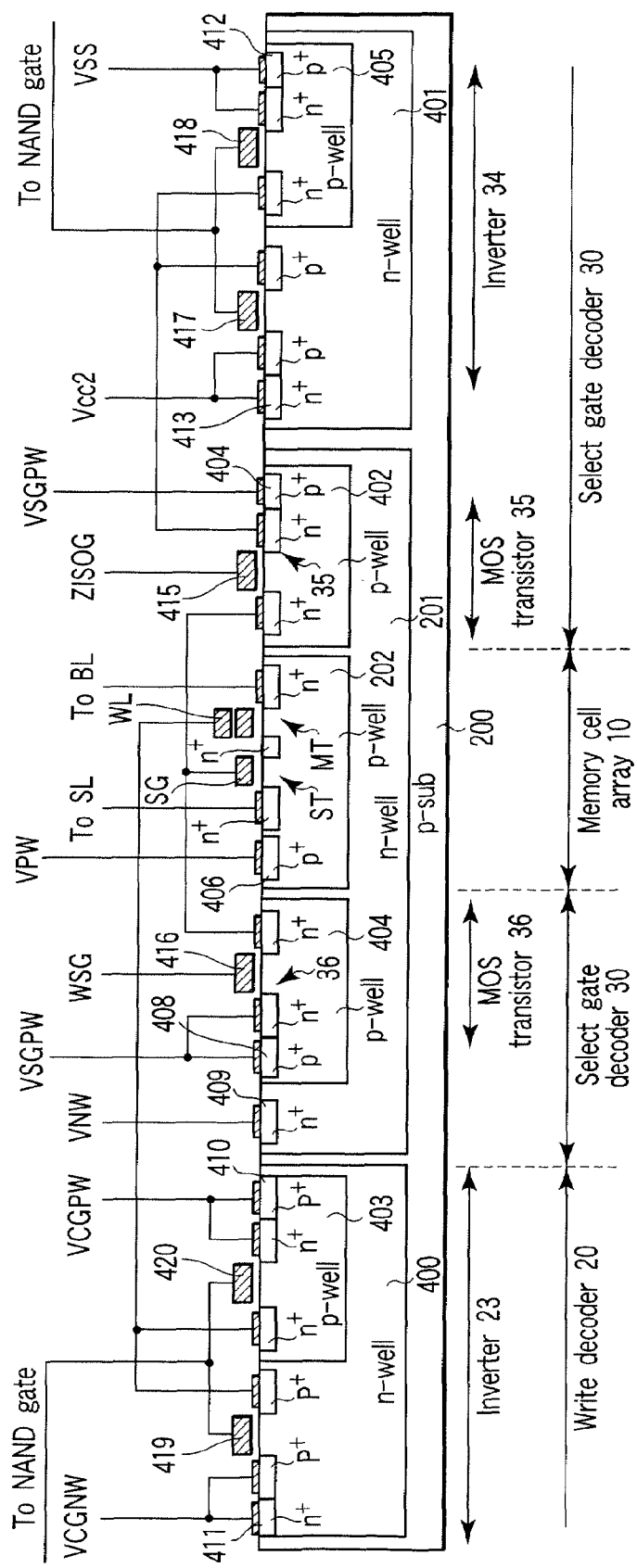
FIG. 8 is a sectional view of the memory cell array, write decoder, and select gate decoder of the 2Tr flash memory according to the first embodiment.

FIG. 8 is a sectional view of a part of the memory cell array 10, select gate decoder 30, and write decoder 20 of FIG. 5. FIG. 8 particularly shows only one memory cell MC, inverters 23, 34, and MOS transistors 35, 36. The configuration is equivalent to a sectional structure of FIG. 6 explained above.

As shown in FIG. 8, at the surface of the semiconductor substrate 200, n-well regions 201, 400, 401 separated from one another are formed. The n-well region 201 is for forming the memory cell MC in the memory cell array 10 and the MOS transistors 35, 36 in the select gate decoder 30. The n-well region 400, which is separated from the n-well region 201, is used for forming the write decoder 20. The n-well region 401 is for forming the row address decode circuit 31 of the select gate decoder 30.

At the surface of the n-well region 400, a p-well region 403 is formed. On the n-well region 400 and p-well region 403, a p-channel MOS transistor 24 and an n-channel MOS transistor 25 included in an inverter 23 are formed respectively. The p-well region 403 is connected to VCGPW node and the n-well region 400 is connected to VCGNW node.

At the surface of the n-well region 201, p-well regions 202, 402, 404 are further formed. On the p-well regions 202, 402, 404, the memory cell MC and the MOS transistors 35, 36 in the select gate decoder 30 are formed respectively. Although the select transistor ST in the memory cell is shown as a single-layer gate, it may have a stacked gate structure as the memory cell transistor MT. The n-well region 201 is connected to the power supply potential node VNW, the p-well region 202 is connected to VPW node, and the p-well regions 402, 404 are connected to VSGPW node.

On the n-well region 401, a p-channel MOS transistor in the inverter 34 is formed. On the p-type semiconductor substrate 200, an n-channel MOS transistor in the inverter 34 is formed. The semiconductor substrate 200 is connected to GND. The voltage Vcc2 is applied to the n-well region 401.

Figure 9:
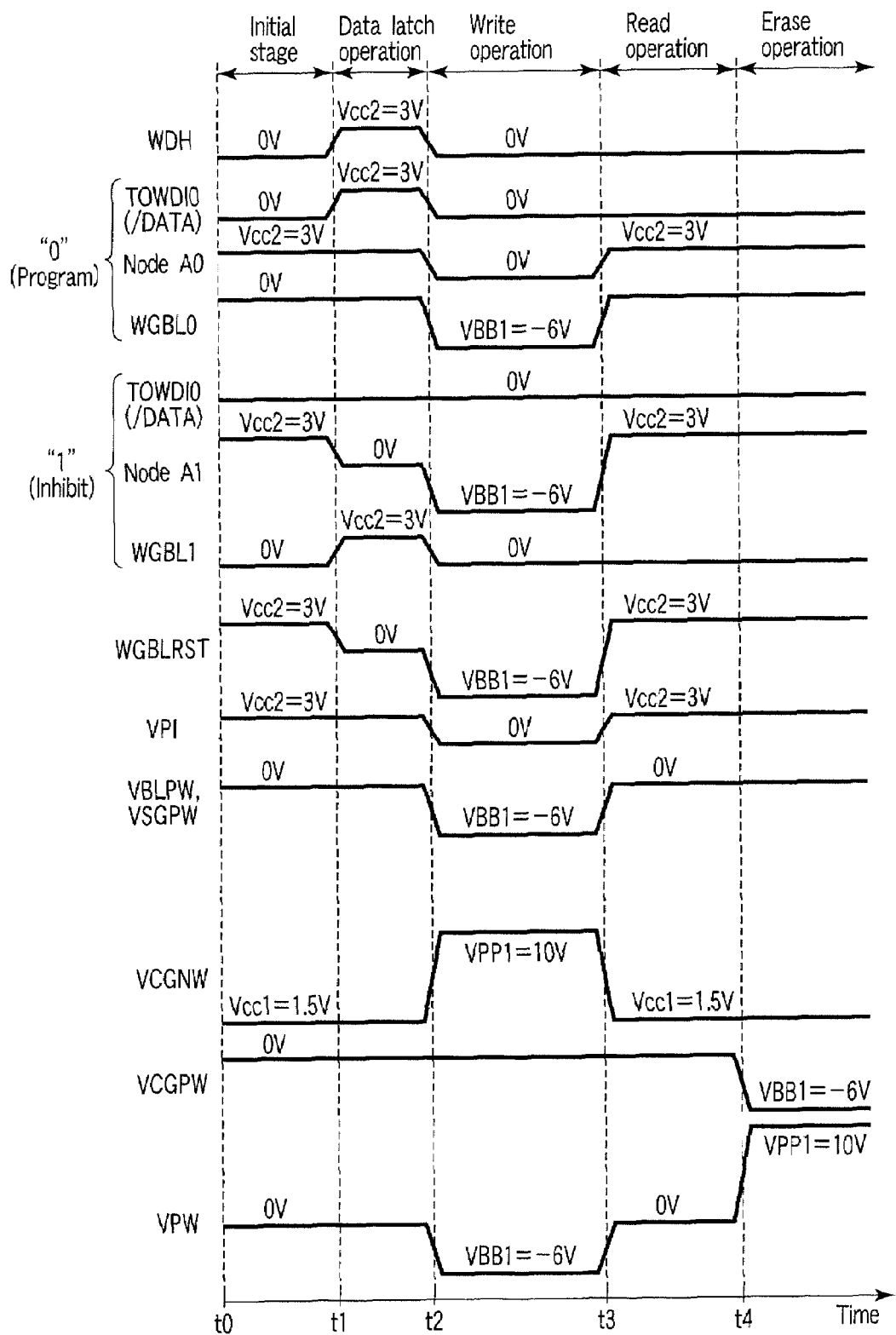
FIG. 9 is a timing chart for various signals in a write, an erase, and a read operation of the 2Tr flash memory according to the first embodiment.

Next, the operation of the 2Tr flash memory 3 with the above configuration will be explained with reference to FIG. 9. FIG. 9 is a timing chart for various signals and voltages at various nodes. Hereinafter, a state where no electron is injected into the floating gate and the threshold voltage is negative is defined as a state where "1" data has been written. A state where electrons are injected into the floating gate and the threshold voltage is positive is defined as a state where "0" data has been written. To simplify explanation, a case where a memory cell array 10 has two write global bit lines WGBL0, WGBL1 and one read global bit line RGBL0 is used as an example.

<Initial Operation>

Figure 10:
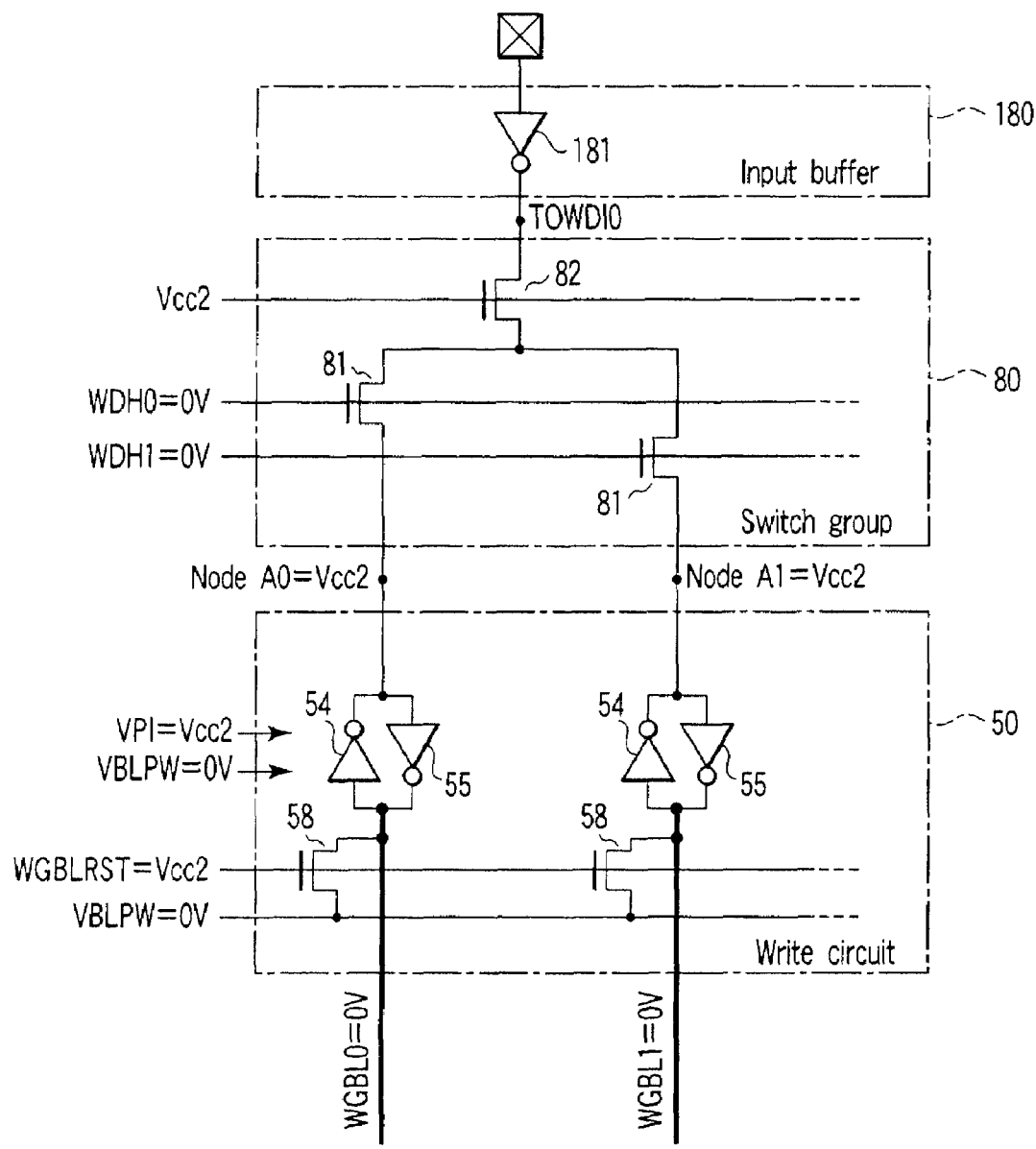
FIG. 10 is a circuit diagram to help explain the states of an input buffer, switch group, and write circuit in the initial operation of the 2Tr flash memory according to the first embodiment.

An initial operation will be explained with reference to FIG. 10. An initial operation is the first operation to be performed in a write, a read, and an erase operation. In FIG. 9, an initial operation is carried out in the period between time t0 to time t1. FIG. 10 is a circuit diagram of the input buffer 180, switch group 80, and write circuit 50 corresponding to the write global bit lines WGBL0, WGBL1 in an initial operation.

Before the initial operation, the signals WDH0 and WDH1 are both set to the low (L) level (0V), turning off the MOS transistors 81 in the switch group 80, which electrically isolates the write circuit 50 from the input buffer 180. The write inhibit voltage VPI supplied as the high voltage power supply voltage of the latch circuit 53 is set to Vcc2 and VBLPW is set to 0V. Then, the signal WGBLRST is set to the high (H) level (Vcc2) and all of the write global bit lines WGBL0, WGBL1 are reset. That is, the MOS transistors 58 in the write circuit 50 are turned on, thereby allowing VBLPW node to apply 0V to the write global bit lines WGBL0, WGBL1. As a result, the output nodes of all of the latch circuits 53 go to the low (L) level (0V) and the input nodes (node A0, node A1) go to the high (H) level (Vcc2).

As described above, in the initial operation, the write global bit lines are set to 0V and Vcc2 is applied to node A0 and node A1.

<Data Latch Operation>

Figure 11:
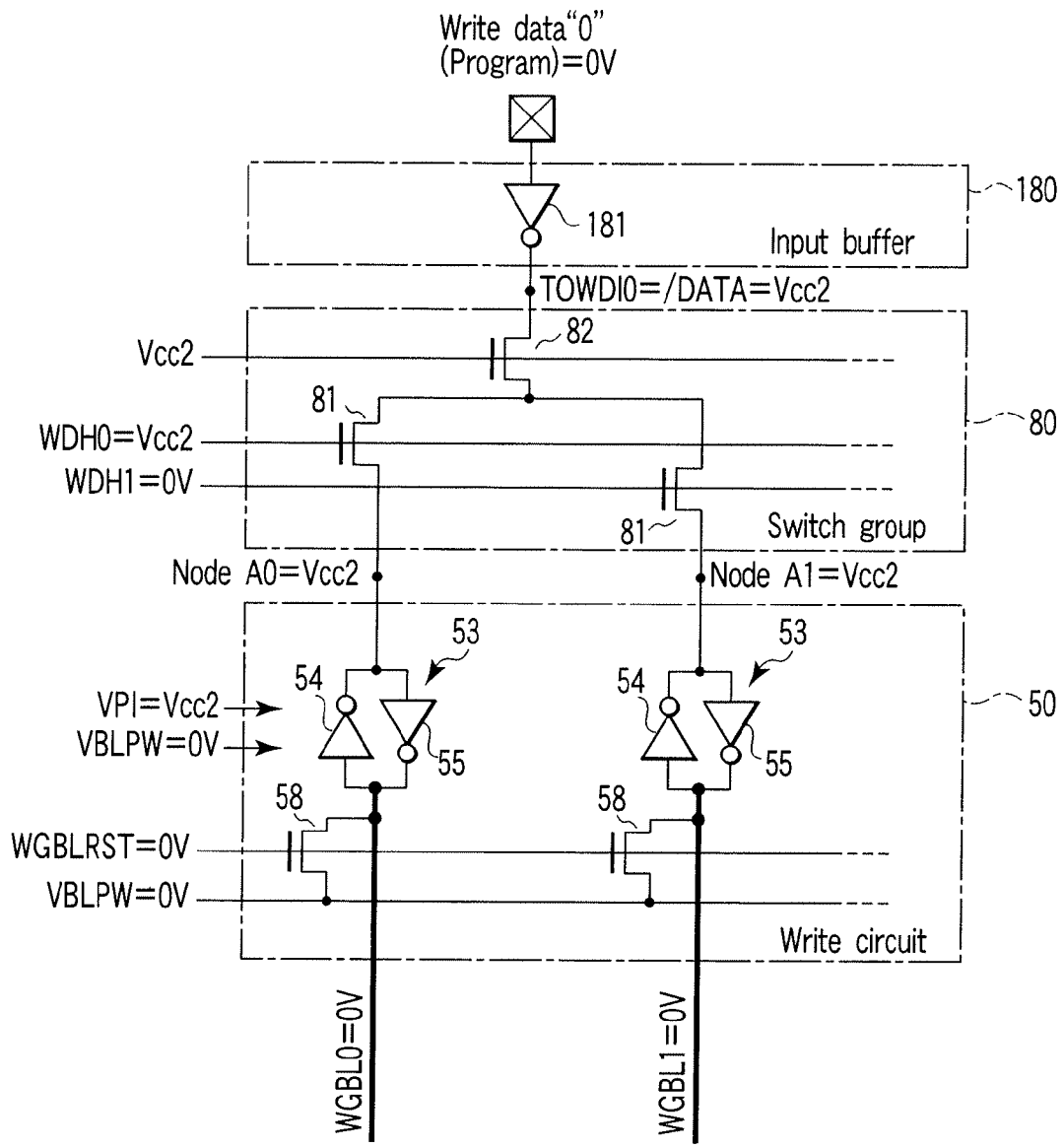
FIG. 11 is a circuit diagram to help explain the states of the input buffer, switch group, and write circuit in a data latch operation of the 2Tr flash memory according to the first embodiment.
Figure 12:
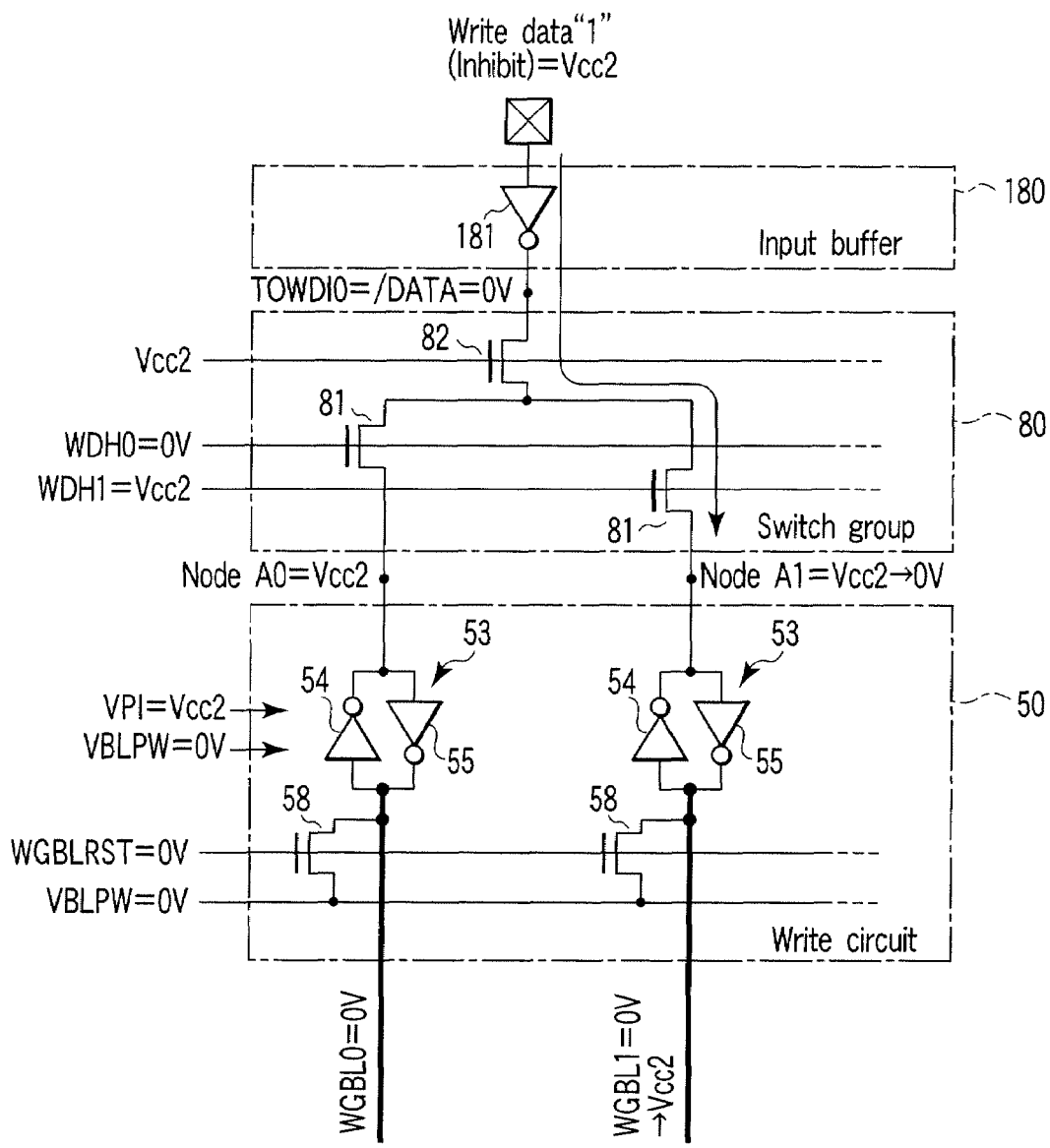
FIG. 12 is a circuit diagram to help explain the states of the input buffer, switch group, and write circuit in a data latch operation of the 2Tr flash memory according to the first embodiment.

Next, a data latch operation will be explained with reference to FIGS. 11 and 12. A data latch operation is the operation of inputting the write data to each latch circuit 53 in a write operation. A data latch operation is carried out between time t1 to time t2 in FIG. 9. FIGS. 11 and 12 are circuit diagrams of the input buffer 180, switch group 80, and write circuit 50 in a data latch operation. FIG. 11 shows a case where "0" data has been input. FIG. 12 shows a case where "1" data has been input. Hereinafter, explanation will be given using a case where "0" data is written into the memory cells connected to write global bit line WGBL0 (that is, WGBL0 is selected) and "1" data is written into the memory cells connected to WGBL1 (that is, WGBL1 is unselected).

First, a case where "0" data is input will be explained with reference to FIG. 11. Before a data latch operation, the signal WGBLRST is set to 0V, thereby turning off the MOS transistor 58, which electrically isolates write global bit lines WGBL0, WGBL1 from VBLPW node. To latch the data in the latch circuit 53 corresponding to write global bit line WGBL0, the signal WDH0 is set to the high (H) level (Vcc2), which turns on the MOS transistor 81 corresponding to write global bit line WGBL0. On the other hand, the MOS transistor 81 corresponding to write global bit line WGBL1 is turned off. Therefore, the input buffer 180 is electrically connected to the latch circuit 53 corresponding to write global bit line WGBL0.

Then, the CPU 2 inputs "0" data to the inverter of the input buffer 180. When "0" data is input, 0V is applied to the input node of the inverter 181. The "0" data is inverted by the inverter 181. As a result, the potential of TOWDI0 node goes to Vcc2. Then, since Vcc2 has been applied to the gate of the MOS transistor 82, the MOS transistor 82 goes into the cutoff state. Therefore, the latch circuit 53 keeps holding the data given in the period between time t0 to time t1. That is, node A0 remains at Vcc2 and write global bit line WGBL0 remains at 0V.

Next, a case where "1" data is input will be explained with reference to FIG. 12. What differs from the case where "0" data is input is that setting WDH0 to 0V (WDH0=0V) and WDH1 to Vcc2 (WDH1=Vcc2) brings the MOS transistor 81 corresponding to write global bit line WGBL1 into the on state.

Then, the CPU 2 inputs "1" data to the input buffer 180. When "1" data is input, Vcc2 is applied to the input node of the inverter 181. Consequently, the potential at the TOWDI0 node goes to 0V. The potential at TOWDI0 node is input to the latch circuit 53 via the current path of the MOS transistor 81. As a result, the potential at node A1 is inverted from Vcc2 to 0V, which inverts the potential on write global bit line WGBL1 from 0V to Vcc2.

As described above, in the data latch operation, the data in the latch circuit corresponding to the memory cell into which "1" data is to be written is reversed from its initial state. That is, when "0" writing is done (or when electrons are injected), virtually no data is input from the outside. When "1" writing (or when no electron is injected=the memory is unselected), the data is taken in from the outside.

<Write Operation>

Figure 13:
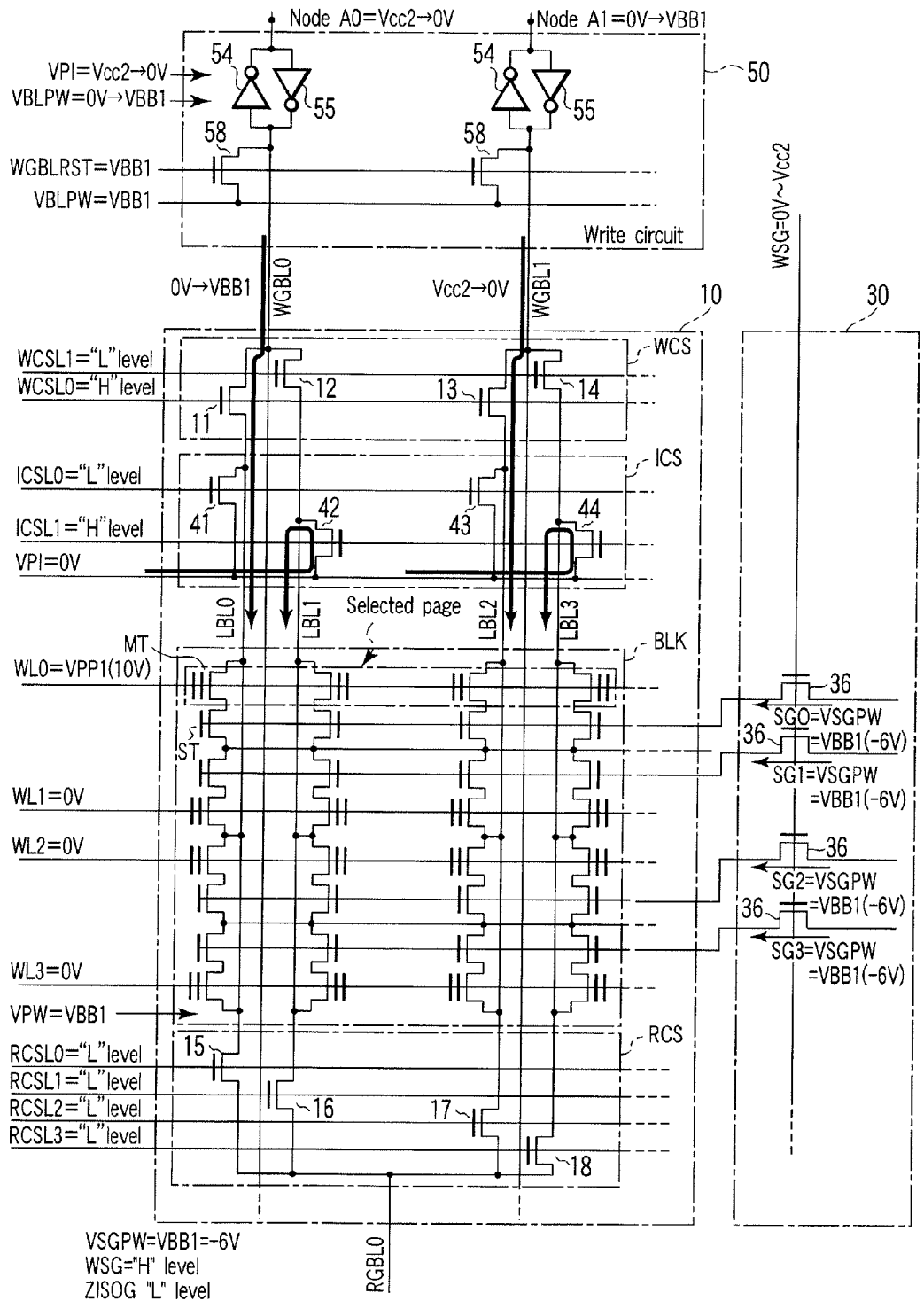
FIG. 13 is a circuit diagram to help explain the states of the memory cell array, select gate decoder, switch group, and write circuit in a write operation of the 2Tr flash memory according to the first embodiment.

A write operation will be explained with reference to FIG. 13. Data is written simultaneously into all of the memory cell blocks in a row. In each of the memory cell blocks, the memory cells written into simultaneously include those connected to one of the local bit lines LBL0 and LBL1 and those connected to one of the local bit lines LBL2 and LBL3.

In FIG. 9, a write operation is carried in the period between time t2 and t3. FIG. 13 is a circuit diagram of a part of the memory cell array 10, write selector 50, and select gate decoder 30 in a write operation. In FIG. 13, it is assumed that data is written into the memory cell transistors MT connected to word line WL0 and local bit lines LBL0, LBL2 and that, of the memory cell transistors MT, "0" data is written into the one connected to local bit line LBL0 and "1" data is written into the one connected to local bit line LBL2. In other words, the memory cell connected to local bit line LBL0 is selected and the memory cell connected to local bit line LBL2 is unselected.

First, before a write operation, the signal WGBLRST still remains at 0V. Then, at time t2, the write inhibit voltage VPI changes from Vcc2 to 0V and the potential at VBLPW node changes from 0V to VBB1 (−6V). Under the control of the write state machine 120, the voltage generator 130 outputs the negative potential VBB1. The potential of VPI may be a negative potential instead of 0V.

Then, the low-voltage-side power supply voltage of the inverters 54, 55 in the latch circuit 53 changes from 0V to VBB1 and the high-voltage-side power supply voltage changes from Vcc2 to 0V, with the result that the potentials at node A0 and node A1 change to 0V and VBB1, respectively. The potentials on write global bit lines WGBL0, WGBL1 also change to VBB1 and 0V, respectively.

Then, the write decoder 20 selects word line WL0 and applies the positive voltage VPP1 (10V) to the selected word line WL0. In addition, the signal WSG is set to the high (H) level (0V to Vcc2), turning on the isolating MOS transistor 36, which allows the negative potential VBB1 (−6V) at VSGPW node to be applied to all of the select gate lines SG0 to SG(4m+3). In addition, the write decoder 20 applies the negative potential VBB1 to the substrate (or p-well region 202) in which memory cells has been formed. In a write operation, the signal ZISOG is set to the low (L) level, which electrically isolates the row address decode circuit 31 of the select gate decoder 30 from the select gate lines.

The column decoder 40 selects write column select line WCSL0 from the two write column select lines connected to the write column selector WCS corresponding to the memory cell block BLK including the selected word line WL0. This turns on the MOS transistors 11, 13 in the write column selector WCS. As a result, write global bit line WGBL0 and local bit line LBL0 are electrically connected and write global bit line WGBL1 and local bit line LBL2 are electrically connected.

Furthermore, the column decoder 40 makes unselected all of the write column select lines connected to the write column selector WCS corresponding to the memory cell block BLK which does not include the selected word line WL0. Therefore, the MOS transistors 11 to 14 in the write column selector WCS corresponding to the memory cell block BLK not including the selected word line are turned off.

Furthermore, the column decoder 40 makes unselected all of the read column select lines RCSL0 to RCSL(4m+3). This turns off the MOS transistors 15 to 18 in all of the read column selectors RCS. Therefore, the read global bit lines RGBL are electrically isolated from local bit lines LBL0 to LBL3.

In addition, to turn on the MOS transistors 42, 44 connected to local bit lines LBL1, LBL3 made unselected, the column decoder 40 sets the write inhibit column select line ICSL1 to the high (H) level (Vcc2). Write inhibit column select line ICSL0 connected to the MOS transistors 41, 43 corresponding to the selected local bit lines LBL0, LBL2 is set to the low (L) level, which turns off the MOS transistors 41, 43. As a result, the write inhibit voltage VPI=0V is applied to the unselected local bit lines LBL1, LBL3.

Consequently, the write voltage (VBB1) is applied from write global bit line WGBL0 via the MOS transistor 11 in the write column selector WCS to the local bit line LBL0 in the memory cell block BLK including the selected word line WL0. Moreover, the write inhibit voltage VPI (0V) is applied from write global bit line WGBL1 via the MOS transistor 13 to local bit line LBL2 in the memory cell block BLK including the selected word line WL0.

As a result, in the memory cell transistor MT connected to write global bit lines WGBL1 and word line WL0, since the potential difference between the gate and channel is insufficient (VPP1−VPI=10V), no electron is injected into the floating gate. Thus, the memory cell MC holds the negative threshold value. That is, "1" data is written. Furthermore, in the memory cell transistors MT connected to the unselected local bit lines LBL1, LBL3 and word line WL0, since VPI is applied to the channel, no electron is injected into the floating gate, which enables the memory cell MC to hold the negative threshold value. On the other hand, in the memory cell transistor MT connected to write global bit line WGBL0 and word line WL0, since the potential difference between the gate and channel is sufficient (VPP1−VBB1=16V), electrons are injected into the floating gate by FN tunneling. As a result, the threshold value of the memory cell transistor MT changes to positive. That is, "0" data is written.

As described above, the data is written into one page of memory cell transistors simultaneously.

<Erase Operation>

An erase operation will be explained with reference to FIG. 14. An erase operation is carried out at time t4 and later in FIG. 14. FIG. 14 is a circuit diagram of the memory cell array 10 in an erase operation. Data is erased from all of the memory cells MC sharing the p-well region 202 simultaneously. An erase operation is carried out by pulling electrons out of the floating gate by FN tunneling.

Before an erase operation, all of the MOS transistors 11 to 14 are turned off. Therefore, all of the write global bit lines WGBL0, WGBL1 are electrically isolated from the latch circuit 51 and from VBLPW node and VPI node and therefore go into the floating state.

Then, the write decoder 20 applies the negative voltage VBB2 to all of the word lines WL0 to WL(4m+3) in the selected block. In addition, the write decoder 20 applies the positive potential VPP1 to the substrate (p-well region 202) in which memory cells have been formed. In the erase operation, the signals ZISOG and WSG are set to the low (L) level, which isolates the row address decode circuit 31 of the select gate decoder 30 electrically form the select gate lines.

As a result, electrons are extracted from the floating gates of the memory cell transistors of the memory cells MC into the substrate by FN tunneling, thereby erasing the data in all of the memory cells MC connected to word lines WL0 to WL(4m+3), which makes the threshold voltage negative.

The potential on the select gate line rises to about VPP1 as a result of coupling with the p-well region 202. Therefore, almost no voltage stress is applied to the gate insulating film of the select transistor ST. In the select gate decoder 30, VPP1 may be applied to the select gate line by setting VSGPW to VPP1 (VSGPW=VPP1) and turning on the MOS transistor 36.

As described above, data is erased simultaneously.

<Read Operation>

Figure 15:
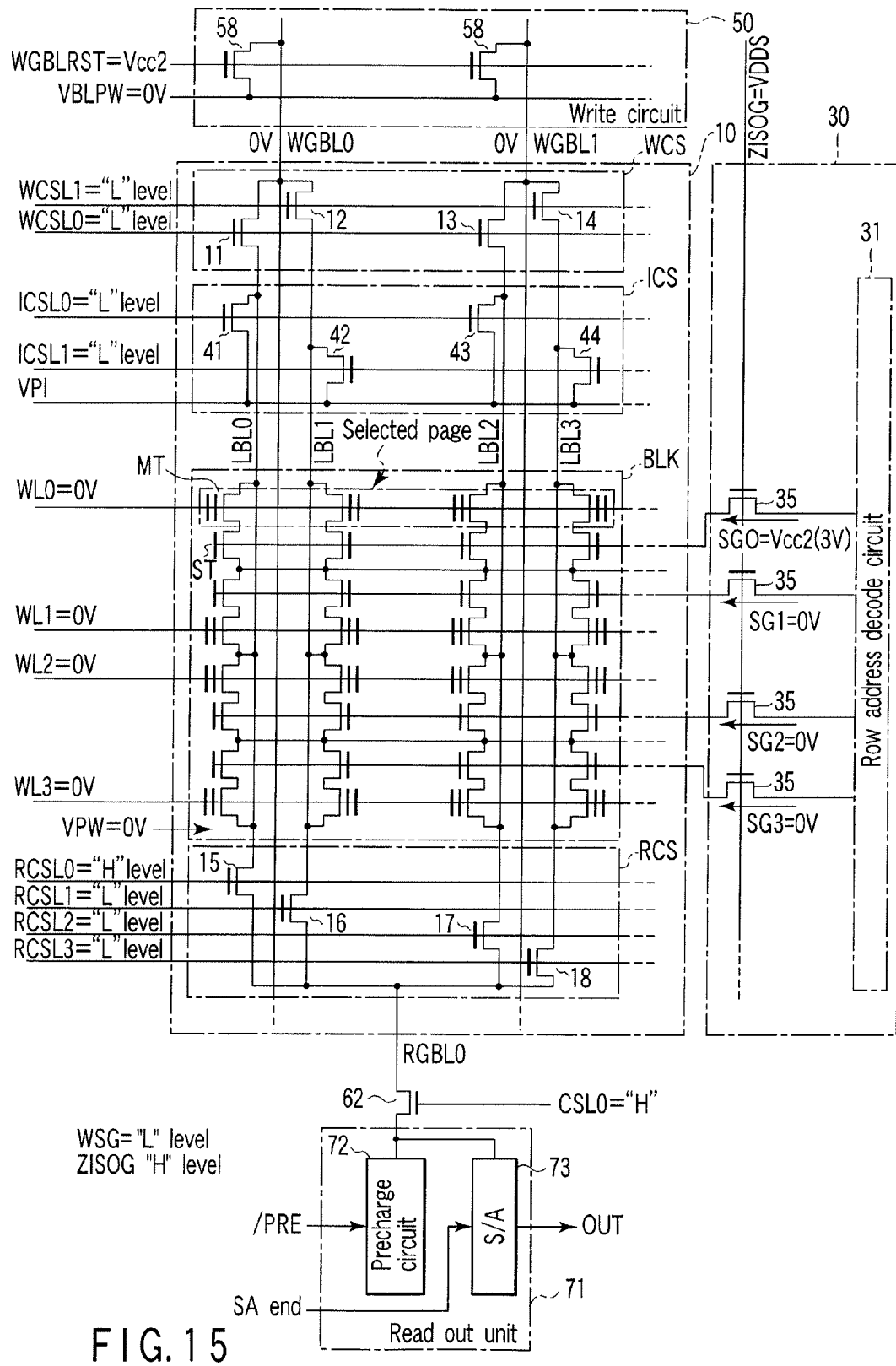
FIG. 15 is a circuit diagram of a part of the write decoder of the 2Tr flash memory according to the first embodiment, which helps explain the states of the memory cell array and read circuit in a read operation.

Next, a read operation will be explained by reference to FIG. 15. In FIG. 9, a read operation is carried out in the period between time t3 and time t4. FIG. 15 is a circuit diagram of the memory cell array 10 and read unit 71 of the 2Tr flash memory 3. FIG. 15 shows a case where the data is read from the memory cell transistor MT connected to local bit line LBL0 and word line WL0. The data is read from one memory cell MC per memory cell block BLK. However, when there are a plurality of read global bit lines per memory cell block BLK, as many items of data as correspond to the read global bit lines are read out.

As shown in FIG. 15, first, the column decoder 40 selects read column select line RCSL0 from the four read column select lines RCSL0 to RCSL3 connected to the read column selector RCS corresponding to the memory cell block BLK including the selected select gate line SG0. This turns on the MOS transistor 15 in the read column selector RCS corresponding to the memory cell block BLK including the selected select gate line SG0.

Furthermore, the column decoder 40 makes all of the write column select lines WCSL0 to WCSL(2m+1) unselected, which turns off all of the four MOS transistors 11 to 14 in all of the write column select lines WCSL0 to WCSL(2m+1). Therefore, write global bit line WGBL is electrically separated from local bit lines LBL0 to LBL3.

When the signal WGBLRST is set to the high (H) level (Vcc2), this turns on the MOS transistor 58 in the write circuit 50. 0V is applied to VBLPW node. Therefore, all of the write global bit lines WGBL0, WGBL1 are set to 0V in the read operation.

Furthermore, the signal BIAS is set to the high (H) level and the signal /PRE is set to the low (L) level. Moreover, the column decoder 40 sets column select line CSL0 to the high (H) level. This turns on the MOS transistor 62, which allows the precharge circuit 72 to precharge read global bit line RGBL0.

After the potential on the read global bit line has reached a specific precharge potential, the signal ZISOG is set to the high (H) level (VDDS), turning on the isolating MOS transistor 35. Then, the select gate decoder 30 selects select gate line SG0 (H level: Vcc2=3V). Furthermore, the write decoder 20 makes all of the word lines WL0 to WL(4m−1) unselected (0V) and sets the potential VPW at the p-well region 202 to 0V. Moreover, the source line driver 100 sets the potential of the source line to 0V. In the read operation, the signal WSG is set to the low (L) level, which electrically isolates VSGPW node from the select gate line.

Then, the select transistor ST connected to the select gate line SG0 is turned on. As a result, if the data written in the memory cell transistor MT connected to the selected word line WL0 and selected local bit line LBL0 is "1", current flows from read global bit line RGBL0 to the source line. On the other hand, if the data written in the memory cell transistor MT is "0", no current flows.

Then, a change in the potential on the read global bit line as a result of current flowing in the memory cell MC is amplified by the sense amplifier 73.

As described above, the read operation is carried out.

With the flash memory of the first embodiment, the following effects in item (1) to item (4) will be produced.

(1) The performance of the row decoder can be improved.

With the flash memory of the first embodiment, the positive and negative high voltages VPP1 (10V) and VBB1 (−6V) are used in a write and an erase operation, whereas the relatively low voltage Vcc2 (3V) is used in a read operation. In this case, for the row decoder to deal with not only a write and an erase operation but also a read operation, the row decoder has to be made by high-withstand-voltage MOS transistors capable of withstanding the high voltages VPP1, VBB1. However, as far as a read operation is concerned, such high-withstand-voltage MOS transistors have only a high breakdown voltage to no purpose, which contributes to a decrease in the read speed.

In this respect, with the configuration of the first embodiment, the row decoder is divided into the write and erase decoder 20 and the read decoder 30. Then, the isolating MOS transistors 35, 36 are provided in the read decoder 30, which enables the select gate line to be connected to the row address decode circuit 31 in a read operation and to be electrically isolated from the row address decode circuit 31 in a write and an erase operation.

As a result, the read decode circuit 31 using a low voltage can be protected from such a high voltage as VPP1 or VBB1 being applied. Therefore, the row address decode circuit 31 can be made by low-withstand-voltage MOS transistors. Thus, the read operation can be carried out at higher speed. High-breakdown-voltage MOS transistors have only to be used in the write row address decode circuit 21 and isolating MOS transistors 35, 36, which helps minimize the number of high-withstand-voltage MOS transistors. This enables the size of the row decoder to be made smaller.

As described above, the operating speed of the row decoder can be improved and the row decoder can be made smaller in size. Therefore, the performance of the row decoder can be improved.

The signal ZISOG to control the connection of the select gate and the row address decode circuit 31 is made higher than at least (Vcc2+Vth) by the level shift circuit 37. Therefore, the MOS transistor 35 can transfer Vcc2 to the selected select gate line reliably. Accordingly, the reading accuracy can be improved.

(2) The operating speed of the flash memory can be improved.

With the configuration of the first embodiment, the bit lines are hierarchized into the local bit lines and the global bit lines (read global bit lines and write global bit lines). That is, a plurality of memory cells are connected to each of a plurality of local bit lines. A plurality of local bit lines are connected to each of a plurality of global bit lines. In the example of FIG. 2, 2 local bit lines (LBL0 and LBL1 or LBL2 and LBL3) are connected to one write global bit line WGBL via the write column selector WCS. Then, four memory cells are connected to each of the local bit lines LBL. In addition, 4 local bit lines (LBL0 to LBL3) are connected to one read global bit line RGBL via the read column selector RCS. Then, four memory cells are connected to each of the local bit lines.

In a write operation, only the local bit line LBL to which the selected memory cell has been connected is connected to the write global bit line WGBL. The local bit lines LBL to which the selected memory cell has not been connected are electrically isolated from the write global bit line WGBL by the write column selector WCS. Therefore, only one local bit line including the selected memory cell, that is, four memory cells, can be seen from one write global bit line WGBL. Therefore, only the four memory cells MC contribute to the parasitic capacitance on the write global bit line WGBL. The unselected memory cells which are in the same column as the selected memory cell and are connected to a different local bit line LBL do not contribute to the parasitic capacitance on the write global bit line. Therefore, it is possible to decrease the parasitic capacitance on the write global bit line remarkably. The same holds true for a read operation.

As described above, since the parasitic capacitance on the write global bit line and read global bit line are reduced, the operating speed of the flash memory can be improved.

(3) The read speed can be improved.

In the flash memory, relatively high voltages, including VPP1 and VBB1, have to be handled in a write operation. To meet this requirement, high-withstand-voltage MOS transistors whose gate insulating film is thick have to be used. On the other hand, the voltages handled in a read operation are lower than in a write operation. Therefore, as far as a read operation is concerned, it is desirable that low-withstand-voltage MOS transistors whose gate insulating film is thin should be used. Even from the viewpoint of operating speed, it is desirable that low-withstand-voltage MOS transistors should be used.

In this respect, with the configuration of the first embodiment, the local bit lines are connected to the write global bit lines and read global bit lines. Then, the memory cells are connected to the write circuit 50 via the write global bit lines and to the read circuit 70 via the read global bit lines. That is, the signal route for a write operation differs from the signal route for a read operation. Therefore, in the signal route in a read operation, all of the circuits excluding the read column selector RCS that connects the read global bit lines to the local bit lines can be made using the transistors whose gate insulating film is thin. As a result, the read operating speed can be improved.

(4) The reliability of a write operation can be improved.

As explained in item (2), the bit lines are hierarchized. When the write route is particularly considered, a plurality of local bit lines are connected to one write global bit lines. Then, in a write operation, only one local bit line including the selected memory cell is electrically connected to the write global bit line. The other local bit lines are electrically isolated from the write local bit line. Therefore, the voltage corresponding to the write data is not applied to the local bit lines to which the selected memory cell is not connected. Therefore, the memory cells connected to these local bit lines can be prevented effectively from being written into erroneously, which enables the reliability of the write operation to be improved.

Figure 16:
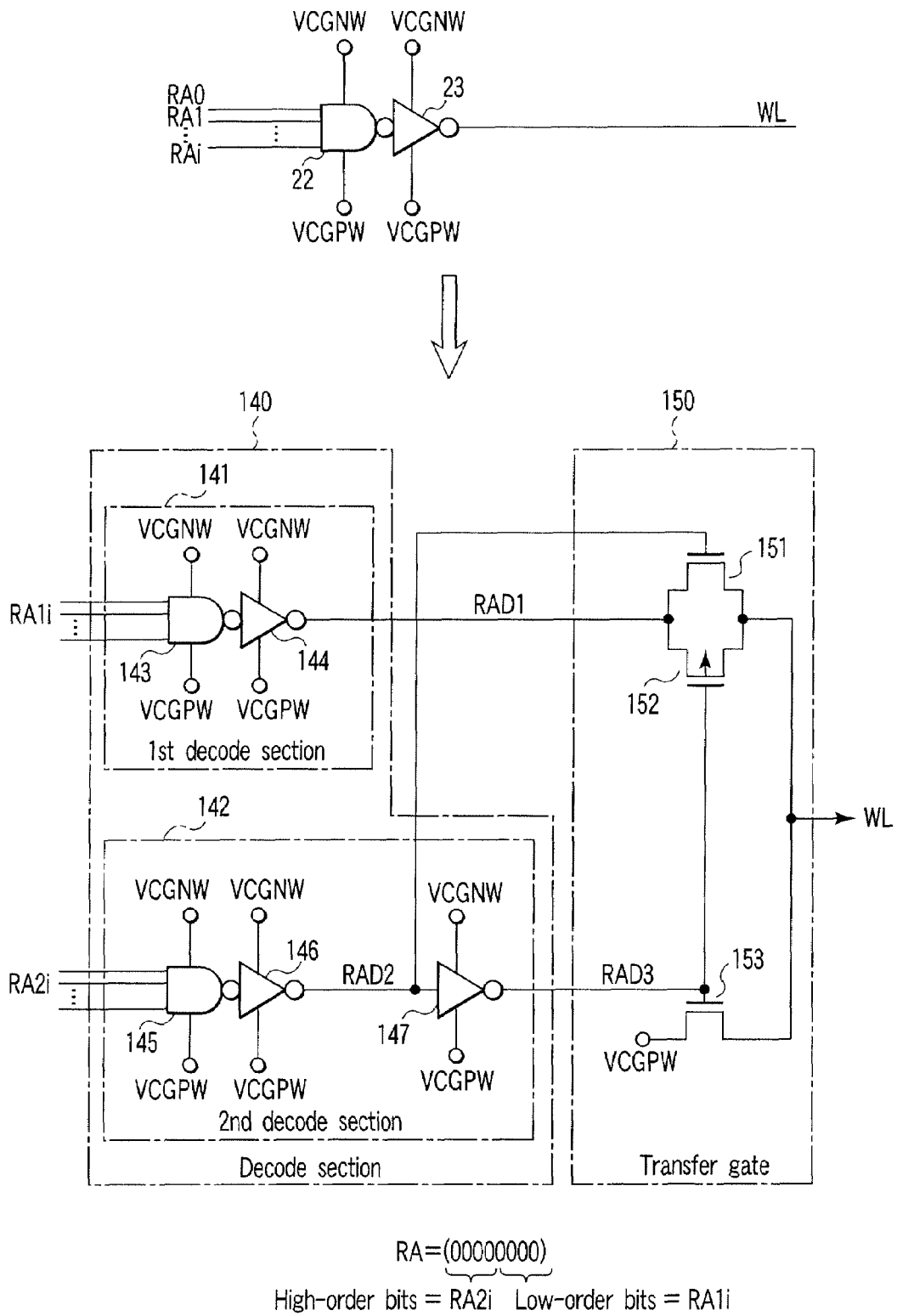
FIG. 16 is a circuit diagram of a part of the write decoder of a 2Tr flash memory according to a second embodiment of the present invention.

Next, a semiconductor memory device according to a second embodiment of the present invention will be explained. The second embodiment is such that the configuration of the write decoder 20 is modified in the first embodiment. FIG. 16 is a circuit diagram of the write decoder 20 according to the second embodiment, particularly showing the configuration corresponding to one word line.

As shown in FIG. 16, the second embodiment is such that the write decoder 20 includes a decode section 140 and a transfer gate 150.

First, the decode section 140 will be explained. The decode section 140 includes a first decodes section 141 and a second decode section 142. The first decode section 141, which decodes low-order bits RA1$i$ in a row address signal RA, includes a NAND gate 143 and an inverter 144. The NAND gate 143 and inverter 144 have their high-voltage power-supply nodes connected to VCGNW and their low-voltage power-supply nodes connected to VCGPW. Then, the NAND gate 143 performs NAND operation on low-order bits in a row address signal RA. The inverter 144 inverts the result of the NAND operation and outputs the result as a first row address decode signal RAD1.

The second decode section 142, which decodes high-order bits RA2$i$ in a row address signal RA, includes a NAND gate 145 and inverters 146, 147. The NAND gate 145 and inverters 146, 147 have their high-voltage power-supply nodes connected to VCGNW and their low-voltage power-supply nodes connected to VCGPW. Then, the NAND gate 145 performs NAND operation on high-order bits in a row address signal RA. The inverter 146 inverts the result of the NAND operation and outputs the result as a second row address decode signal RAD2. The inverter 147 inverts the second row address decode signal RAD2 and outputs the resulting signal as a third row address decode signal RAD3.

In the row address signal RA, the high-order bits RA2$i$ indicate the block address of a memory cell block used as an erase unit and the low-order bits RA1$i$ indicate a page address in the memory cell block.

Next, the transfer gate 150 will be explained. The transfer gate 150 includes n-channel MOS transistors 151, 153 and a p-channel MOS transistor 152. The first row address decode signal RAD1 is input to one end of the current path of each of the n-channel MOS transistor 151 and p-channel MOS transistor 152. The other ends of their current paths are connected to a word line WL. The second row address decode signal RAD2 and third row address decode signal RAD3 are input to the gate of the n-channel MOS transistor 151 and that of the p-channel MOS transistor 152, respectively. One end of the current path of the n-channel MOS transistor 153 is connected to VCGPW node and the other end of the current path is connected to the word line WL. The third row address decode signal RAD3 is input to its gate.

That is, the transfer gate is controlled according to the high-order bits RA2$i$ in the row address signal RA. Then, according to the way the transfer gate is controlled, the first row address decode signal RAD1 obtained at the first decode section 141 or the voltage at node VCGPW is applied to the word line WL.

Figure 17:
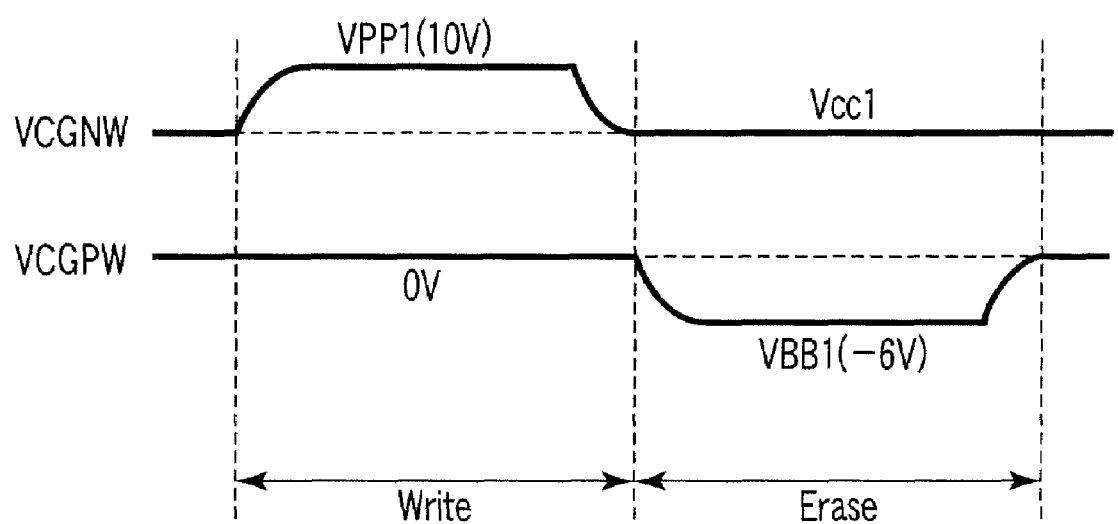
FIG. 17 is a timing chart for voltages applied to the well region of the write decoder of the 2Tr flash memory according to the second embodiment.

The voltages at VCGNW node and VCGPW node are as shown in FIG. 17. Specifically, setting is done to meet VCGNW=VPP1 and VCGPW=0V in a write operation and VCGNW=0V and VCGPW=VBB1 in an erase operation. This voltage relationship relates to the selected memory cell block. The details will be explained later.

Figure 18:
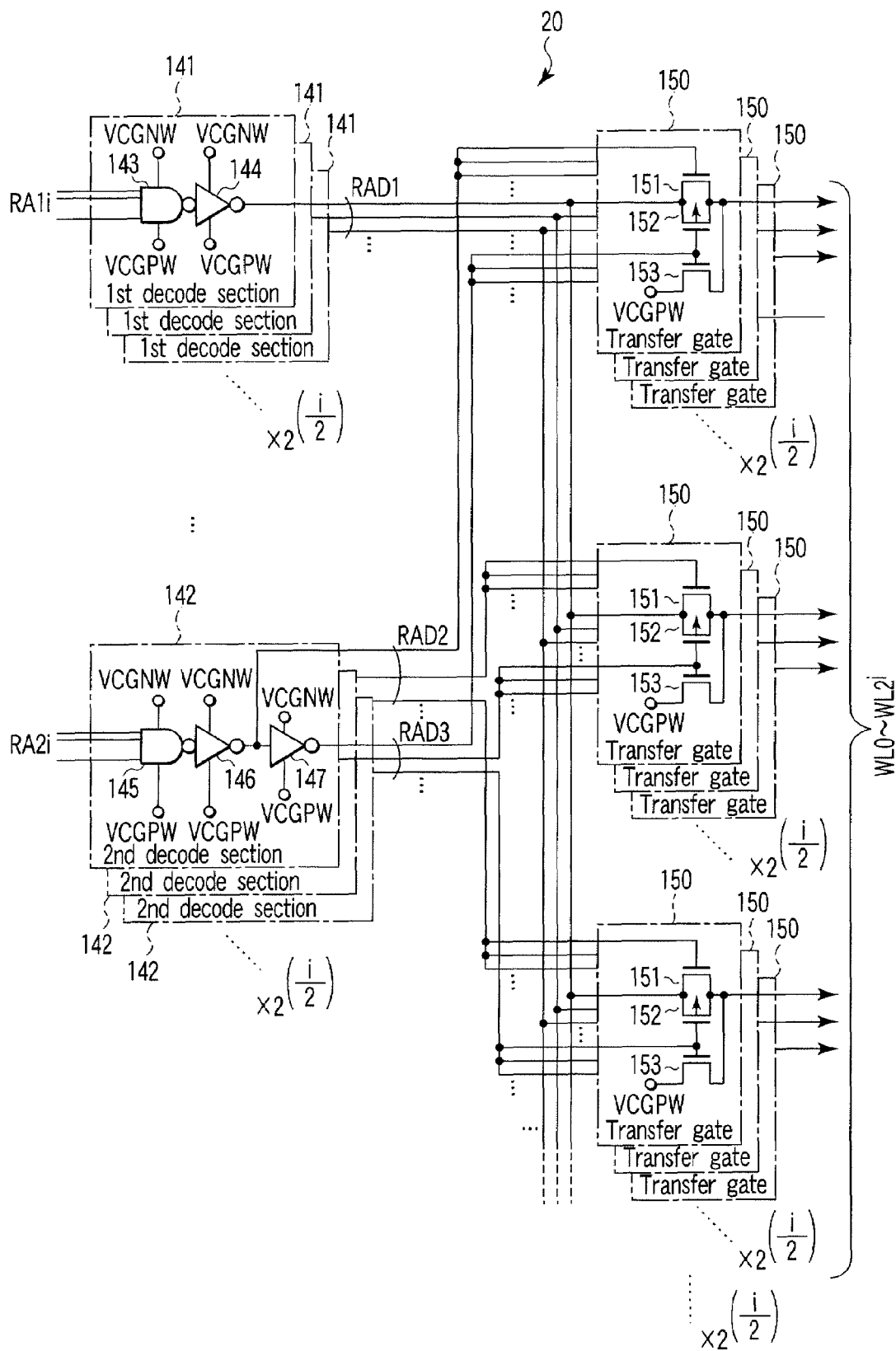
FIG. 18 is a circuit diagram of the write decoder of the 2Tr flash memory according to the second embodiment.

Next, the configuration of the write decoder 20 using the configuration of FIG. 16 will be explained by reference to FIG. 18. FIG. 18 is a circuit diagram of the write decoder 20 included in the flash memory of the second embodiment. The flash memory has the same circuit configuration as that of the first embodiment except for the configuration of the write decoder 20. The row address signal RA is assumed to be an i-bit signal.

As shown in FIG. 18, the write decoder 20 includes $2^{(i/2)}$ first and second decode sections 141, 142 and $2^i$ transfer gates 150. Then, the outputs of the $2^i$ transfer gates 150 are supplied to word lines WL0 to WL$2^i$, respectively. A transfer gate group (which is called a transfer gate unit) is made by $2^{(i/2)}$ transfer gates 150. There are provided as many transfer gate units as $2^{(i/2)}$. The same second and third row address decode signals RAD2, RAD3 are input from any one of the second decode sections 142 to the transfer gates 150 in the same transfer gate unit. The first row address decode signals RAD1 differing from one another are input from the $2^{(i/2)}$ decode sections 141 to the $2^{(i/2)}$ first transfer gates 150 in the same transfer gate unit.

Specifically, each of the $2^{(i/2)}$ transfer gate units is controlled by the second and third row address decode signals RAD2, RAD3 output from the one of the $2^{(i/2)}$ second decode sections 142. Then, the $2^{(i/2)}$ transfer gates 150 in each transfer gate unit transfer the first row address decode signals RAD1 output from the $2^{(i/2)}$ first decode sections 141, respectively.

Therefore, if the memory cells including the word lines connected to the transfer gates 150 in the same transfer gate unit are called memory cell blocks MB, the high-order bits RA2$i$ in the row address signals RA corresponding to the word lines in the same memory cell block MB are the same. That is, any one of the memory cell blocks MB is selected by the high-order bits RA2$i$ in the row address signal RA. Furthermore, any one of the word lines in the selected memory cell block MB is selected by the low-order bits RA1$i$.

FIG. 19 is a block diagram showing the way the wells are separated in the write decoder 20 of the second embodiment. Let the high-voltage power supply node of the first decode section 141 be called VCGNW(1$i$), its low-voltage power supply node be called VCGPW(1$i$), the high-voltage power supply node of the second decode section 142 be called VCGNW(2$i$), its low-voltage power supply node be called VCGPW(2$i$), the high-voltage power supply node of the transfer gate 150 be called VCGNW(TG), and its low-voltage power supply node be called VCGPW(TG). In addition, let a set of first decode sections 141 be called a first decode section group 148, a set of second decode sections 142 be called a second decode section group 149, and a set of transfer gates 150 be called a transfer gate group 154.

As shown in FIG. 19, each of the first decode section group 148, the second decode section group 149, the transfer gate group 154, and the memory cell array 10 is formed on a different well region. A voltage is applied to each of them independently. The first decode sections 148 are formed in the same well region. Specifically, each of the first decode sections 141 is formed on a common n-well region and p-well region, to which VCGNW(1$i$) and VCGPW(1$i$) are applied simultaneously. This is because the first row address decode signals RAD1 output from the first decode sections 141 are shared by a plurality of transfer gate units.

Each of the second decode sections 142 in the second decode section group 149 is formed on a different n-well region and p-well region. VCGNW(2$i$) and VCGPW(2$i$) are applied to each second decode section independently. This is because the second and third row address decode signals RAD2, RAD3 output from each of the second decode sections 142 are used only each of the transfer gate units.

Each of the transfer gates 150 in the transfer gate group 154 is formed in a different n-well region and p-well region. VCGNW(TG) and VCGPW(TG) may be applied to each transfer gate independently. Those controlled by the same second decode section 142 may be formed in the same n-well region and p-well region (or the transfer gates may be formed in the same n-well region and p-well region on a transfer gate unit basis). In addition, an n-well region and p-well region may be shared on a word-line erase block basis. The transfer gate unit basis may be the same as the erase block basis.

Figure 20:
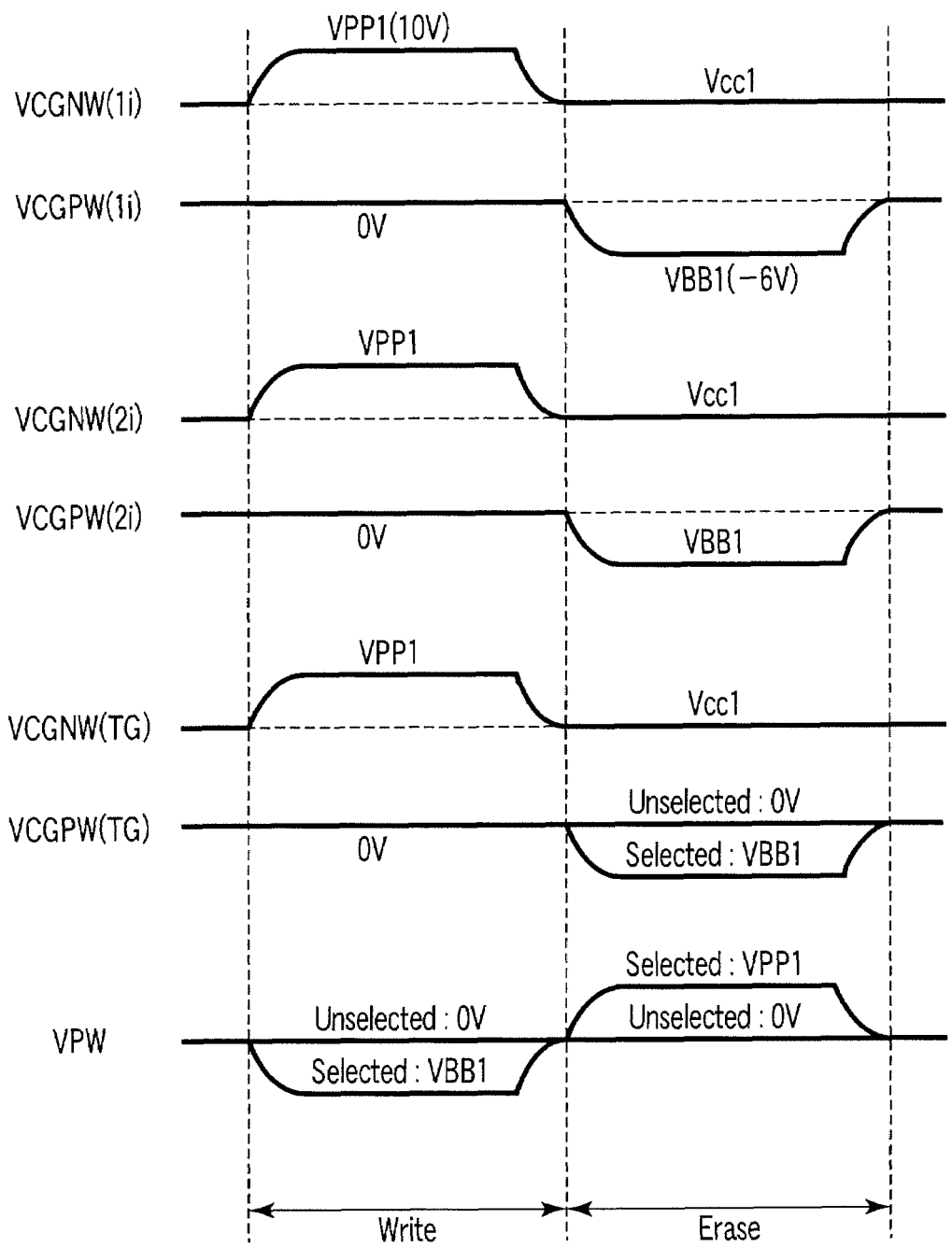
FIG. 20 is a timing chart for voltages applied to the well region of the write decoder of the 2Tr flash memory according to the second embodiment.

FIG. 20 is a timing chart for VCGNW(1$i$), VCGPW(1$i$), VCGNW(2$i$), VCGPW(2$i$), VCGNW(TG), VCGPW(TG), and VPW in a write and an erase operation.

As shown in FIG. 20, the potentials VCGNW(1$i$), VCGNW(2$i$), and VCGNW(TG) at the n-well region in the write decoder 30 are set to the positive voltage VPP1 and the potentials VCGPW(1$i$), VCGPW(2$i$), and VCGPW(TG) at the p-well region are set to 0V in a write operation. In the selected block, VPW is set to the negative potential VBB1. In the unselected blocks, VPW is set to 0V. Here, a block is a set of memory cells sharing the p-well region 202. An erase operation is carried out in blocks.

In an erase operation, VCGNW(1$i$) and VCGPW(1$i$) of the first decode section 141 are set to Vcc1 and the negative potential VBB1, respectively. VCGNW(2$i$) and VCGPW(2$i$) of the second decode section 142 are set to Vcc1 and VBB1, respectively. Furthermore, in the transfer gate group 154, VCGNW(TG) at the n-well region is set to Vcc1. In addition, VCGPW(TG) at the p-well region including the transfer gate connected to the selected word line is set to VBB1. At the p-well regions which do not include the selected word line, VCGPW(TG) is set to 0V.

Figure 21:
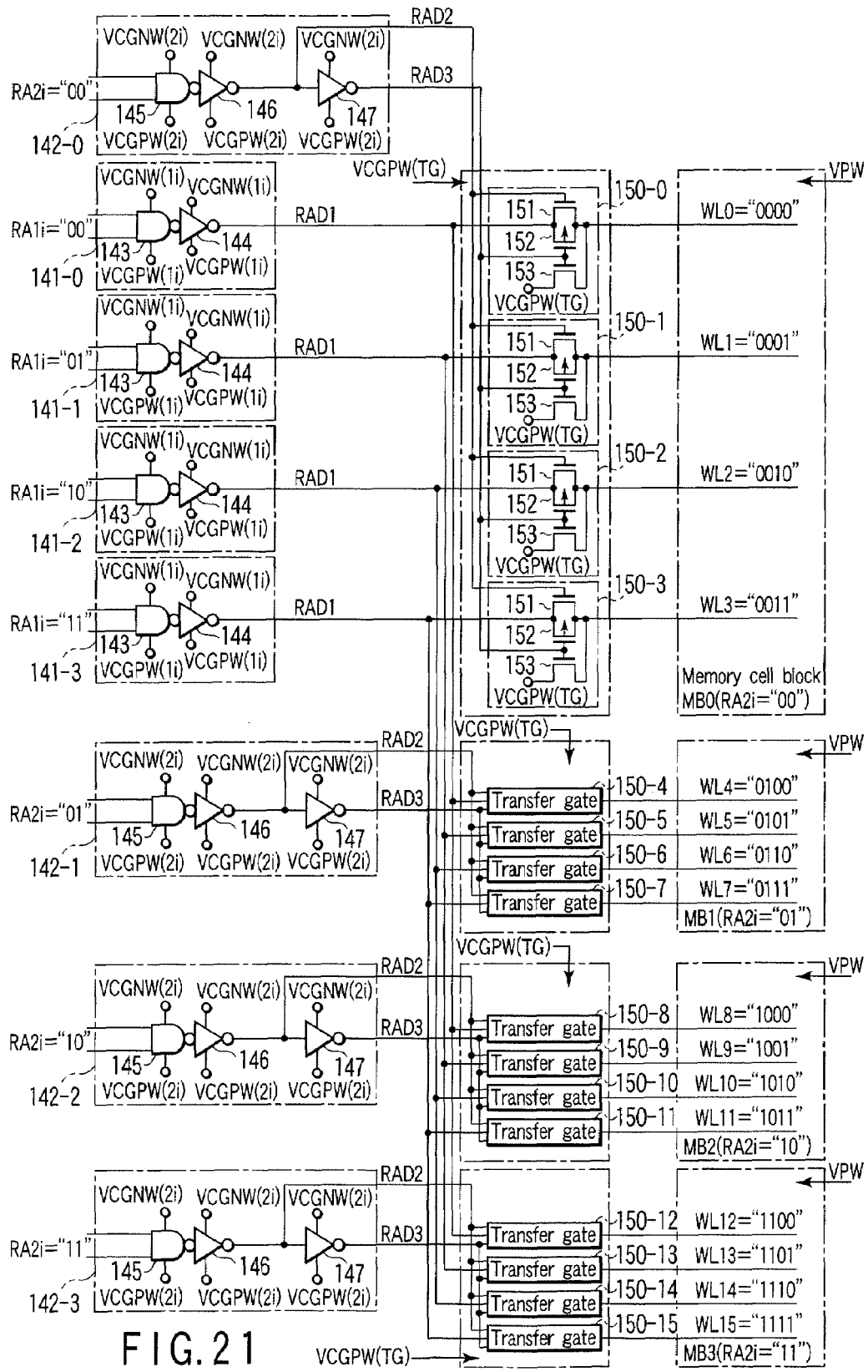
FIG. 21 is a circuit diagram of the write decoder and memory cell array of the 2Tr flash memory according to the second embodiment.

Next, the way the write decoder 20 with the above configuration carries out a write and an erase operation will be explained. Hereinafter, for the sake of simplification, it is assumed that the row address signal RA is a 4-bit signal (i=4: (R3, R2, R1, R0)), or that the number of word lines is 16. FIG. 21 is a circuit diagram of the write decoder 20.

As shown in FIG. 21, the write decoder 20 includes $2^{(i/2)}$ (=4) first decode sections 141-0 to 141-3, $2^{(i/2)}$(=4) second decode sections 142-0 to 142-3, and $2^i$(=16) transfer gates 150-0 to 150-15.

The first decode section 141-0 goes into the selected state (RAD1=high (H)), when the two low-order bits RA1$i$=(R1, R0) in the row address signal RA is "00". The first decode section 141-1 goes into the selected state (RAD1=high (H)), when the two low-order bits RA1$i$ in the row address signal RA is "01". The first decode section 141-2 goes into the selected state (RAD1=high (H)), when the two low-order bits RA1$i$ in the row address signal RA is "10". The first decode section 141-3 goes into the selected state (RAD1=high (H)), when the two low-order bits RA1$i$ in the row address signal RA is "11".

The second decode section 142-0 goes into the selected state (RAD2=high (H), RAD3=low (L)), when the two high-order bits RA2$i$=(R3, R2) in the row address signal RA is "00". The second decode section 142-1 goes into the selected state (RAD2=high (H), RAD3=low (L)), when the two high-order bits RA2$i$ in the row address signal RA is "01". The second decode section 142-2 goes into the selected state (RAD2=high (H), RAD3=low (L)), when the two high-order bits RA2$i$ in the row address signal RA is "10". The second decode section 142-3 goes into the selected state (RAD2=high (H), RAD3=low (L)), when the two high-order bits RA2$i$ in the row address signal RA is "11".

The transfer gates 150-0 to 150-3 are controlled by the second decode section 142-0. The transfer gates 150-4 to 150-7 are controlled by the second decode section 142-1. The transfer gates 150-8 to 150-11 are controlled by the second decode section 142-2. The transfer gates 150-12 to 150-15 are controlled by the second decode section 142-3. That is, each of a set of transfer gates 150-0 to 150-3, a set of transfer gates 150-4 to 150-7, a set of transfer gates 150-8 to 150-11, and a set of transfer gates 150-12 to 150-15 makes a transfer gate unit. The output signals from the first decode sections 141-0 to 141-3 are input to the four transfer gates, respectively, included in a transfer gate unit. Specifically, the first row address decode signal RAD1 output from the first decode section 141-0 is input to the transfer gates 150-0, 150-4, 150-8, 150-12. The first row address decode signal RAD1 output from the first decode section 141-1 is input to the transfer gates 150-1, 150-5, 150-9, 150-13. The first row address decode signal RAD1 output from the first decode section 141-2 is input to the transfer gates 150-2, 150-6, 150-10, 150-14. The first row address decode signal RAD1 output from the first decode section 141-3 is input to the transfer gates 150-3, 150-7, 150-11, 150-15.

Then, the outputs of the transfer gates 150-0 to 150-15 are connected to word lines WL0 to WL15, respectively. Therefore, the row addresses RA of word lines WL0 to WL15 are "0000" to "1111". A set of word lines WL0 to WL3, a set of word lines WL4 to WL7, a set of word lines WL8 to WL11, and a set of word lines WL12 to WL15 make memory cell blocks MB0 to MB3, respectively. The high-order bits RA2$i$ in the memory cell blocks MB0 to MB3 are "00", "01", "10", and "11", respectively.

The memory cell blocks MB0 to MB3 share the p-well region 202. The data is erased from in memory cell blocks. The well regions where transfer gates are formed are shared on a memory cell block basis. Specifically, a set of transfer gates 150-0 to 150-3, a set of transfer gates 150-4 to 150-7, a set of transfer gates 150-8 to 150-11, and a set of transfer gates 150-12 to 150-15 are each formed on a different n-well region and p-well region.

<Write Operation>

A write operation will be explained by reference to FIG. 22. Hereinafter, a case where the memory cell connected to word line WL0 is written into will be explained as an example. FIG. 22 is a circuit diagram of the write decoder 20 in a write operation.

Before a write operation, VCGNW(1$i$), all VCGNW(2$i$), and all VCGNW(TG) are set to the positive potential VPP1 (10V) and VCGPW(1$i$), all VCGPW(2$i$), and all VCGPW (TG) are set to 0V.

To select word line WL0, the address buffer supplies the row address signal RA="0000" corresponding to word line WL0 to the write decoder 20. Then, the low-order bits RA1$i$="00" in the row address signal RA are supplied to the first decode sections 141-0 to 141-3 and the high-order bits RA2$i$="00" are supplied to the second decode sections 142-0 to 142-3.

Then, the output RAD1 of the first decode section 141-0 goes to the high (H) level (VCGNW(1$i$)=VPP1) and the outputs of the other first decode sections 141-1 to 141-3 go to the low (L) level (VCGPW(1$i$)=0V).

In addition, the output RAD2 of the second decode section 142-0 goes to the high (H) level (VCGNW(2$i$)=VPP1) and the output RAD3 goes to the low (L) level (VCGPW(2$i$)=0V). The outputs RAD2 of the other second decode sections 142-1 to 142-3 go to the low (L) level (VCGPW(2$i$)=0V) and the outputs RAD3 go to the high (H) level (VCGNW(2$i$)=VPP1).

Then, in the transfer gate 150-0, the n-channel MOS transistor 151 is cut off. Moreover, the n-channel MOS transistor 153 goes into the off state and the p-channel MOS transistor 152 goes into the on state. Therefore, VPP1 applied from the first decode section 141-0 is applied to word line WL0 via the current path of the MOS transistor 152.

In the transfer gate 150-1, the n-channel MOS transistor 151 goes into the on state, the p-channel MOS transistor 152 and n-channel MOS transistor 153 go into the off state. Therefore, 0V applied from the first decode section 141-1 is applied to word line WL1 via the current path of the MOS transistor 151. The same holds true for the transfer gates 150-2 and 150-3. That is, 0V applied from the first decode sections 142-2 and 141-3 are applied to word lines WL2 and WL3 respectively via the current path of the MOS transistor 151.

In the transfer gates 150-4 to 150-15 controlled by the second decode sections 142-1 to 142-3 made unselected, the MOS transistors 151, 152 go into the off state and the MOS transistor 153 goes into the on state. Therefore, 0V at VCGPW(TG) node is applied to word lines WL4 to WL15 via the current paths of the MOS transistors 153.

As a result, the positive voltage VPP1 is applied to word line WL0 and 0V is applied to word lines WL1 to WL15.

<Erase Operation>

Next, an erase operation will be explained by reference to FIG. 23. A case where the memory cells connected to word lines WL0 to WL3, that is, memory cell block MB0, are erased from will be explained as an example. FIG. 23 is a circuit diagram of the write decoder 20 in an erase operation.

Before an erase operation, VCGNW(1$i$) node and VCGPW(1$i$) node in each of the first decode sections 141-0 to 141-3 are set to Vcc1 and VBB1, respectively. In addition, to erase the data from memory cell block MB0, VCGNW(TG) node and VCGPW(TG) node in each of the transfer gates 150-0 to 150-3 are set to Vcc1 and VBB1, respectively. Moreover, VCGNW(2$i$) node and VCGPW(2$i$) node in each of the second decode sections 142-0 to 142-3 are set to Vcc1 and VBB1, respectively. Furthermore, VCGNW(TG) node and VCGPW(TG) node in each of the transfer gates 150-4 to 150-15 corresponding to the unselected blocks MB1 to MB3 are set to Vcc1 and 0V, respectively.

Then, to select memory cell block MB0, the high-order bits RAi in the row address signal are set to "00". Therefore, the output RAD2 of the second decode section 142-0 goes to the high (H) level (VCGNW(2$i$)=Vcc1) and the output RAD3 goes to the low (L) level (VCGPW(2$i$)=VBB1). In addition, the outputs RAD2 of the other second decode sections 142-1 to 142-3 go to the low (L) level (VCGPW(2$i$)=VBB1) and the outputs RAD2 go to the high (H) level (VCGNW(2$i$)=Vcc1).

The low-order bits RAi representing a page address may be any signal. In an erase operation, all of the first decode section 141-0 to 141-3 are unselected and all of the outputs RAD1 go to the low (L) level (VCGPW(1$i$)=VBB1).

Then, in the transfer gate 150-0 corresponding to the selected block MB0, the n-channel MOS transistor 151 is turned on and the n-channel MOS transistor 153 and p-channel MOS transistor 152 are turned off. Therefore, VBB1 supplied from the first decode section 141-0 is applied to word line WL0 via the current path of the MOS transistor 151. The same holds true for the transfer gates 150-1 to 150-3 controlled by the second decode section 142-0. Specifically, VBB1 supplied from the first decode sections 141-1 to 141-3 is applied to word lines WL1 to WL3 via the current paths of the MOS transistors 151.

In the transfer gates 150-4 to 150-15 corresponding to the unselected blocks MB1 to MB3, the n-channel MOS transistor 151 and p-channel MOS transistor 152 are turned off and the n-channel MOS transistor 153 is turned on. Therefore, VCGPW(TG)=0V is applied to word lines WL4 to WL15 via the MOS transistors 153 of the transfer gates 150-4 to 150-15, respectively.

As a result, the negative potential VBB1 is applied to all of the word lines WL0 to WL3 in the selected memory cell block MB0 and 0V is applied to all of the word lines WL4 to WL15 in the unselected memory cell blocks MB1 to MB3.

As described above, the flash memory of the second embodiment produces not only the effects in item (1) to item (4) explained in the first embodiment but also the effect described below in item (5).

(5) The size of the write decoder can be made smaller.

In the write decoder of the second embodiment, the low-order bits RA1$i$ representing a page address and the high-order bits RA2$i$ representing a block address in a row address signal are decoded by separate decoders. The transfer gates are controlled according to the result of decoding the block address, thereby transferring the result of decoding the page address to a word line. Therefore, $2^{(i/2)}$ decode circuits are required for page addresses and the same number of decode circuits are also needed for block addresses.

For example, consider a case where an 8-bit row address signal is decoded. Since the 8-bit row address signal is capable of representing 256 addresses, when a row decoder is designed ordinarily, 256 decode circuits are needed as shown in FIG. 24. A decode circuit (or AND circuit) is generally made using two 4-input NAND gates and one 2-input NOR gate. Since eight MOS transistors are needed to form a 4-input NAND gate and four MOS transistors are required to form a 2-input NOR gate, as many MOS transistors as (8×2+4)=20 are needed to form one decode circuit. Therefore, a total of (20×256=) 5120 MOS transistors are required. Moreover, these MOS transistors are high-withstand-voltage MOS transistors capable of withstanding VPP1 and VBB1.

Figure 25:
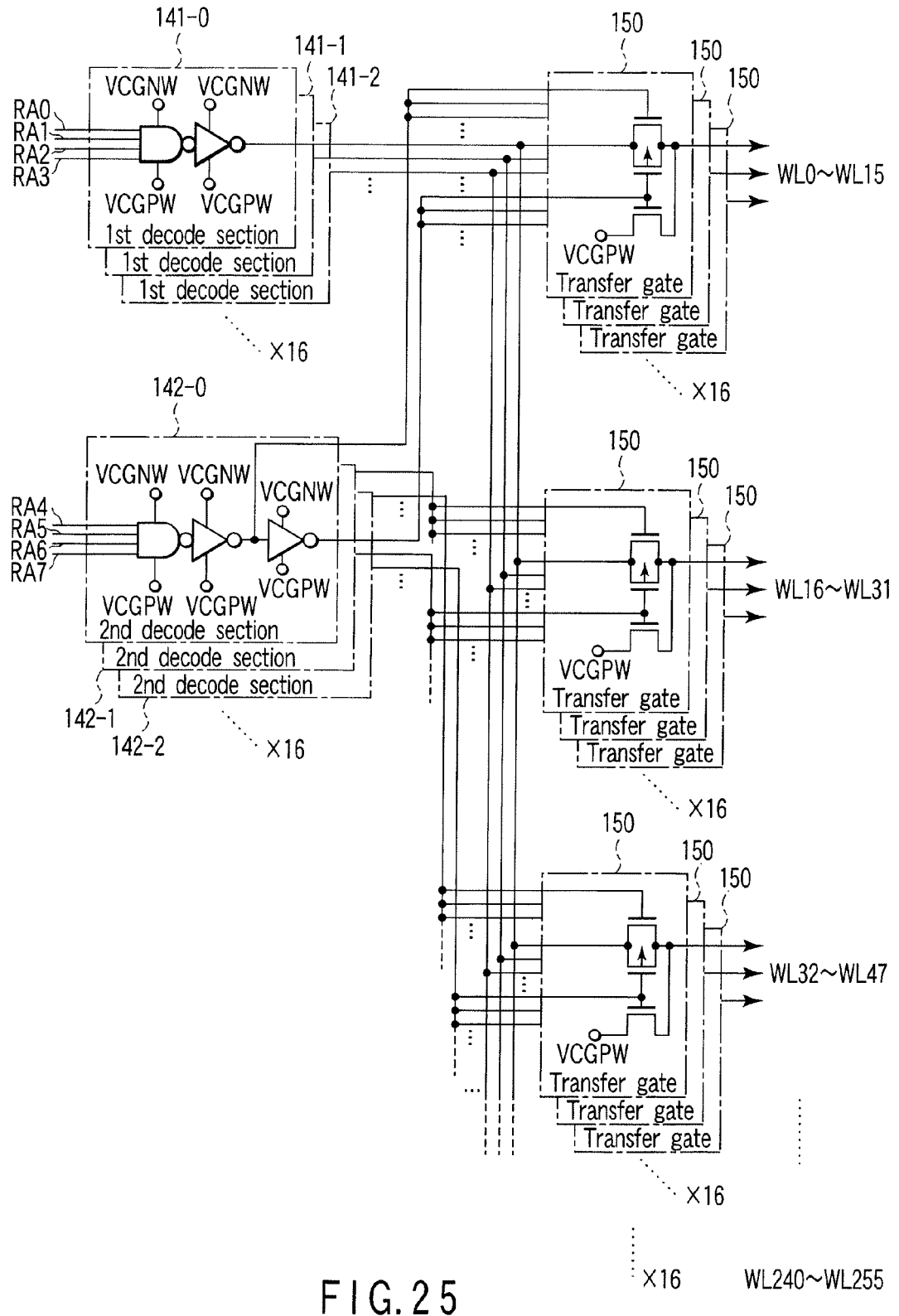
FIG. 25 is a circuit diagram of the write decoder of the 2Tr flash memory according to the second embodiment.

However, with the configuration of the second embodiment, the first decode sections that decode page addresses can be shared by the memory cell blocks as shown in FIG. 25. In addition, the second decode sections that decode block addresses can be shared on a memory cell basis. Therefore, although the transfer gates 150 have to be provided for the word lines in a one-to-one correspondence, only 16 first decode section and 16 second decode sections are needed. As a result, the number of MOS transistors required for the write decoder 20 is 256×3+12×16+10×16=120 in total. That is, as compared with the case of FIG. 24, as much as 78% of the area can be reduced.

Furthermore, since the number of high-withstand-voltage MOS transistors can be decreased, the load on the step-up circuit in the voltage generator 130 can be reduced, which enables the voltage generator 230 to be made smaller.

Figure 26:
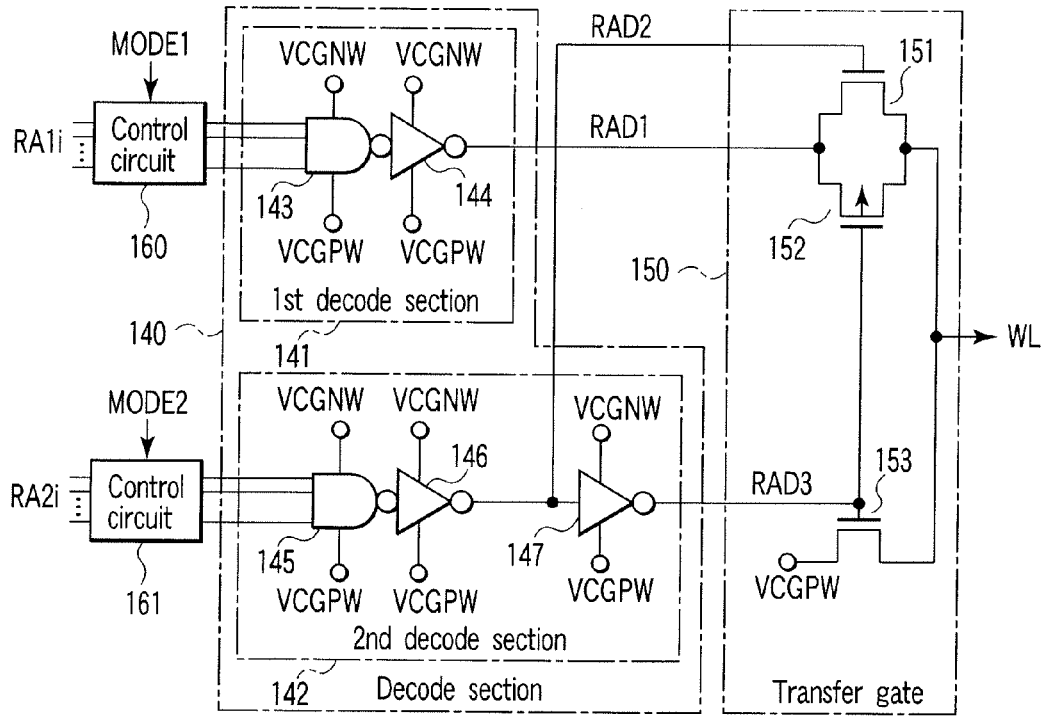
FIG. 26 is a circuit diagram of a part of the write decoder of a 2Tr flash memory according to a third embodiment of the present invention.

Next, a semiconductor memory device according to a third embodiment of the present invention will be explained. The third embodiment is such that the configuration of the write decoder 20 is further modified in the second embodiment. FIG. 26 is a circuit diagram of the write decoder 20 according to the third embodiment, which particularly shows the configuration corresponding to one word line.

As shown in FIG. 26, the write decoder 20 of the third embodiment further includes control circuits 160 and 161 in the configuration explained in the second embodiment. The control circuits 160, 161 are controlled by mode signals MODE1, MODE2, respectively. The mode signals MODE1, MODE2 are signals which indicate a write mode, an erase mode, and a read mode. The control circuit 160 controls the first decode section 141 in an erase and a read operation so as to cause the output signal RAD1 of the first decode section 141 to go to the high (H) level. The control circuit 161 controls the second decode section 142 in an erase and a read operation so as to cause the output signal RAD2 of the second decode section 142 to go to the low (H) level.

Figure 27:
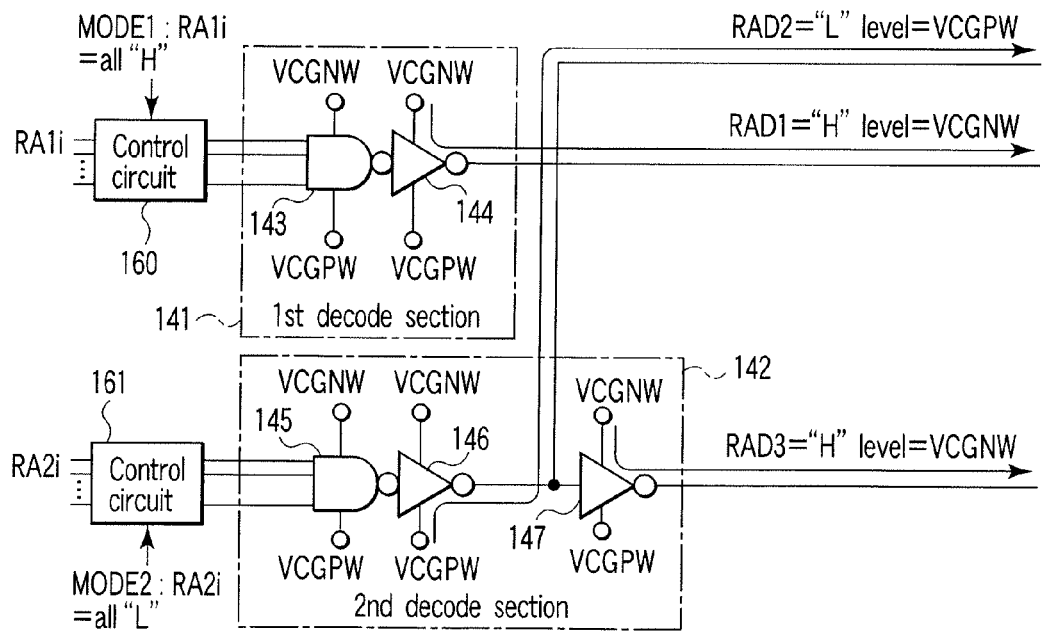
FIG. 27 is a circuit diagram of a part of the write decoder of the 2Tr flash memory according to the third embodiment, which helps explain an erase and a read operation.

More specifically, as shown in FIG. 27, the control circuit 160 converts all of the low-order bits RA1$i$ in a row address signal RA into "1" in an erase and a read operation. The control circuit 161 converts all of the high-order bits RA2$i$ in a row address signal RA into "0" in an erase and a read operation.

Figure 28:
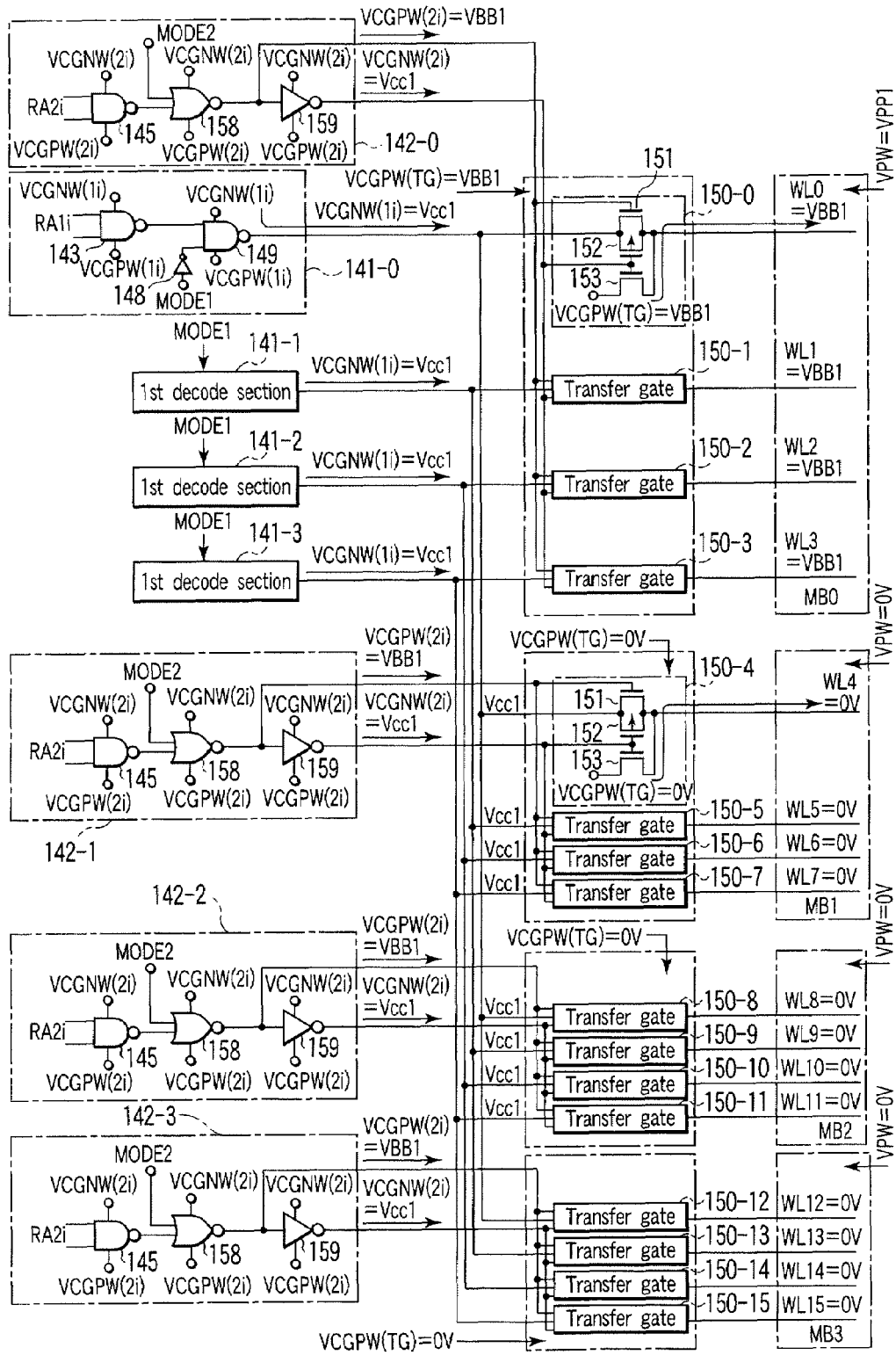
FIG. 28 is a circuit diagram of the memory cell array and write decoder in an erase operation of the 2Tr flash memory according to the third embodiment.

Next, the erase operation of the write decoder 20 of the third embodiment will be explained by reference to FIG. 28. FIG. 28 is a circuit diagram of the write decoder. In FIG. 28, the control circuits 160, 161 are incorporated into the first decode section 140 and the second decode section 141, respectively. As a result, the first and second decode sections have the following configuration.

First, the first decode section will be explained. As shown in FIG. 28, in each of the first decode sections 141-0 to 141-3, an inverter 148 and a NAND gate 149 are used instead of the inverter 144. The inverter 148 inverts the mode signal MODE1. The NAND gate 149 performs NAND operation on the output of the NAND gate 143 and the output of the inverter 148. Then, the output signal of the NAND gate 149 makes the output RAD1. In an erase operation, RAD1 is forced to go to the high (H) level (VCGNW=Vcc1) by the mode signal MODE1.

Next, the second decode section will be explained. As shown in FIG. 28, in each of the second decode sections 142-0 to 142-3, a NOR gate 158 and an inverter 159 are used instead of the inverters 146, 147. The NOR gate 158 performs NOR operation on the output of the NAND gate 145 and the mode signal MODE2. The result of the NOR operation makes the output RAD2. The inverter 159 inverts the result of the NOR operation, producing the output RAD3. In an erase operation, the mode signal MODE2 forces RAD2 and RAD3 to go to the low (L) level (VCGPW=VBB1) and to the high (H) level (VCGNW=Vcc1) respectively.

Hereinafter, an erase operation will be explained by reference to FIG. 28. Since a write operation is the same as in the second embodiment, its explanation will be omitted. Hereinafter, a case where the memory cells connected to word lines WL0 to WL3, that is, memory cell block MB0, are erased from will be explained as an example.

The voltage at the well region in the write decoder 20 is the same as in the second embodiment. Then, not only is the row address signal RA input to the write decoder 20, but also the mode signals MODE1, MODE2 are input to the control circuits 160, 161, respectively.

As a result, all of the outputs RAD1 of the first decode sections 141-0 to 141-3 go to the high (H) level (VCGNW (1i)=Vcc1). The outputs RAD2 of the second decode sections 142-0 to 142-3 go to the low (L) level and the outputs RAD3 go to the high (H) level.

Accordingly, in each of the transfer gates 150-0 to 150-15, the n-channel MOS transistor 151 and p-channel MOS transistor 152 are turned off and the p-channel MOS transistor 153 is turned on. As a result, in each of the transfer gates 150-0 to 150-3 corresponding to the selected block MB0, VCGPW (TG) (=VBB1) is applied to word lines WL0 to WL3 via the current paths of the MOS transistors 153.

On the other hand, in each of the transfer gates 150-4 to 150-15 corresponding to the unselected blocks MB1 to MB3, VCGPW(TG) (=0V) is applied to word lines WL4 to WL15 via the current paths of the MOS transistors 153.

As described above, the flash memory of the third embodiment produces not only the effects in item (1) to item (5) explained in the first and second embodiments but also the effect explained below in item (6).

(6) The operation reliability of the write decoder can be improved.

The write decoder of the third embodiment performs control in such a manner that the output of the first decode section 141 goes to the high (H) level, that is, the output is prevented from being at a negative potential, by fixing all of the low-order bits RA1i representing a page address in a row address signal RA to the same value in an erase and a read operation. In addition, the write decoder performs control in such a manner that the signal RAD1 is prevented from being transferred to the word line in the transfer gate 150 by fixing all of the high-order bits RA2i representing a block address to the same value. At this time, the low-order bits RA1i and the high-order bits RA2i are caused to have complementary values ("0" and "1"). Moreover, the signal RAD1 and the signal RAD2 are caused to have complementary values (high (H) level and low (L) level). Then, a voltage is transferred to the word line via the MOS transistor 153 in the transfer gate, regardless of whether the transfer gate corresponds to the selected block.

With the above configuration, in an erase operation, the negative voltage signal RAD1 can be prevented from being applied to the transfer gates corresponding to the unselected blocks. The potential VCGPW(TG) at the p-well regions of the transfer gates corresponding to the unselected blocks are 0V. Therefore, when the negative voltage (VBB1) signal RAD1 is applied to the MOS transistor 151, a forward bias occurs at the p-n junction between the drain region of the MOS transistor 151 and p-well region, which can make a through path between the two regions.

However, with the configuration of the third embodiment, the signal RAD1 unconditionally goes to the high (H) level, that is, a voltage equal to or higher than 0V. Therefore, it is possible to prevent a through path from being made in the MOS transistors 151 of the transfer gates corresponding to the unselected blocks, which improves the operation reliability of the write decoder.

Furthermore, when the decode circuit is configured as shown in FIG. 28, the number of necessary MOS transistors is $(8+4+2+4) \times 16+(8+2) \times 16+3 \times 256=1216$, since a NAND gate includes eight transistors, an inverter includes two transistors, and a NOR gate includes four transistors. Consequently, the number of elements can be reduced remarkably as compared with 5120 transistors used in a conventional equivalent.

Figure 29:
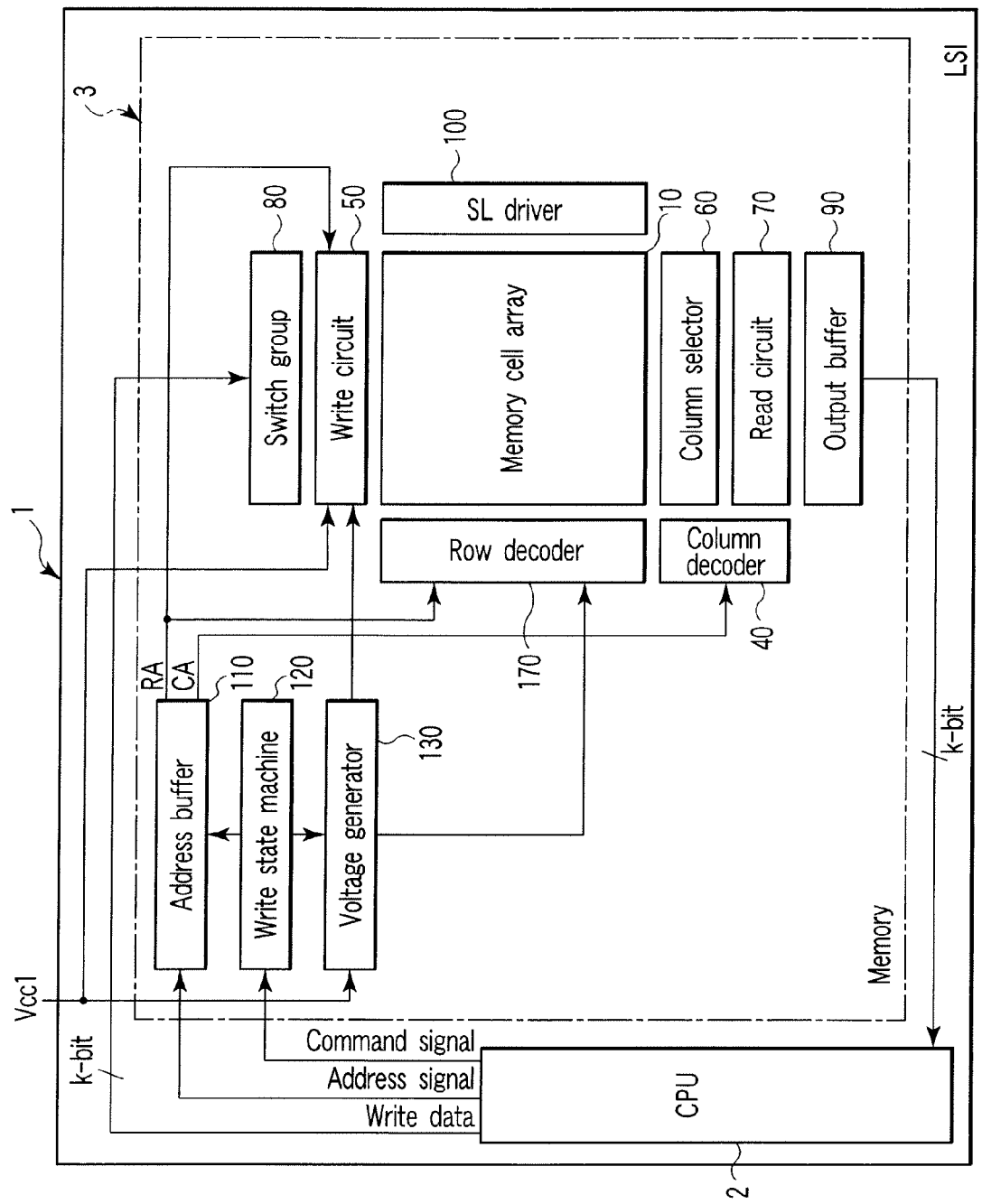
FIG. 29 is a block diagram of a system LSI according to a fourth embodiment of the present invention.

Next, a semiconductor memory device according to a fourth embodiment of the present invention will be explained by reference to FIG. 29. FIG. 29 is a block diagram of a system LSI according to the fourth embodiment. The fourth embodiment is such that the second embodiment is applied to a 3Tr-NAND flash memory. Hereinafter, only what differs from the second embodiment will be explained.

As shown in FIG. 29, the system LSI of the fourth embodiment is such that a row decoder 170 is provided instead of the write decoder 20 and select gate decoder 30 in the configuration of FIG. 1 explained in the first embodiment.

Figure 30:
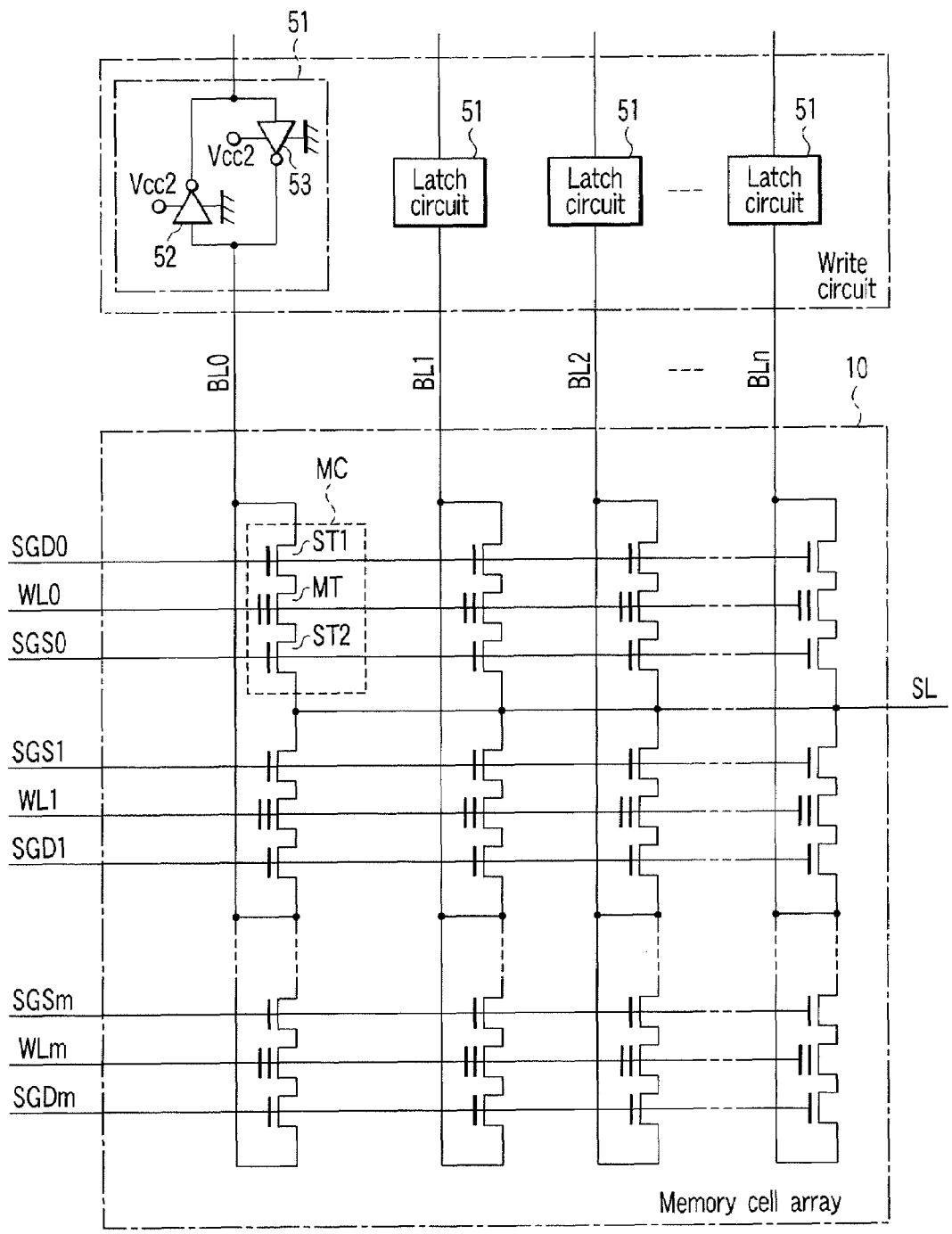
FIG. 30 is a circuit diagram of the memory cell array and write circuit of a 3Tr-NAND flash memory according to the fourth embodiment.

FIG. 30 is a circuit diagram of the memory cell array 10 and write circuit 50. As shown in FIG. 30, the memory cell array 10 has $(m+1) \times (n+1)$ memory cells MC arranged in a matrix.

Each of the memory cell MCs includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate on a semiconductor substrate with a gate insulating film interposed therebetween and a control gate on the floating gate with an inter-gate insulating film interposed therebetween. Each of the select transistors ST1, ST2 has a multilayer gate structure that includes a first polysilicon layer on the semiconductor substrate with a gate insulating film interposed therebetween and a second polysilicon layer on the first polysilicon layer with an inter-gate insulating film interposed therebetween. The source region of the select transistor ST1 is connected to the drain region of the memory cell transistor MT. The source region of the memory cell transistor MT is connected to the drain region of the select transistor ST2. Memory cells adjoining each other in the column direction share the drain region of the select transistor ST1 or the source region of the select transistor ST2.

The control gates of the memory cell transistors MT of the memory cells MC in a same row are connected commonly to any one of the word lines WL0 to WLm. The gates of the select transistors ST1 of the memory cells MC in a same row are connected commonly to any one of select gate lines SGD0 to SGDm. The gates of the select transistors ST2 of the memory cell MC in a same row are connected commonly to any one of select gate lines SGS0 to SGSm. The drain regions of the select transistors ST1 of the memory cell MCs in a same column are connected commonly to any one of bit lines BL0 to BLn.

Bit lines BL0 to BLn are connected to the corresponding latch circuits 51, respectively. Moreover, bit lines BL0 to BLn are connected to the select units (not shown) of the column selector 60. The source regions of the select transistors ST2 of the memory cells MC are connected equally to a source line SL and further connected to the commonly line driver 100.

The voltage generator 130 generates a plurality of internal voltages on the basis of the voltage Vcc1 externally input. The voltage generator, which includes a positive charge pump circuit, generates positive voltages VPP2 (e.g., 18V) and VPP3 (e.g., 4.5V).

The row decoder 170 decodes a row address signal, thereby producing a row address decode signal. Then, the row decoder selects a word line and a select gate line.

Figure 31:
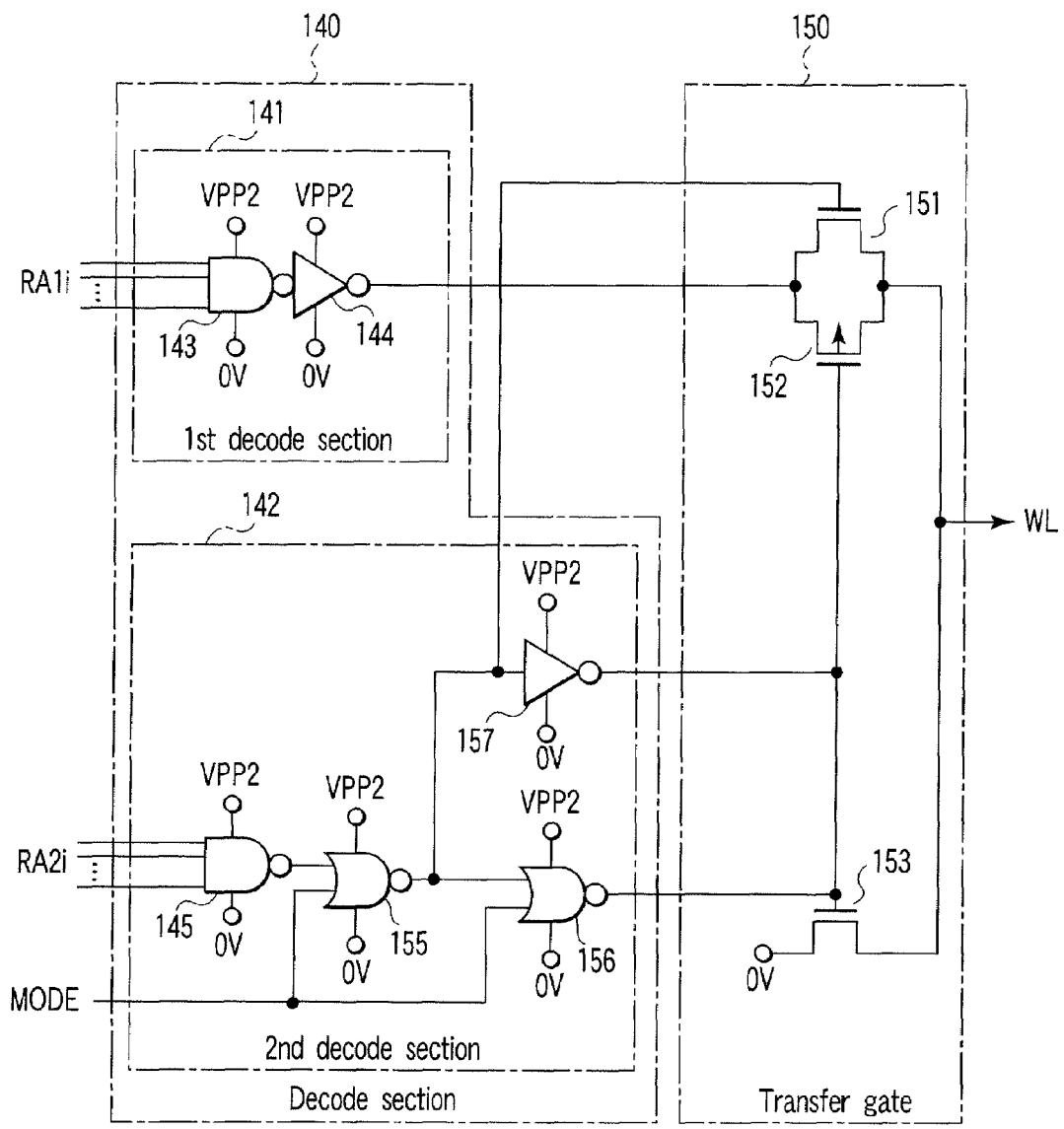
FIG. 31 is a circuit diagram of a part of the row decoder of the 3Tr-NAND flash memory according to the fourth embodiment.

FIG. 31 is a circuit diagram of a part of the row decoder 170, which particularly shows the configuration corresponding to one word line. As shown in FIG. 31, the configuration of the row decoder 170 related to the selection of a word line WL is such that the configuration of the second decode section is modified in the configuration of FIG. 16 explained in the second embodiment. Specifically, NOR gates 155, 156 and an inverter 157 are used instead of the inverters 146, 147. The NOR gate 155 performs NOR operation on the output of the NAND gate 145 and the mode signal MODE. The NOR gate 156 performs NOR operation on the output of the NOR gate 155 and the mode signal MODE. The inverter 157 inverts the output of the NOR gate 155. Then, the output of the NOR gate 155 is input to the gate of the MOS transistor 151 of the transfer gate. The output of the inverter 157 is input to the gate of the MOS transistor 152. The output of the NOR gate 156 is input to the gate of the MOS transistor 153. In an erase operation, the mode signal MODE related to the unselected word lines is set to the high (H) level. Therefore, in an erase operation, all of the MOS transistors 151 to 153 in the transfer gates 150 corresponding to the unselected word lines are turned off.

Figure 32:
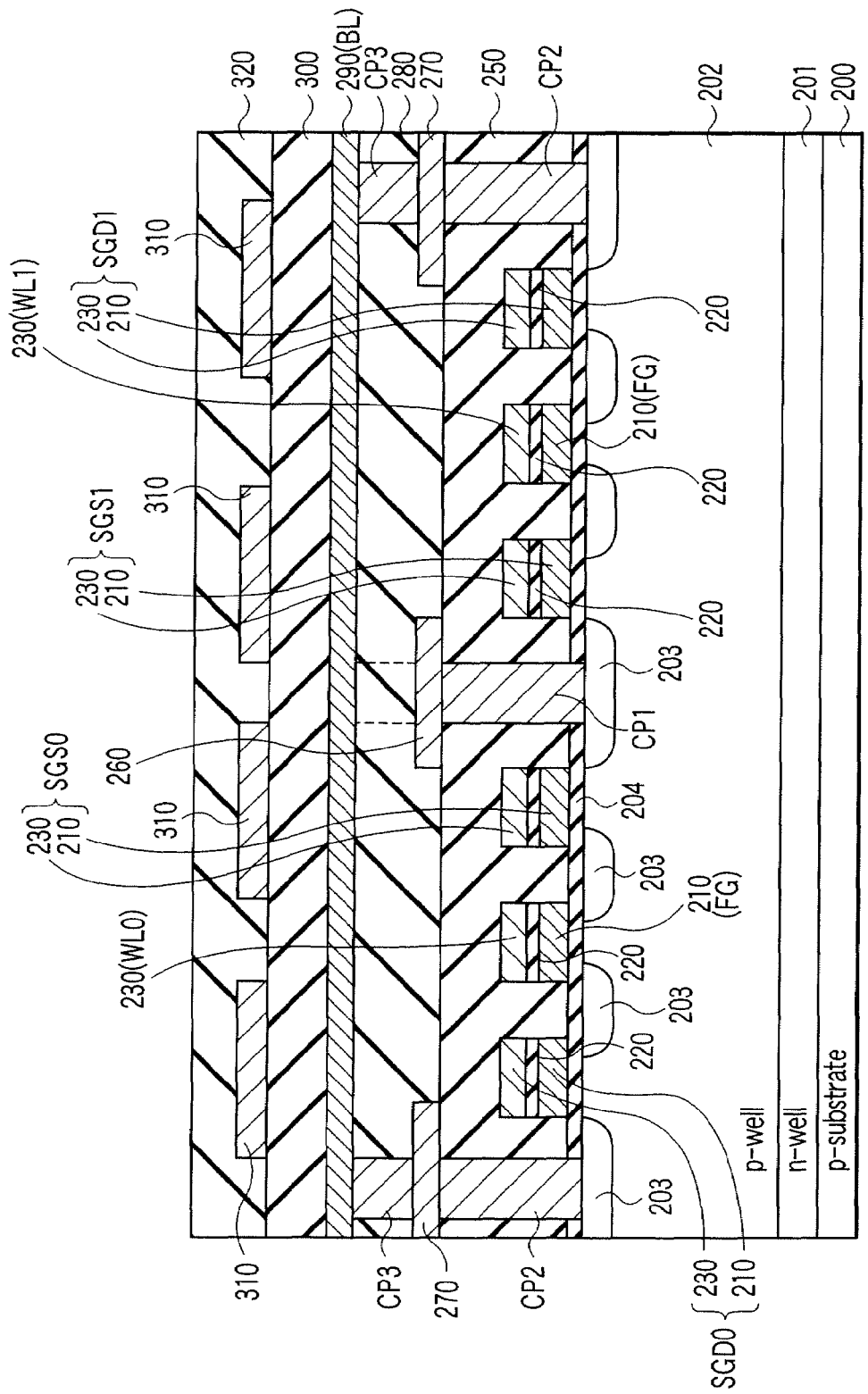
FIG. 32 is a sectional view, taken along a bit line, of the memory cell array of the 3Tr-NAND flash memory according to the fourth embodiment.

Next, a sectional structure of the memory cell array 10 configured as described above will be explained by reference to FIG. 32. FIG. 32 is a sectional view of the memory cell array 10 taken along a bit line. As shown in FIG. 32, at the surface of the p-type semiconductor substrate 200, an n-well region 201 is formed. At the surface of the n-well region 201, a p-well region 202 is formed. On the p-well region, the gate electrodes of a memory cell transistor MT and select transistors ST1, ST2 are formed with a gate insulating film 204 interposed therebetween. Each of the gate electrodes of the memory cell transistor MT and select transistors ST1, ST2 has a polysilicon layer 210 formed on the gate insulating film 204, an inter-gate insulating film 220 formed on the polysilicon layer 210, and a polysilicon layer 230 formed on the inter-gate insulating film 220 as in the first embodiment.

In the memory cell transistor MT, the polysilicon layers 210, which are isolated from one another between adjacent element regions AA along the word line, function as floating gates. The polysilicon layers 230 function as control gates (or word lines WL) and are connected to each other between adjacent element regions AA.

In each of the select transistors ST1, ST2, the polysilicon layers 210, 230, are connected to each other between adjacent element regions AA, function as select gate lines SGS, SGD, respectively. The polysilicon layers 230 of the select transistors ST1, ST2 are put in an electrically floating state as described in the first embodiment. Therefore, it is only the polysilicon layers 210 that practically function as select gate lines SGS, SGD.

Then, at the surface of the p-well region 202 located between adjacent gate electrodes, an impurity diffused layer 203 is formed. The impurity diffused layer 203 is shared by adjacent transistors.

As described above, memory cells MC including memory cell transistors MT and select transistors ST are formed so as to have the following relationship. Adjacent memory cells MC, MC have their select transistors ST1 adjoining each other and their select transistors ST2 adjoining each other. The adjoining ones share an impurity diffused layer 203.

On the p-well region 202, an interlayer insulating film 250 is formed so as to cover the memory cell transistor MT and select transistor ST. In the interlayer insulating film 250, a contact plug CP1 reaching the impurity diffused layer (or source region) 203 shared by two select transistors ST2, ST2 is formed. On the interlayer insulating film 250, a metal wiring layer 260 connected to the contact plug CP1 is formed. The metal wiring layer 260 functions as a source line SL. Further in the interlayer film 250, a contact plug CP2 reaching the impurity diffused layer (or drain region) 203 shared by two select transistors ST2, ST2 is formed. On the interlayer insulating film 250, a metal wiring layer 270 connected to the contact plug CP2 is formed.

On the interlayer insulating film 250, an interlayer insulating film 280 is formed so as to cover the metal wiring layers 260, 270. In the interlayer insulating film 280, a contact plug CP3 reaching the metal wiring layer 270 is formed. On the interlayer insulating film 280, a metal wiring layer 290 connected equally to a plurality of contact plugs CP3 is formed. The metal wiring layers 290 function as local bit lines LBL0 to LBL3. In the interlayer insulating film 280, contact plugs reaching the metal wiring layer 260 are formed. A metal wiring layer 290 connecting the contact plugs to one another in the bit line direction is formed in a region (not shown) on the interlayer insulating film 280. The metal wiring layer 290 functions as a part of a source line SL.

On the interlayer insulating film 280, an interlayer insulating film 300 is formed so as to cover the metal wiring layer 290. On the interlayer insulating film 300, a metal wiring layer 310 is formed. The metal wiring layer 310 functions as a shunt line for select gate lines SGS, SGD. The interconnections of the wiring layers 310 are arranged at equal intervals. On the interlayer insulating film 300, an interlayer insulating film 320 is formed so as to cover the metal wiring layer 310.

Next, the operation of the 3Tr-NAND flash memory configured as described above will be explained.

<Write Operation>

Figure 33:
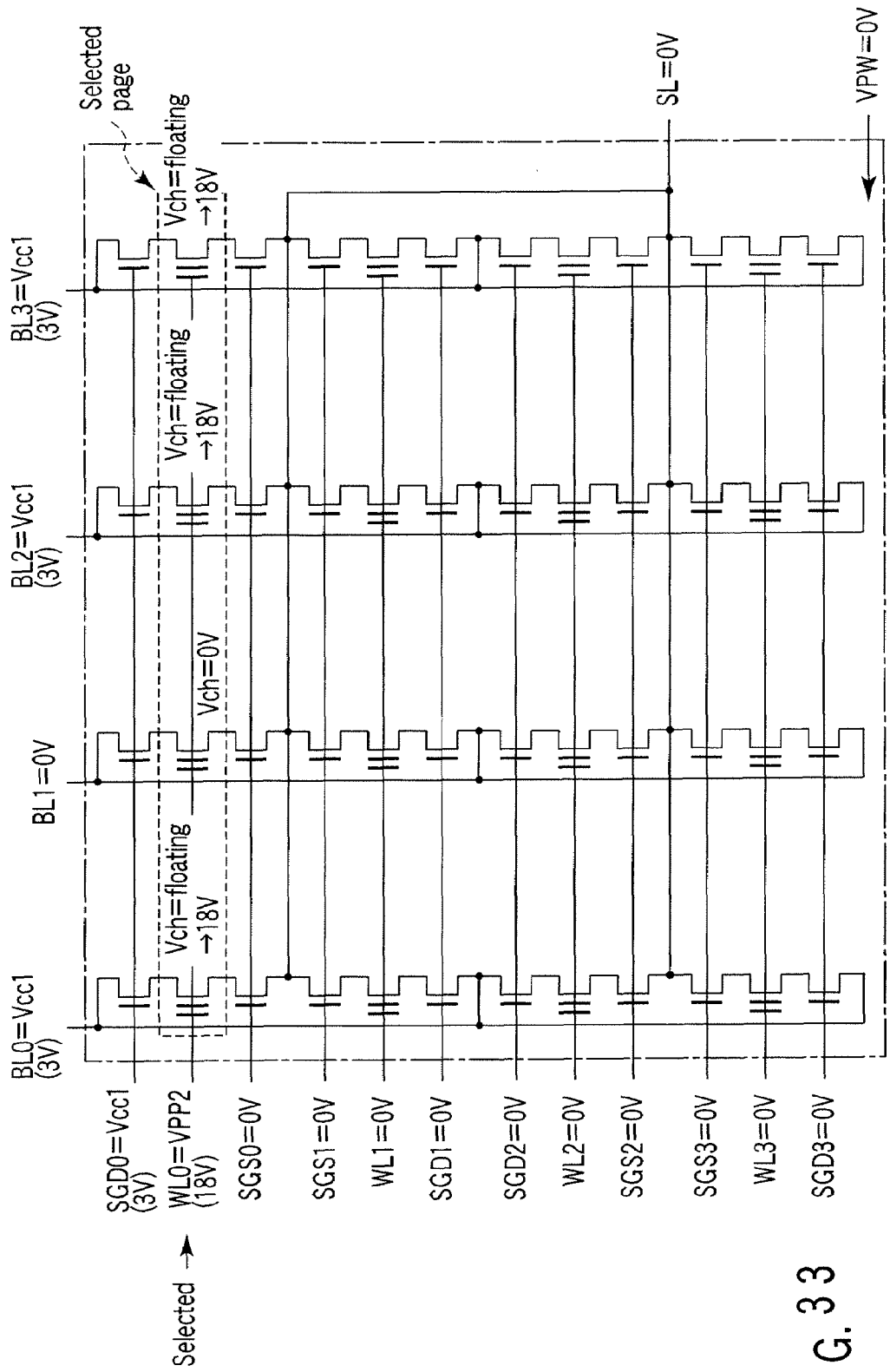
FIG. 33 is a circuit diagram to help explain the state of the memory cell array in a write operation of the 3Tr-NAND flash memory according to the fourth embodiment.

A write operation will be explained by reference to FIG. 33. FIG. 33 is a circuit diagram of the memory cell array 10 of the 3Tr-NAND flash memory 3. For simplification, FIG. 33 shows a case where the number of memory cells is (4×4). Data is written simultaneously into all of the memory cell transistors connected to any one of the word lines. Either "0" data or "1" data is written, depending on whether electrons are injected into the floating gate of a memory cell transistor MT. Electrons are injected into the floating gate by FN tunneling. In FIG. 33, it is assumed that data is written into the memory cell transistors MT connected to word line WL0. Of the memory cell transistors MT, "0" data is written into the memory cell transistor MT connected to bit line BL1 and "1" data is written into the memory cell transistors MT connected to bit lines BL0, BL2, BL3.

First, the CPU 2 inputs write data ("1" or "0"). Then, the latch circuit 51 in the write circuit 50 latches the write data on a bit line basis. If "1" data is input, the latch circuit 51 applies Vcc2 (e.g., 3V) to the bit line. Conversely, if "0" data is input, the latch circuit 51 applies 0V to the bit line. That is, as shown in FIG. 33, the latch circuit 51 applies Vcc2 to bit lines BL0, BL1, BL3 and 0V to bit line BL1.

Then, the row decoder 170 selects any one of the select gate lines SGD and applies Vcc1 to the selected select gate line SGD and 0V to the unselected select gate lines SGD and all of the select gate lines SGS. That is, as shown in FIG. 33, the row decoder 170 selects select gate line SGD0 and applies Vcc1 to the selected select gate line SGD0 and 0V to the other select gate lines SGS0, SGD1, SGS1, SGD2, SGS2, SGD3, SGS3.

As a result, of the select transistors ST1 connected to the selected select gate line SGD, the select transistor ST1 connected to the bit line BL to which Vcc2 is applied is in the cut-off state. On the other hand, the select transistor ST1 connected to the bit line BL to which 0V is applied is in the on state.

Furthermore, the row decoder 170 selects any one of the word lines and applies VPP2 (18V) to the selected word line WL. In addition, the row decoder 170 applies 0V to all of the unselected word lines. The selected word line WL is a word line connected to the memory cell MC including the selected select gate line SGD. In the row decoder at this time, the MOS transistors 151, 152 corresponding to the selected word line are turned on, which allows VPP2 to be applied to the selected word line. As a result, a channel region is formed in the memory cell transistors MT connected to the selected word line WL. Since the select transistor ST1 connected to the selected select gate line SGD and the bit line to which Vcc2 is applied is in the cut-off state, the channel potential of the memory cell transistor MT connected to the select transistor ST1 is in the floating state. Then, coupling with the word line WL, the channel potential rises to about 18V. On the other hand, since the select transistor ST2 connected to the selected select gate line SGD and the bit line to which 0V is applied is in the on state, the channel potential of the memory cell transistor MT connected to the select transistor ST1 is at 0V.

Specifically, as shown in FIG. 33, the row decoder 170 not only selects word line WL0 and applies VPP2 to the selected word line WL0 but also applies 0V to the unselected word lines WL1 to WL3. Therefore, a channel region is formed in the memory cell transistors MT connected to word line WL0. Then, since 0V is applied to bit line BL1, the channel potential Vch of the memory cell transistors MT in the memory cell including the select transistor ST1 connected to bit line BL1 is 0V. On the other hand, since Vcc1 is applied to bit lines BL0, BL2, BL3, the channel potential Vch of the memory cell transistors MT in the memory cell including the select transistors ST1 connected to bit lines BL0, BL2, BL3 rises to about 18V as a result of coupling with the word line WL0.

Moreover, the row decoder 170 applies 0V to the p-well region in which memory cells have been formed.

As a result, in the memory cell transistor MT in the memory cell including the select transistor ST1 cut off, since the potential difference between the gate and channel is insufficient, no electron is injected into the floating gate. That is, the threshold value of the memory cell connected to the bit line applied with Vcc1 and the selected word line WL (or the memory cell into which "1" data is to be written) remains negative. In the example of FIG. 33, no electron is injected into the floating gate of the memory cell transistors MT connected to bit lines BL0, BL2, BL3 and word line WL0. In other words, "1" data is written into the memory cell transistors MT connected to bit lines BL0, BL2, BL3 and the selected word line WL0.

On the other hand, in the memory cell transistor MT in the memory cell including the select transistor ST1 connected to the selected select gate line SGD and to the bit line BL applied with 0V, since the potential difference between the gate and channel is 18V, electrons are injected into the floating gate by FN tunneling. As a result, the threshold value of the memory cell transistor MT changes to positive. That is, "0" data is written. In the example of FIG. 33, VPP3 is applied to word line WL0, with the result that the potential difference between the gate and channel of the memory cell transistor MT connected to bit line BL1 and word line WL0 is 18V. Therefore, electrons are injected into the floating gate of the memory cell transistor MT connected to bit line BL1 and word line WL0. The threshold value of the memory cell transistor MT into which electrons have been injected changes to positive, which means that "0" data has been written.

As described above, the data is written into one page of memory cell transistors simultaneously.

<Erase Operation>

Figure 34:
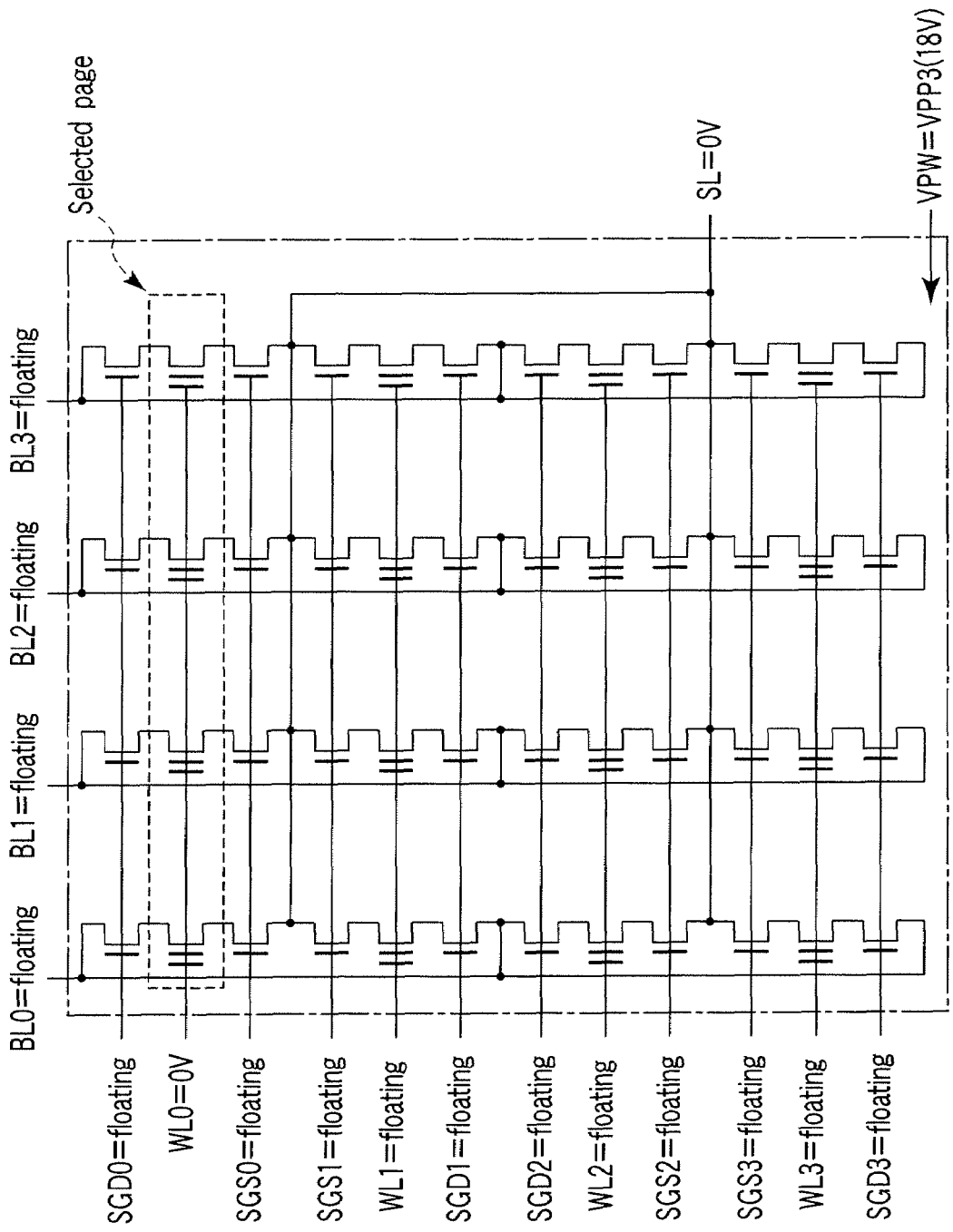
FIG. 34 is a circuit diagram to help explain the state of the memory cell array in an erase operation of the 3Tr-NAND flash memory according to the fourth embodiment.

An erase operation will be explained by reference to FIG. 34. FIG. 34 is a circuit diagram of the memory cell array 10 of the 3Tr-NAND flash memory 3. For simplification, FIG. 34 shows a case where the number of memory cells is (4×4). Data is erased in pages simultaneously. An erase operation is carried out by pulling electrons out of the floating gate by FN tunneling. FIG. 34 shows a case where the data is erased from the memory cell transistors connected to word line WL0.

Before erasing is done, all of the bit lines BL are brought into the floating state. In addition, the row decoder 170 brings all of the select gate lines SGD, SGS into the floating state. Then, the row decoder 170 not only selects any one of the word lines and applies 0V to the selected word line WL but also brings the unselected word lines WL into the floating state. At this time, in the row decoder 170, all of the MOS transistors 151 to 153 in the transfer gates corresponding to the unselected word lines are in the off state. In addition, the row decoder 170 applies VPP2 (18V) to the p-well region 202 in which memory cells have been formed. That is, as shown in FIG. 34, 0V is applied to the selected word line WL0 and the unselected word lines WL1 to WL3 are brought into the floating state. Moreover, all of the select gate lines SGD0, SGS0, SGD1, SGS1 are brought into the floating state.

Then, the potential difference between the memory cell transistors MT connected to the selected word line WL and the well region 202 is 18V, causing the electrons in the floating gate to be pulled out into the p-well region 202. As a result, the data is erased from the memory cell transistors MT connected to the selected word line, with the result that the threshold value of the memory cell transistors MT becomes negative. That is, as shown in FIG. 34, electrons are pulled out of the floating gates of all the memory cell transistors MT connected to word line WL0 into the semiconductor substrate, thereby erasing the data.

In the memory cell transistors MT connected to the unselected word lines, the potential of the word lines WL rises to about 18V because of coupling with the semiconductor substrate. As a result, electrons are not pulled out of the floating gate, with the result that the data is not erased. That is, as shown in FIG. 34, the potentials of the word lines WL1 to WL3 rise by coupling. As a result, the data is not erased from all of the memory cell transistors MT connected to word lines WL1 to WL3. In addition, the potentials of the select gate lines also rise to about 18V by coupling, which prevents voltage stress from being applied to the gate insulating films of the select transistors ST.

As described above, the data is erased simultaneously from the selected page. In the example of FIG. 34, while the data has been erased from (one page of) the memory cell transistors connected to one word line, the data may be erased simultaneously from the memory cell transistors connected to a plurality of word lines. In this case, the row decoder 170 applies 0V to a plurality of word lines.

<Read Operation>

A read operation will be explained by reference to FIG. 35. FIG. 35 is a circuit diagram of the memory cell array 10 of the 3Tr-NAND flash memory 200. For simplification, FIG. 35 shows a case where the number of memory cells is (4×4). FIG. 35 shows a case where the data is read from the memory cell transistor MT connected to bit line BL1 and word line WL0.

First, the row decoder 170 selects select gate lines SGD, SGS to which a memory cell to be read from is connected and applies VPP3 (e.g., 4.5V) to the selected select gate lines SGD, SGS. In addition, the row decoder 170 makes unselected the other select gate lines SGD, SGS and applies 0V to the unselected select gate lines SGD, SGS. As a result, the select transistors ST1, ST2 connected to the selected select gate lines SGD, SGS are brought into the on state. Then, the row decoder 170 applies 0V to all of the word lines WL. That is, as shown in FIG. 35, VPP3 is applied to the selected select gate lines SGD0, SGS0 and 0V is applied to the unselected select gate lines SGD1 to SGD3, SGS1 to SGS3. As a result, the select transistors ST1, ST2 connected to the selected select gate lines SGD0, SGS0 are brought into the on state. In addition, 0V is applied to all of the word lines WL0 to WL3.

Since the memory cell transistor MT has a negative threshold value if the data written in it is "1," the transistor MT is in the on state. Since the memory cell transistor MT has a positive threshold value if the data written in it is "0," the transistor MT is in the off state.

In addition, the precharge circuit 72 precharges the selected bit line BL to, for example, 2.0V. Then, if the data written in the memory cell transistor MT connected to the selected select gate lines SGD, SGS is "1," current flows from the bit line to the source line. On the other hand, if the data written in the memory cell transistor M is "0," no current flows. In the example of FIG. 35, 2.0V is applied to the selected bit line BL1. Then, if the data written in the memory cell transistor MT connected to word line WL0 and the selected bit line BL1 is "1," current flows from bit line BL1 to the source line SL. On the other hand, if the data written in the memory cell transistor M is "0," no current flows.

As described above, the bit line potential varying with the current flowing from the bit line to the source line is amplified by the sense amplifier 73, thereby reading the data. While the data has been read from one bit line in the example of FIG. 35, a potential may be applied to a plurality of bit lines, thereby reading the data from a plurality of memory cell transistors simultaneously.

Even the above-described 3Tr-NAND flash memory can produce the effect in item (5) explained in the second embodiment.

Figure 36:
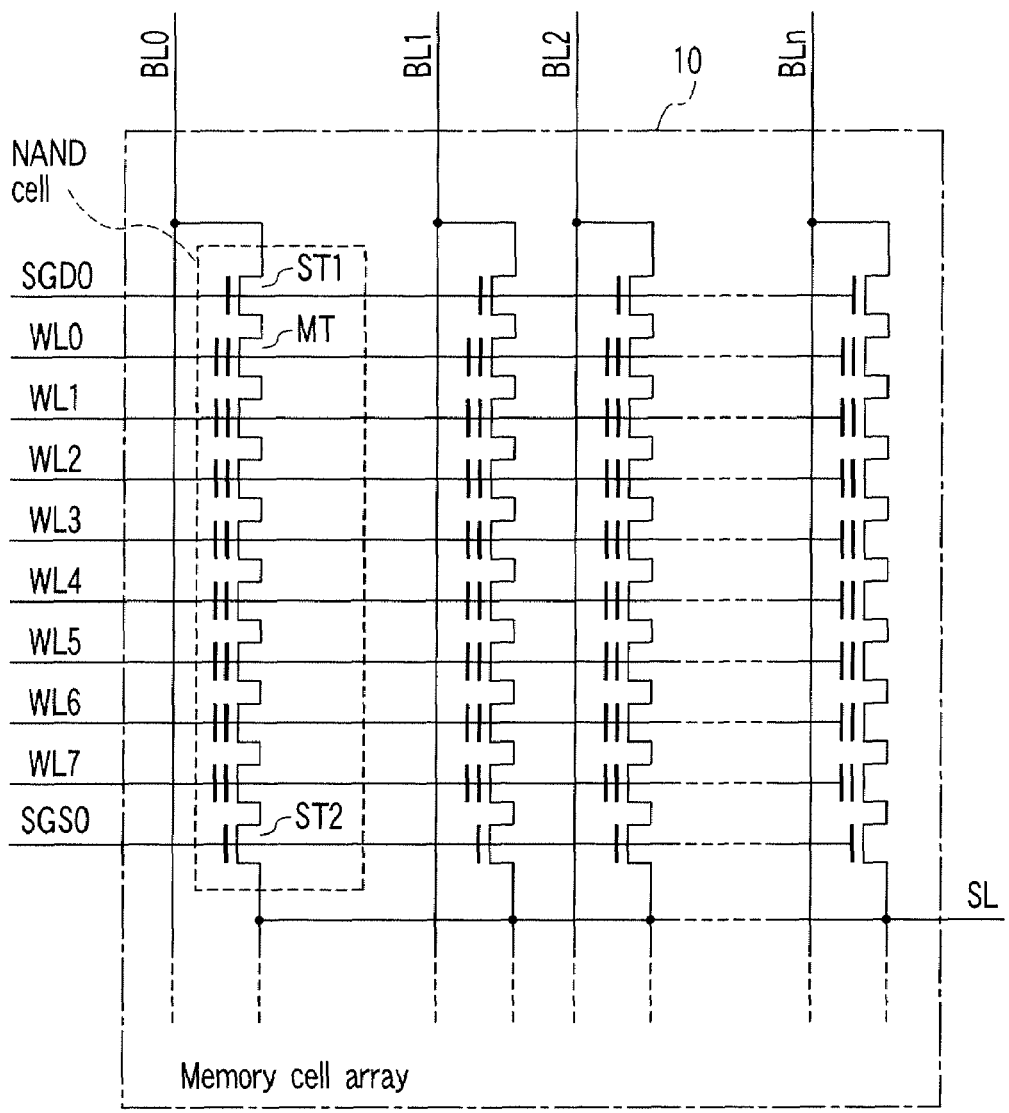
FIG. 36 is a circuit diagram of the memory cell array of a NAND flash memory according to a fifth embodiment of the present invention.

Next, a semiconductor memory device according to a fifth embodiment of the present invention will be explained. The fifth embodiment is such that the second embodiment is applied to a NAND flash memory. Therefore, the configuration of the fifth embodiment is such that the memory cells in the fourth embodiment are replaced with NAND cells shown in FIG. 36. FIG. 36 is a circuit diagram of the memory cell array 10.

As shown in FIG. 36, the memory cell array has a plurality of NAND cells arranged in a matrix. Each of the NAND cells includes eight memory cell transistors MT and select transistors ST1, ST2. A memory cell transistor MT has a stacked-gate structure that includes a floating gate on a semiconductor substrate with a gate insulating film interposed therebetween and a control gate on the floating gate with an inter-gate insulating film interposed therebetween. The number of memory cell transistors MT is not limited to 8 and may be 16 or 32. The number is illustrative and not restrictive. The adjoining ones of the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end is connected to the drain region of the select transistor ST2. That is, a NAND cell is such that a plurality of memory cell transistors MT are used in a 3Tr-NAND flash memory.

The control gates of the memory cell transistors MT in a same row are connected commonly to any one of word lines WL0 to WLm. The gates of the select transistors ST1, ST2 in the same row are connected commonly to select gate lines SGD, SGS, respectively. Word lines WL0 to WLm and select gate lines SGS, SGD are connected to the row decoder 170. The drains of the select transistors ST1 in a same column are connected commonly to any one of bit lines BL0 to BLn. The bit lines are then connected to the write circuit 50 and column selector 80. The sources of the select transistors ST2 are connected commonly to a source line SL and then connected to a source line driver 100. Both of the select transistors ST1, ST2 are not necessarily needed. Only one of them may be used, provided that it can select a NAND cell.

FIG. 37 is a sectional view of a NAND cell taken along a bit line. As shown in FIG. 37, at the surface of the p-type semiconductor (silicon) substrate 200, an n-well region 201 is formed. At the surface of the n-well region 201, a p-well region 202 is formed. On the p-well region 202, a gate insulating film 204 is formed. On the gate insulating film 204, the gate electrodes of a memory cell transistor MT and select transistors ST1, ST2 are formed. Each of the gate electrodes of the memory cell transistor MT and select transistors ST1, ST2 includes a polysilicon layer 210 formed on the gate insulating film 204, an inter-gate insulating film 220 formed on the polysilicon layer 210, and a polysilicon layer 230 formed on the inter-gate insulating film 220. The inter-gate insulating film 220 is made of, for example, a silicon oxide film, or an ON film, NO film, or ONO film having a stacked structure of a silicon oxide film and a silicon nitride film. In a memory cell transistor MT, the polysilicon layers 210, which are separated from each other between adjacent element regions AA, function as floating gates (FG). The polysilicon layers 230 function as control gate (or word lines WL). The polysilicon layers 230 are shared by element regions AA adjoining in the word line direction. In the select transistors ST1, ST2, a part of the inter-gate insulating film 230 is removed in a shut region (not shown), which connects the polysilicon layers 230 electrically. The polysilicon layers 230 function as select gate lines SGD, SGS. In the select transistors ST1, ST2, the polysilicon layers 10 and polysilicon layers 230 are not isolated from one another between element regions AA adjoining in the word line direction and are connected to one another.

At the surface of the p-well region 202 located between adjacent gate electrodes, impurity diffused layers 203 functioning as source-drain regions are formed. An impurity diffused layer 203 is shared by adjacent transistors. Specifically, an impurity diffuse layer 203 between two adjacent select transistors ST1 functions as the drain region of the two select transistors ST1. An impurity diffuse layer 203 between two adjacent select transistors ST2 functions as the source region of the two select transistors ST2. An impurity diffuse layer 203 between two adjacent memory cell transistors MT functions as the source-drain region of the two memory cell transistors MT. Moreover, an impurity diffuse layer 203 between a memory cell transistor MT and a select transistor ST1 adjoining each other functions as the drain region of the memory cell transistor MT and the source region of the select transistor ST1. An impurity diffuse layer 203 between a memory cell transistor MT and a select transistor ST2 adjoining each other functions as the source region of the memory cell transistor MT and the drain region of the select transistor ST2.

Then, on the semiconductor substrate 200, an interlayer insulating film 250 is formed so as to cover the memory cell transistor MT and select transistors ST1, ST2. In the interlayer insulating film 250, a contact plug CP1 reaching the source region 203 of the select transistor ST2 is formed. On the interlayer insulating film 250, a metal wiring layer 260 connected to the contact plug CP1 is formed. The metal wiring layer 260 functions as a source line SL. Further in the interlayer insulating film 250, a contact plug CP2 reaching the drain region of the select transistor ST1 is formed. On the interlayer insulating film 250, a metal wiring layer 270 connected to the contact plug CP2 is formed.

On the interlayer insulating film 250, an interlayer insulating film 280 is formed so as to cover the metal wiring layers 260, 270. In the interlayer insulating film 280, a contact plug CP3 reaching the metal wiring layer 270 is formed. On the interlayer insulating film 280, a metal wiring layer 290 equally connected to a plurality of contact plugs CP3 are formed.

On the interlayer insulating film 280, an interlayer insulating film 300 is formed so as to cover the metal wiring layer 290. On the interlayer insulating film 300, metal wiring layers 310 are formed. The metal wiring layers 310, which are connected to the polysilicon layers 210 of the select transistors ST2, ST1 in a region (not shown), function as shunt lines for the select gate lines SGS, SGD. Then, on the interlayer insulating film 300, an interlayer insulating film 320 is formed so as to cover the metal wiring layer 310.

Even to the NAND flash memory configured as described above, the second embodiment can be applied. Like the second embodiment, the fifth embodiment enables the row decoder 170 to be made smaller.

Figure 38:
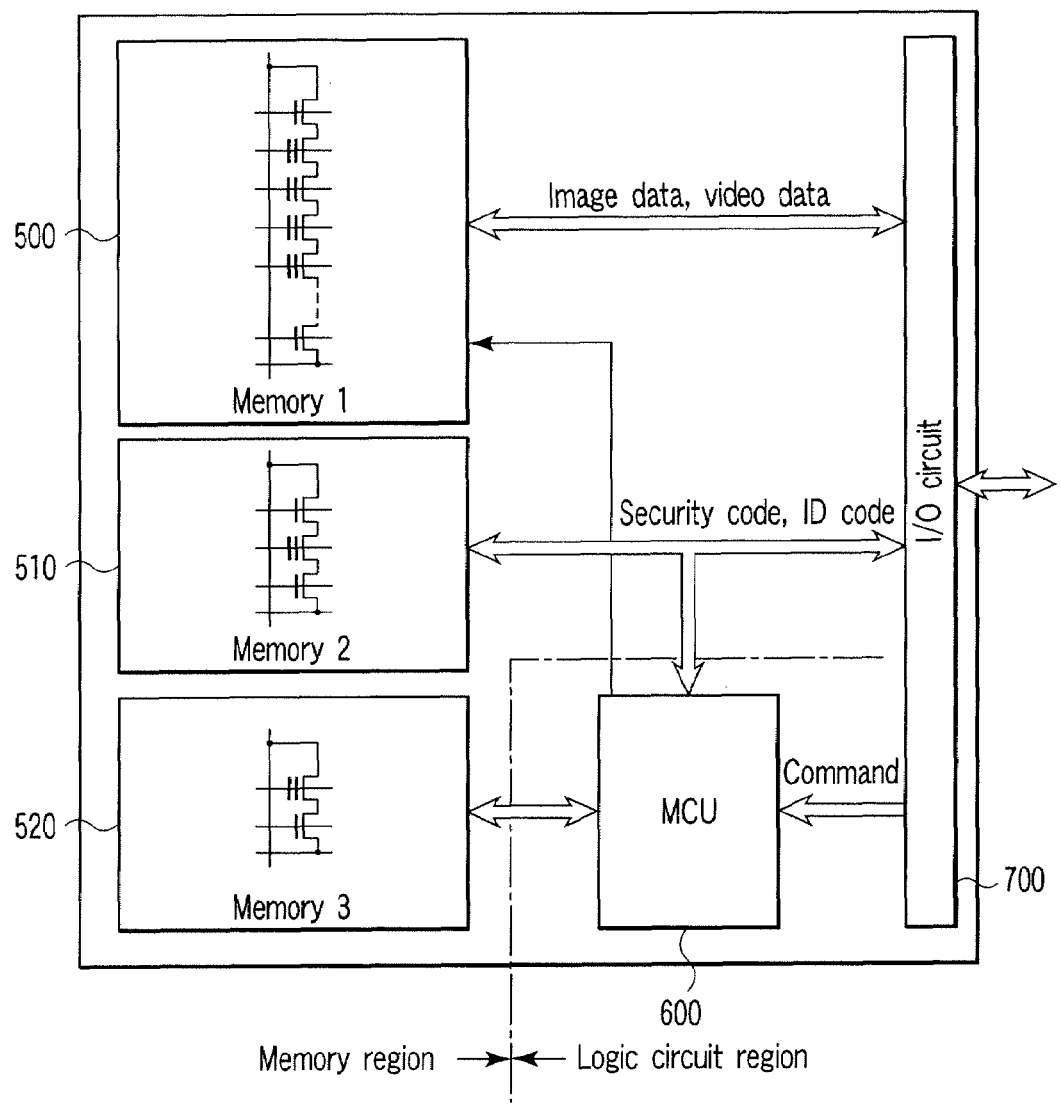
FIG. 38 is a block diagram of a system LSI according to a sixth embodiment of the present invention.

Next, a semiconductor memory device according to a sixth embodiment of the present invention will be explained. The sixth embodiment is related to an LSI in which a flash memory explained in each of the first to fifth embodiments is embedded in a same chip. FIG. 38 is a block diagram of a system LSI according to the sixth embodiment.

As shown in FIG. 38, a system LSI 1 comprises a NAND flash memory 500, a 3Tr-NAND flash memory 510, a 2Tr flash memory 520, an MCU 600, and an I/O circuit 700 formed on a single semiconductor substrate.

The NAND flash memory 500 is used as a storage memory for storing image data or video data. The configuration of the NAND flash memory is as explained in the fifth embodiment.

The 3Tr-NAND flash memory 510 holds an ID code for accessing the LSI 1 and a security code. The configuration of the 3Tr-NAND flash memory 510 is as explained in the fourth embodiment.

The 2Tr flash memory 520 holds program data for the MCU 600 to operate. The configuration of the 2Tr flash memory 520 is as explained in the first to third embodiments.

The MCU 600 does processing on the basis of the program read from the 2Tr flash memory 520, in response to various commands externally input. At this time, the MCU 600 accesses the 2Tr flash memory 520 directly without intervention of an SRAM (Static Random Access Memory) or the like. The processing done by the MCU 600 includes the compression or decompression of the data input to the NAND flash memory 500 and control of an external device. In addition, the MCU 600 reads specific data from the 3Tr-NAND flash memory 510, when the data held in the NAND flash memory 500 is accessed from the outside. Then, the MCU 600 checks the read-out data against the externally input ID code and security data. If they coincide with each other, the MCU 600 permits access to the NAND flash memory 500. When access to the NAND flash memory 500 is permitted, the data in the NAND flash memory 500 is accessed from the outside (host). Specifically, the MCU 600 triggers the NAND flash memory 500 in response to the command received from the outside, thereby reading (or writing) the data.

The I/O circuit 700 controls the exchange of signals between the LSI 1 and the outside.

Figure 39:
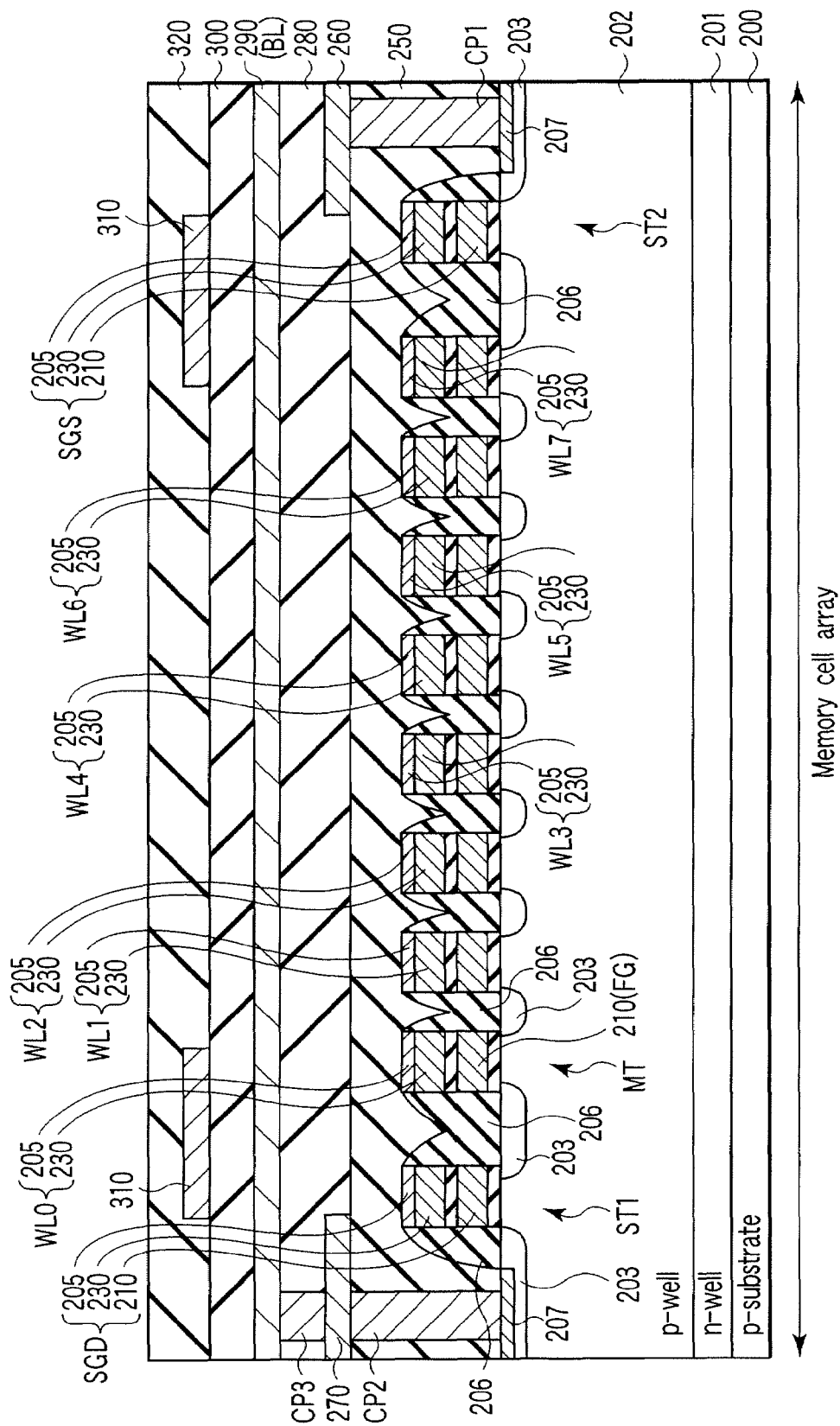
FIG. 39 is a sectional view, taken along a bit line, of a NAND flash memory according to the sixth embodiment.
Figure 40:
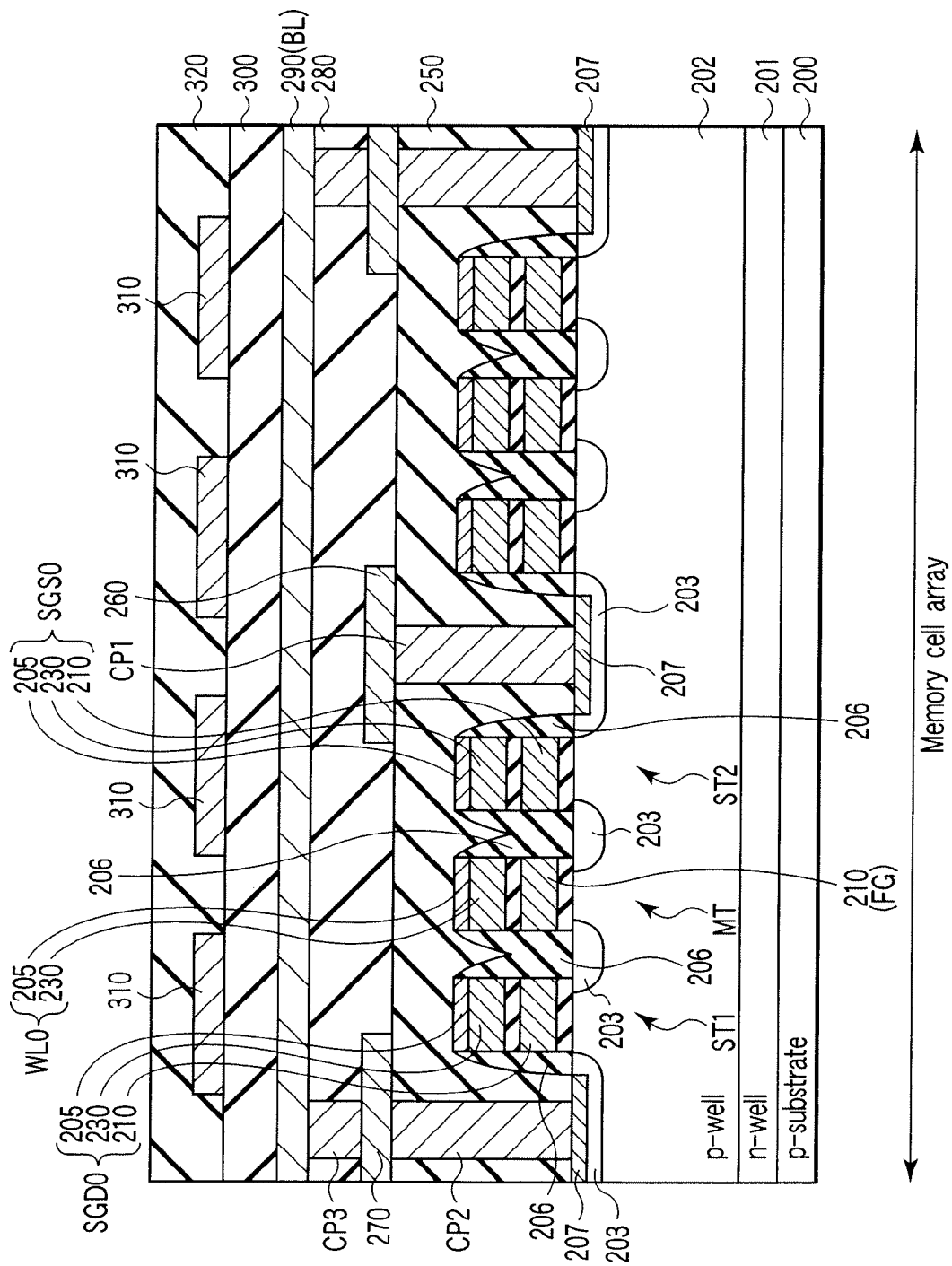
FIG. 40 is a sectional view, taken along a bit line, of a 3Tr-NAND flash memory according to the sixth embodiment.
Figure 41:
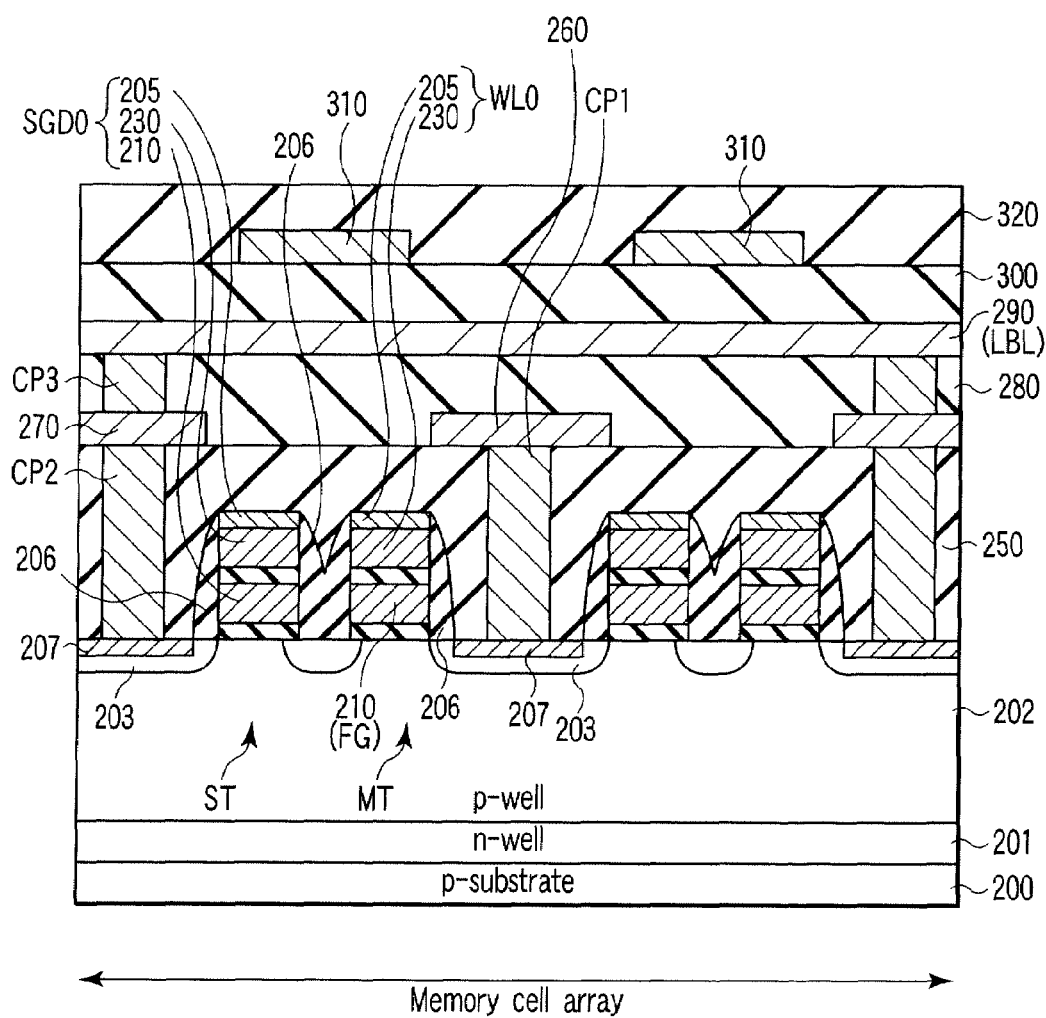
FIG. 41 is a sectional view, taken along a bit line, of a 2Tr flash memory according to the sixth embodiment.

FIGS. 39 to 41 are sectional views taken along a bit line, showing the configurations of the three semiconductor memories 500, 510, 520 included in the LSI 1, respectively.

<NAND Flash Memory>

The sectional structure of the memory cell array 10 of the NAND flash memory 500 is basically as explained in the fifth embodiment. As shown in FIG. 39, at the surfaces of the polysilicon layer 230 and impurity diffused layer 203, silicide layers 205, 207 may be formed respectively and a sidewall insulating film 206 may be formed on the sidewalls of the stacked gate. In a memory cell transistor MT, the polysilicon layer 230 and silicide layer 205 function as a control gate (or a word line WL).

The silicide layer 207 is formed at the surface of the drain region 203 of a select transistor ST1 and at the surface of the source region 203 of a select transistor ST2. No silicide layer is formed in the source and drain regions 203 of the memory cell transistor MT, in the source region 203 of the select transistor ST1, and in the drain region 203 of the select transistor ST2. The region between the stacked gates of adjacent memory cell transistors MT and the region between the stacked gates of the memory cell transistor MT and select transistors ST1, ST2 are filled with the sidewall insulating film 206. Thus, the top of the source and drain regions of the memory cell transistor MT, the top of the source region of the select transistor ST1, and the top of the drain region of the select transistor ST2 are covered with the sidewall insulating film 206.

<3Tr-NAND Flash Memory>

As shown in FIG. 40, in the memory cell array 10 of the 3Tr flash memory 510, silicide layers 205, 207 may be formed on the polysilicon layer 230 and at the surface of the impurity diffused layer 203, respectively, and a sidewall insulating film 206 may be formed on the sidewalls of the stacked gate as in the NAND flash memory.

The silicide layer 207 is formed at the surface of the drain region 203 of a select transistor ST1 and at the surface of the source region 203 of a select transistor ST2. No silicide layer is formed in the source and drain regions 203 of the memory cell transistor MT, in the source region 203 of the select transistor ST1, and in the drain region 203 of the select transistor ST2. The region between the stacked gates of the memory cell transistor MT and select transistors ST1, ST2 is filled with the sidewall insulating film 206. Thus, the top of the source and drain regions of the memory cell transistor MT, the top of the source region of the select transistor ST1, and the top of the drain region of the select transistor ST2 are covered with the sidewall insulating film 206.

<2Tr Flash Memory>

As shown in FIG. 41, in the memory cell array 10 of the 2Tr flash memory 520, silicide layers 205, 207 may be formed on the polysilicon layer 230 and at the surface of the impurity diffused layer 203 respectively, and a sidewall insulating film 206 may be formed on the sidewalls of the stacked gate.

The silicide layer 207 is formed at the surface of the drain region 203 of a select transistor ST1 and at the surface of the source region 203 of a select transistor ST2. No silicide layer is formed in the source region 203 of the memory cell transistor MT and in the drain region 203 of the select transistor ST. The region between the stacked gates of the memory cell transistor MT and select transistor ST is filled with the sidewall insulating film 206. Thus, the top of the source region of the memory cell transistor MT and the top of the drain region of the select transistor ST are covered with the sidewall insulating film 206.

As described above, the system LSI of the sixth embodiment produces not only the effects in item (1) to item (6) explained in the first to fifth embodiments but also the effects described below.

(7) It is possible to embed a plurality of types of flash memories in a single chip, while suppressing the manufacturing cost.

With the configuration of the sixth embodiment, the memory cell transistors MT and select transistors ST1, ST2, ST included in the NAND flash memory 500, 3Tr-NAND flash memory 510, and 2Tr flash memory 520 are formed in the same processes. That is, the individual MOS transistors are formed in the same oxidizing process, film-forming process, impurity implanting process, photolithographic etching process. As a result, the gate insulating film, inter-gate insulating film, the floating gates and control gates of the memory cell transistors MT, and the select gates of the select transistors are the same in the three flash memories 500, 510, 520. In such a manufacturing method, the memory cell arrays of the three flash memories can be formed by the number of processes required to form a single flash memory. Therefore, the manufacturing cost of a system LSI including three types of semiconductor memories can be reduced.

(8) The performance of the system LSI can be made higher.

The system LSI of the sixth embodiment has the NAND flash memory 500, 3Tr-NAND flash memory 510, and 2Tr flash memory 520 as described above.

Unlike the NAND flash memory 500 and 3Tr-NAND flash memory 510, the 2Tr flash memory 520 uses a positive voltage (VPP1=10V) and a negative voltage (VBB1=−6V) in a write and an erase operation. That is, the potential difference applied across the gate insulating film of the MOS transistor used in the row decoder is 10V or −6V. Therefore, the gate insulating film of the MOS transistors used in the row decoder included in the 2Tr flash memory 520 may be thinner than that of the MOS transistors used in the row decoders included in the NAND flash memory 500 and 3Tr-NAND flash memory 510. Thus, the row decoder of the 2Tr flash memory can be made more compact. In addition, the operating speed of the row decoder can be made faster than that of the row decoders in the NAND flash memory 500 and 3Tr-NAND flash memory 510.

In the sixth embodiment, the program data for the MCU 600 to operate is stored in the 2Tr flash memory 520. Thus, the 2Tr flash memory can operate at high speed as described above. The data can be read directly from the 2Tr flash memory 520 without the intervention of the MCU 600 or RAM. As a result, a RAM or the like is not needed, which helps simplify the configuration of the system LSI and improve the operating speed.

In addition, the 3Tr-NAND flash memory 510 holds an ID code and a security code. These code data are not so large in the amount of data, but are frequently changed and updated. Thus, the memory to hold the code data is required to operate at some high speed. In this respect, the 3Tr-NAND flash memory 510 uses a smaller erase unit than that in the NAND flash memory 500 and can rewrite the data in pages. Therefore, it can be said that the 3Tr-NAND flash memory 510 is the preferable semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the sixth embodiment, however, such a controller is not needed. The reason is that the 2Tr flash memory 520 is caused to hold a firmware program to control the blocks in the NAND flash memory 500 and the MCU 600 is caused to perform such control. The MCU 600 performs the control in an interval of time between its original jobs (such as the process of controlling an external device or the process of computing the data input to the NAND flash memory 500). Of course, when the comparison of the capacity of the MCU 600 with the amount of work the MCU 600 has to process has shown that the amount of work has exceeded the capacity, a hardware sequencer or the like may be provided to control the NAND flash memory 500.

As described above, with a semiconductor memory device according to each of the first to sixth embodiments, the performance of the row decoder can be improved. First, as explained in the first embodiment, the row decoder is divided into the erase decoder 20 and the read decoder 30. In addition to this, the isolating MOS transistors 35, 36 are provided. In a read operation, the row decode circuit 31 is connected to a select gate line, thereby applying the voltage of Vcc2 level to the select gate line. In a write operation, the row decode circuit 31 electrically isolates the row address decode circuit 31 from the select gate line. Therefore, since the read decode circuit 31 can be made using low-withstand-voltage MOS transistors, the read operation can be made faster. At the same time, the size of the row decoder can be made smaller.

As shown in the second embodiment, the write decoder decodes the low-order bits RA1i representing a page address and the high-order bits RA2i representing a block address in a row address signal RA by use of separate decoders. Furthermore, the write decoder controls the transfer gate according to the result of decoding the block address and transfers the result of decoding the page address to a word line. The transfer gate corresponding to the block address which coincides with the decoded signal transfers the output of the first decode section to the word line. The transfer gate corresponding to the block address which does not coincide with the decoded signal transfers the voltage at the well region of the transfer gate to the word line. Therefore, the number of decode circuits can be reduced remarkably, which enables the write decode to be made smaller.

In the third embodiment, control is performed so that the output of the first decode section 141 may not drop to a negative potential in an erase and a read operation. The output of the second decode section 142 is controlled so as to prevent signal RAD1 from being transferred to the word line in the transfer gate 150. Then, the voltage at the well region in which the transfer gate has been formed is transferred to the word line. Therefore, particularly in an erase operation, the negative-voltage signal RAD1 is prevented from being supplied to the transfer gates corresponding to the unselected blocks. As a result, a through path is prevented from being formed in the MOS transistor 151 of the transfer gate, which improves the operation reliability of the write decoder.

In the second embodiment, a case where the high-order bits RA2$i$ in the row address RA coincide completely with the block address has been explained. Therefore, the well regions of the transfer gates are isolated on a second decode section basis. Then, memory cell blocks MB are formed in units of word lines connected to the transfer gate controlled by the second decode section. However, only a part of the high-order bits RA2$i$ in the row address signal may coincide with the block address.

For example, as shown in FIG. 42, in the configuration explained in the second embodiment, word lines WL0 to WL7 forms a memory cell block MB0 and word lines WL8 to WL15 forms another memory cell block MB1. The transfer gates 150 are formed on the same well region on a memory cell block basis. That is, transfer gates 150-0 to 150-7 are formed on a well region and transfer gates 150-8 to 150-15 are formed on another well region.

Figure 43:
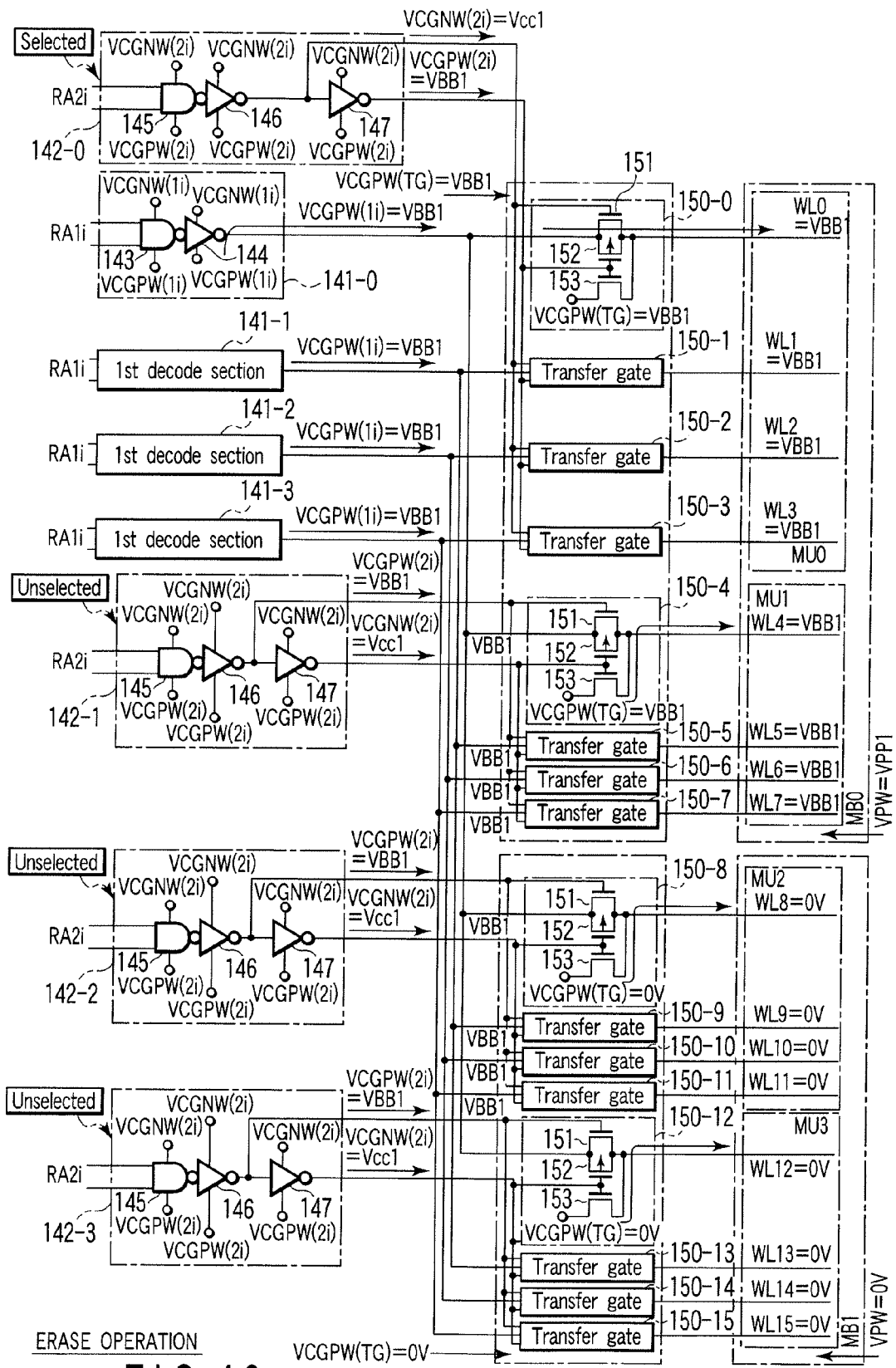
FIG. 43 is a circuit diagram to help explain an erase operation of the write decoder and memory cell array of the 2Tr flash memory according to the modification of the second embodiment.

Since a write operation is the same as in the second embodiment, its explanation will be omitted. An erase operation will be explained by reference to FIG. 43. When the data in memory cell block MB0 is erased, "00" or "01" is input as the high-order bits RA2$i$ in the row address signal RA. As shown in FIG. 43, when RA2$i$="00" is input, the second decode section 142-0 goes into the selected state. Therefore, the transfer gates 150-0 to 150-3 transfer the outputs VBB1 of the first decode sections 141-0 to 141-3 to word lines WL0 to WL3 via the n-channel MOS transistors 151. On the other hand, the second decode sections 142-1 to 142-3 go into the unselected state. At this time, VCGNW(2$i$) and VCGPW(2$i$) of the second decode section 142-1 corresponding to the block address which does not coincide the high-order-bits RA2$i$ in the row address signal and corresponding to the memory cell block MB0 are set to Vcc1 and VBB1, respectively. Then, in the transfer gates 150-4 to 150-7, MOS transistors 151, 152 are tuned off, whereas the MOS transistor 153 is turned on. Since VCGPW(TG) in the transfer gates 150-4 to 150-7 is at VBB1, VBB1 is transferred to word lines WL4 to WL7.

The same holds true for the third embodiment. As shown in FIG. 44, when the data in memory cell block MB0 is erased, "00" or "01" is input as the high-order bits RA2$i$ in the row address signal RA. Then, VCGNW(2$i$) and VCGPW(2$i$) of the second decode section 142-0, 142-1 corresponding to memory cell block MB0 are set to Vcc1 and VBB1, respectively. Then, in the transfer gates 150-0 to 150-15, VCGPW (TG) is transferred to word lines WL0 to WL15 via the MOS transistors 153, whereas VCGPW(TG) of the transfer gates 150-0 to 150-7 are set to VBB1. Therefore, VBB1 is applied to word lines WL0 to WL7.

While in the 2Tr flash memory of the third embodiment, the bit lines has been hierarchized, the present embodiments are not limited to this. However, when the bit lines are hierarchized, it is desirable that the write global bit lines should be set to 0V in a read operation. Setting the write global bit lines to 0V protects the read global bit lines from noise in a read operation, which enables the read operation to be made more stable. Therefore, the operation reliability of the flash memory can be improved.

Figure 45:
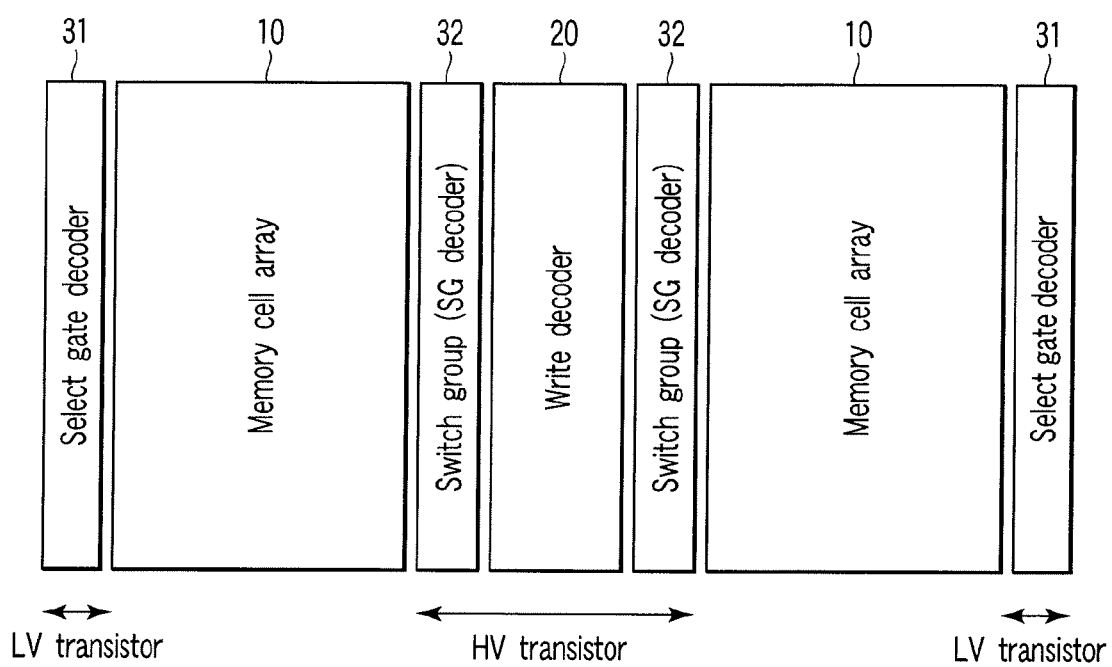
FIG. 45 is a block diagram of a 2Tr flash memory according to the first to third embodiments.

As shown in FIG. 45, in the plane pattern explained in FIG. 6, the memory cell array and select decoder can be arranged so as to be axisymmetric with the write decoder in the center. In this case, since the well region of the write decoder can be shared by two memory cell arrays, the area necessary for cell isolation can be reduced. While in FIG. 6, only the metal wiring layer of the third layer has been explained, for example, a power supply line or the like may be composed of a metal wiring layer of the fourth layer.

Next, an application of the flash memory will be explained. FIG. 46 shows an example of a memory card. As shown in FIG. 46, the memory card 900 includes a flash memory 3 (3Tr-NAND flash memory, NAND flash memory, or 2Tr flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Another exemplary implementation is shown in FIG. 47. The memory card shown in FIG. 47 differs from the memory card presented in FIG. 46 in that the memory card of FIG. 64 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 48:
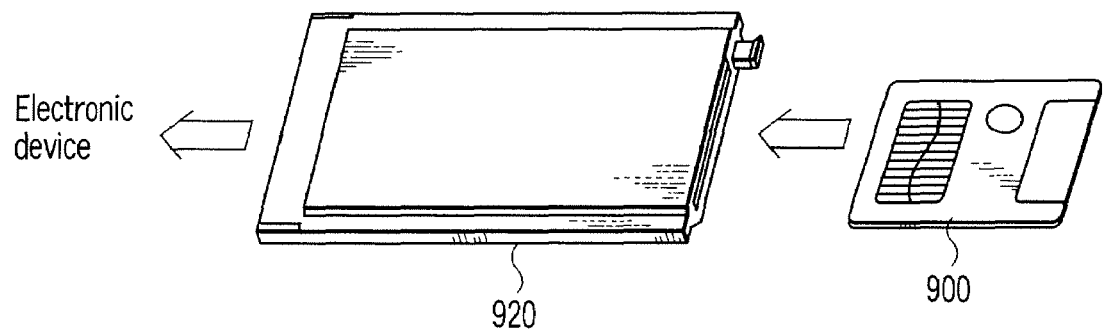
FIG. 48 is the outward appearance of a memory card including a flash memory according to the first to sixth embodiments and a card holder.

FIG. 48 shows another application. As shown in FIG. 48, the memory card 900 is inserted into a cardholder 920, which is then connected to electronic equipment (not shown). The cardholder 920 may have a part of the function of the controller 910.

Figure 49:
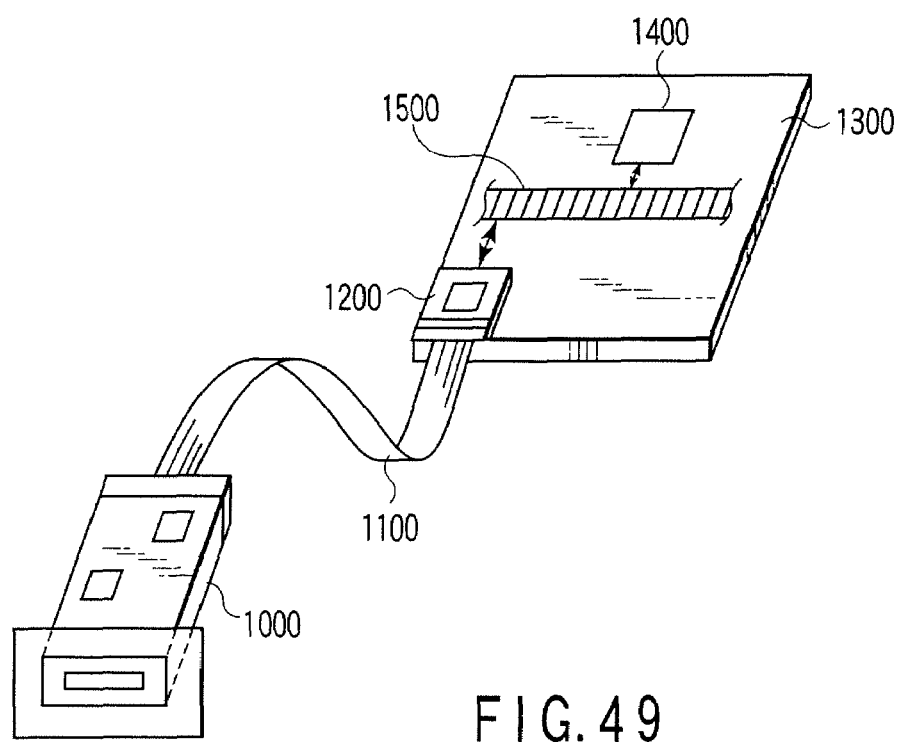
FIG. 49 is the outward appearance of a connection unit which enables connection with a memory card including a flash memory according to the first to sixth embodiments.

FIG. 49 shows another application. As shown in FIG. 49, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

FIG. 50 shows another application. The memory card 900 or the cardholder 920 in which the memory card 900 has been inserted is inserted into the connection unit 1000. The connection unit 1000 is connected to a personal computer 2000 via the connection cable 1100.

Figure 52:
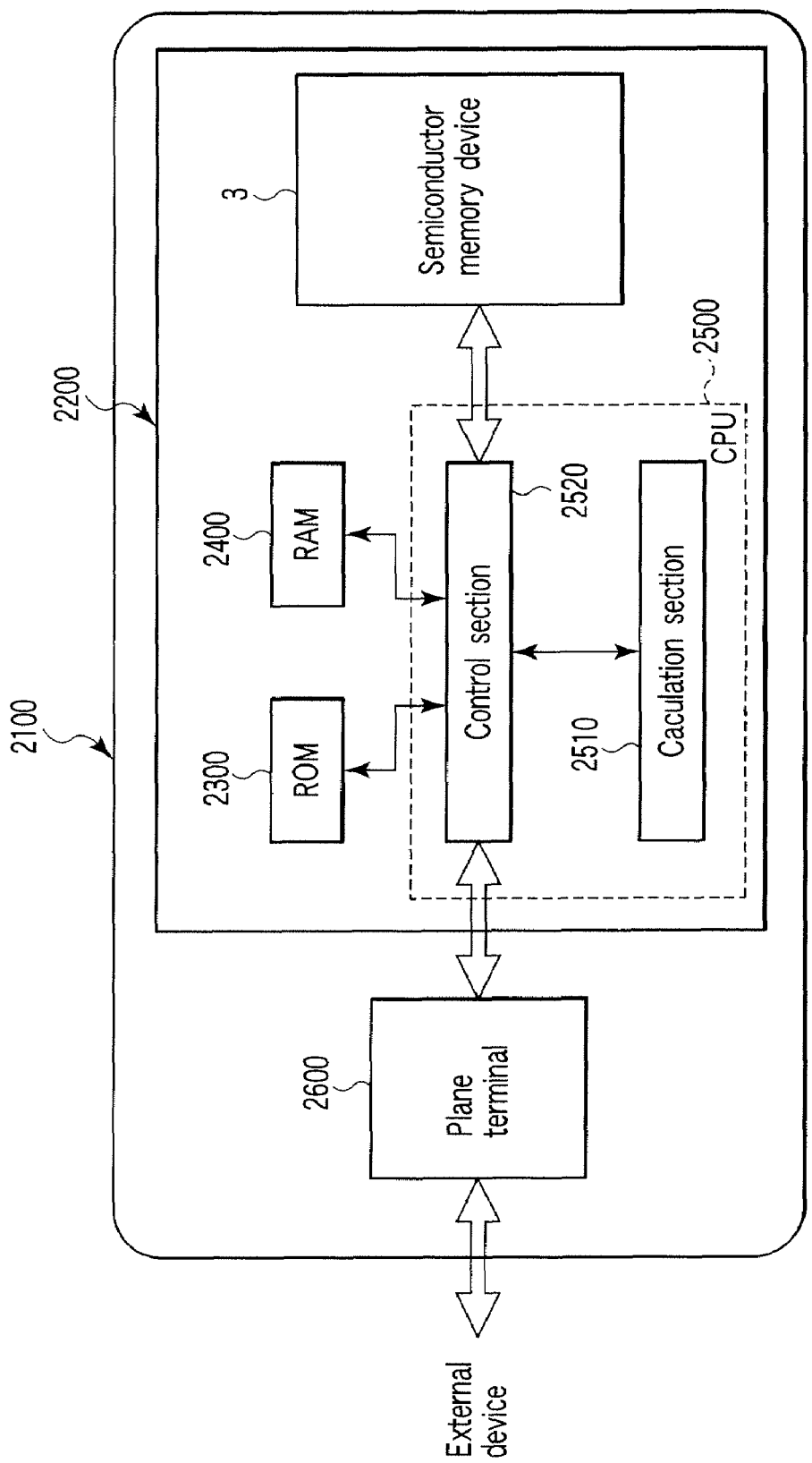
FIG. 52 is a block diagram of an IC card including a flash memory according to the first to sixth embodiments.

FIGS. 51 and 52 show another application. As shown in FIGS. 51 and 52, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which a plurality of memory cells are arranged, each including a first MOS transistor having a charge accumulation layer and a control gate and a second MOS transistor having a drain connected to the source of the first MOS transistor;
   word lines which commonly connect the control gates of the first MOS transistors; and
   a row decoder which selects one of the word lines and which includes
   a first address decode circuit which decodes m bits in an n-bit row address signal (m and n are natural numbers satisfying the relationship m<n),
   a second address decode circuit which decodes (n−m) bits in the row address signal, and
   a transfer gate which supplies the output of the first address decode circuit to the word line according to the output of the second address decoded circuit.

2. The semiconductor memory device according to claim 1, wherein the memory cell array includes a plurality of memory cell blocks, each including two or more of the word lines,
   the m bits in the row address signal indicate a page address for selecting one of the word lines in the memory cell block,
   the (n−m) bits indicate a block address for selecting one of the memory cell blocks,
   the first address decode circuit is shared by the memory cell blocks, and
   the second address decode circuit is shared in each of the memory cell blocks.

3. The semiconductor memory device according to claim 1, wherein the transfer gates corresponding to the unselected word lines transfer the voltage at the well region where the transfer gates have been formed to the unselected word lines in a write and an erase operation.

4. The semiconductor memory device according to claim 1, further comprising:
   a control circuit which fixes the outputs of all of the first address decode circuits to a same logic level with a voltage equal to or higher than 0V and further fixes the outputs of all of the second address decode circuits to a same logic level to prevent the transfer gates from transferring the outputs of the first address decode circuits to the word lines in an erase operation.

5. The semiconductor memory device according to claim 4, wherein the control circuit is controlled by a mode signal which represents at least a write and an erase mode, and in the erase mode, m bits in the row address signal is controlled so that all of the first address decode circuits may go to a high (H) level or a low (L) level and (n−m) bits in the row address signal is controlled so that all of the second address decode circuits may go to the complementary level to the outputs of the first address decode circuits.

6. The semiconductor memory device according to claim 1, wherein the transfer gates each include a first and a second switch element and are provided for the word lines in a one-to-one correspondence,
   each of the first switch elements transfer the output of the first address decode circuit to the corresponding one of the word lines on the basis of the output of the second address decode circuit, and
   each of the second switch elements transfers the voltage applied to the well region in which the transfer gates are formed, to the corresponding one of the word lines on the basis of the output of the second address decode circuit.

7. The device according to claim 6, wherein in each of the transfer gates,
   the first switch element is turned on when the second switch element is turned off, and
   the second switch element is turned on when the first switch element is turned off.

8. The semiconductor memory device according to claim 1, further comprising:
   a source line which connect commonly the sources of the second MOS transistors;
   bit lines which connect commonly the drains of the first MOS transistors in a same column in the memory cell array;
   select gate lines which connect commonly the gates of the second MOS transistors in a same row in the memory cell array; and
   a select gate decoder which selects any one of the select gate lines in a read operation and which includes
   a third address decode circuit which decodes the row address signal,
   a first isolating transistor which has one end of its current path connected to one end of the select gate line and the other end of its current path connected to the output node of the third address decode circuit and which is turned on in a read operation to transfer a read voltage to the select gate line and is turned off in a write operation, and
   a second isolating transistor which has one end of its current path connected to the other end of the select gate line and the other end of its current path connected to a first voltage node and which is turned on in a write operation to transfer a negative voltage to the select gate line and is turned off in a read operation.

9. A memory card comprising a semiconductor memory device recited in claim 1.

10. The memory card according to claim 9, further comprising a control unit which controls the semiconductor memory device.

11. A semiconductor memory device comprising:
   memory cells each of which includes a first MOS transistor having a charge accumulation layer and a control gate and which is written into by injecting electrons into the charge accumulation layer and is erased from by discharging electrons by FN tunneling;
   a memory cell array in which the memory cells are arranged, word lines which commonly connect the control gates of the first MOS transistors; and a row decoder which selects one of the word lines and applies a positive voltage to the selected word line in a write operation and a negative voltage to the selected word line in an erase operation and which includes a first address decode circuit which decodes m bits in an n-bit row address signal (m and n are natural numbers satisfying the relationship m<n), a second address decode circuit which decodes (n–m) bits in the row address signal, a transfer gate which supplies the output of the first address decode circuit to the word line according to the output of the second address decoded circuit, and a control circuit which fixes the outputs of all of the first address decode circuits to a same logic level to prevent the outputs from going to the negative voltage and further fixes the outputs of all of the second address decode circuits to a same logic level to prevent the transfer gates from transferring the outputs of the first address decode circuits to the word lines.

12. The semiconductor memory device according to claim 11, wherein the transfer gates are provided for the word lines in a one-to-one correspondence, the negative voltage is applied to the well region in which the transfer gate corresponding to the selected word line is formed, in an erase operation, and the transfer gate transfers the negative voltage to the selected word line.

13. The semiconductor memory device according to claim 12, wherein the first well regions in which the first address decode circuits are formed are electrically common to a plurality of the first address decode circuits, and the second well regions in which the second address decode circuits are formed are electrically isolated from one another on a second address decode circuit basis.

14. The semiconductor memory device according to claim 11, wherein the memory cell array includes a plurality of memory cell blocks, each including two or more of the word lines, the m bits in the row address signal indicate a page address for selecting any one of the word lines in the memory cell block, the (n–m) bits indicate a block address for selecting any one of the memory cell blocks, the first address decode circuit is shared by the memory cell blocks, and the second address decode circuit is shared in each of the memory cell blocks.

15. The semiconductor memory device according to claim 11, wherein the transfer gates corresponding to the unselected word lines transfer the voltage at the well region where the transfer gates have been formed to the unselected word lines in a write and an erase operation.

16. The semiconductor memory device according to claim 11, wherein the control circuit is controlled by a mode signal which represents at least a write and an erase mode, and in the erase mode, the control circuit controls m bits in the row address signal such that outputs of a plurality of the first address decode circuits may go to a high (H) level or a low (L) level and controls (n–m) bits in the row address signal such that outputs of a plurality of the second address decode circuits may go to the complementary level to the outputs of the first address decode circuits.

17. The semiconductor memory device according to claim 11, wherein the transfer gates each include a first and a second switch element and are provided for the word lines in a one-to-one correspondence, each of the first switch elements transfers the output of the first address decode circuit to the corresponding one of the word lines on the basis of the output of the second address decode circuit, and each of the second switch elements transfers the voltage applied to the well region in which the transfer gates are formed, to the corresponding one of the word lines on the basis of the output of the second address decode circuit.

18. The semiconductor memory device according to claim 11, wherein each of the memory cells further includes a second MOS transistor having a drain connected to the source of the first MOS transistor, and the semiconductor memory device further comprises a source line which connects commonly the sources of the second MOS transistors;

bit lines which connect commonly the drains of the first MOS transistors in a same column in the memory cell array;

select gate lines which connect commonly the gates of the second MOS transistors in a same row in the memory cell array; and a select gate decoder which selects any one of the select gate lines in a read operation and which includes a third address decode circuit which decodes the row address signal, a first isolating transistor which has one end of its current path connected to one end of the select gate line and the other end of its current path connected to the output node of the third address decode circuit and which is turned on in a read operation to transfer a read voltage to the select gate line and is turned off in a write operation, and a second isolating transistor which has one end of its current path connected to the other end of the select gate line and the other end of its current path connected to a first voltage node and which is turned on in a write operation to transfer a negative voltage to the select gate line and is turned off in a read operation.

19. A semiconductor memory device comprising:

a memory cell array in which a plurality of memory cells are arranged, each including a first MOS transistor having a charge accumulation layer and a control gate and a second MOS transistor having a drain connected to the source of the first MOS transistor;

word lines which commonly connect the control gates of the first MOS transistors;

select gate lines which commonly connect the gates of the second MOS transistors;

a row decoder which selects one of the word lines and one of the select gates lines and which includes an address decode circuit which decodes a row address signal to select one of the select gate lines, a first isolating transistor which has one end of its current path connected to one end of the select gate line and the other end of its current path connected to the output node of the address decode circuit and which is turned on in a read operation and is turned off in a write operation, and a second isolating transistor which has one end of its current path connected to the other end of the select gate line and the other end of its current path connected to a first voltage node and which is turned on in a write operation and is turned off in a read operation;

a charge pump circuit which generates a positive voltage and which applies a positive voltage higher than the sum of the output voltage of the address decode circuit to the gate of the first isolating transistor and the threshold voltage of the first isolating transistor in a read operation.

20. The semiconductor memory device according to claim 19, wherein the address decode circuit includes third MOS transistors with withstand voltage lower than those of the first and second isolating transistors.

* * * * *